(12) United States Patent
Suzuki

(10) Patent No.: US 11,967,385 B2
(45) Date of Patent: Apr. 23, 2024

(54) SEMICONDUCTOR STORAGE DEVICE AND MEMORY SYSTEM

(71) Applicant: KIOXIA CORPORATION, Tokyo (JP)

(72) Inventor: Yoshinao Suzuki, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 141 days.

(21) Appl. No.: 17/665,391

(22) Filed: Feb. 4, 2022

(65) Prior Publication Data

US 2023/0062829 A1 Mar. 2, 2023

(30) Foreign Application Priority Data

Aug. 26, 2021 (JP) ................................. 2021-138124

(51) Int. Cl.
*G11C 16/26* (2006.01)
*G11C 16/30* (2006.01)

(52) U.S. Cl.
CPC .............. *G11C 16/26* (2013.01); *G11C 16/30* (2013.01)

(58) Field of Classification Search
CPC ................................ G11C 16/26; G11C 16/30
USPC .................................................... 365/185.21
See application file for complete search history.

(56) References Cited

U.S. PATENT DOCUMENTS

| 8,913,443 | B2 | 12/2014 | Pyeon |
| 9,299,437 | B2 | 3/2016 | Tanzawa |
| 10,224,092 | B2* | 3/2019 | Park .................... G11C 11/4076 |
| 10,672,485 | B2 | 6/2020 | Arakawa |
| 11,056,155 | B1* | 7/2021 | Trinh ..................... G11C 16/10 |
| 2010/0072816 | A1* | 3/2010 | Kenkare ................. H02J 1/102 307/24 |
| 2012/0063244 | A1* | 3/2012 | Kwon ................... H02M 3/073 365/189.07 |

FOREIGN PATENT DOCUMENTS

| JP | 2006286048 A | 10/2006 |
| JP | 2014530445 A | 11/2014 |
| TW | 201239887 A | 10/2012 |

\* cited by examiner

*Primary Examiner* — Anthan Tran
(74) *Attorney, Agent, or Firm* — Kim & Stewart LLP

(57) ABSTRACT

A semiconductor storage device includes a first memory chip having a first memory cell, a first word line connected to the first memory cell, a first voltage step-up circuit, and a second voltage step-up circuit, and a second memory chip having a second memory cell, a second word line connected to the second memory cell, a third voltage step-up circuit, and a fourth voltage step-up circuit. During a read operation executed in the first memory chip, the first, second, and fourth voltage step-up circuits supply a first voltage to the first word line, and when a voltage of the first word line reaches a predetermined voltage, the first voltage step-up circuit continues to supply the first voltage to the first word line, and the second voltage step-up circuit and the fourth voltage step-up circuit stop supplying the first voltage to the first word line.

19 Claims, 34 Drawing Sheets

SEMICONDUCTOR STORAGE DEVICE AND MEMORY SYSTEM

CROSS-REFERENCE TO RELATED APPLICATION

This application is based upon and claims the benefit of priority from Japanese Patent Application No. 2021-138124, filed Aug. 26, 2021, the entire contents of which are incorporated herein by reference.

FIELD

Embodiments described herein relate generally to a semiconductor storage device and a memory system including the semiconductor storage device.

BACKGROUND

As a nonvolatile semiconductor storage device, for example, a NAND flash memory in which memory cells are arranged in three dimensions is known. A memory system of one type is composed of a NAND flash memory and a controller that controls the NAND flash memory.

DETAILED DESCRIPTION

Embodiments provide a semiconductor storage device and a memory system including a voltage step-up circuit with improved step-up performance and reduced circuit area.

In general, according to one embodiment, a semiconductor storage device includes a first memory chip having a first memory cell, a first word line connected to the first memory cell, a first voltage step-up circuit, and a second voltage step-up circuit, and a second memory chip having a second memory cell, a second word line connected to the second memory cell, a third voltage step-up circuit, and a fourth voltage step-up circuit. During a read operation executed in the first memory chip, the first voltage step-up circuit, the second voltage step-up circuit, and the fourth voltage step-up circuit supply a first voltage to the first word line, and when a voltage of the first word line reaches a predetermined voltage, the first voltage step-up circuit continues to supply the first voltage to the first word line, and the second voltage step-up circuit and the fourth voltage step-up circuit stop supplying the first voltage to the first word line.

Hereinafter, embodiments will be described with reference to drawings. In the following description, elements having the same function and configuration are denoted by the same reference signs. In addition, the embodiments shown below are illustrations of devices and methods for embodying the technical idea of the embodiments, and do not limit the material, shape, structure, arrangement, and the like of elements to the following.

Functional blocks can be implemented by hardware, computer software, or a combination of both. It is not essential that the functional blocks are delineated as in the example below. For example, some functions may be executed by a functional block different from the illustrated functional block. Further, the illustrated functional block may be divided into smaller functional sub-blocks.

1. First Embodiment

A semiconductor storage device and a memory system of the first embodiment will be described below.

The memory system of the first embodiment includes a semiconductor storage device and a controller. The semiconductor storage device is, for example, a NAND flash memory, a NOR flash memory, or a dynamic random access memory (DRAM). In the present embodiment, as a semiconductor storage device, a three-dimensional stacked NAND flash memory in which memory cell transistors are stacked above a semiconductor substrate will be described as an example.

1.1 Configuration of Memory System

Figure 1:
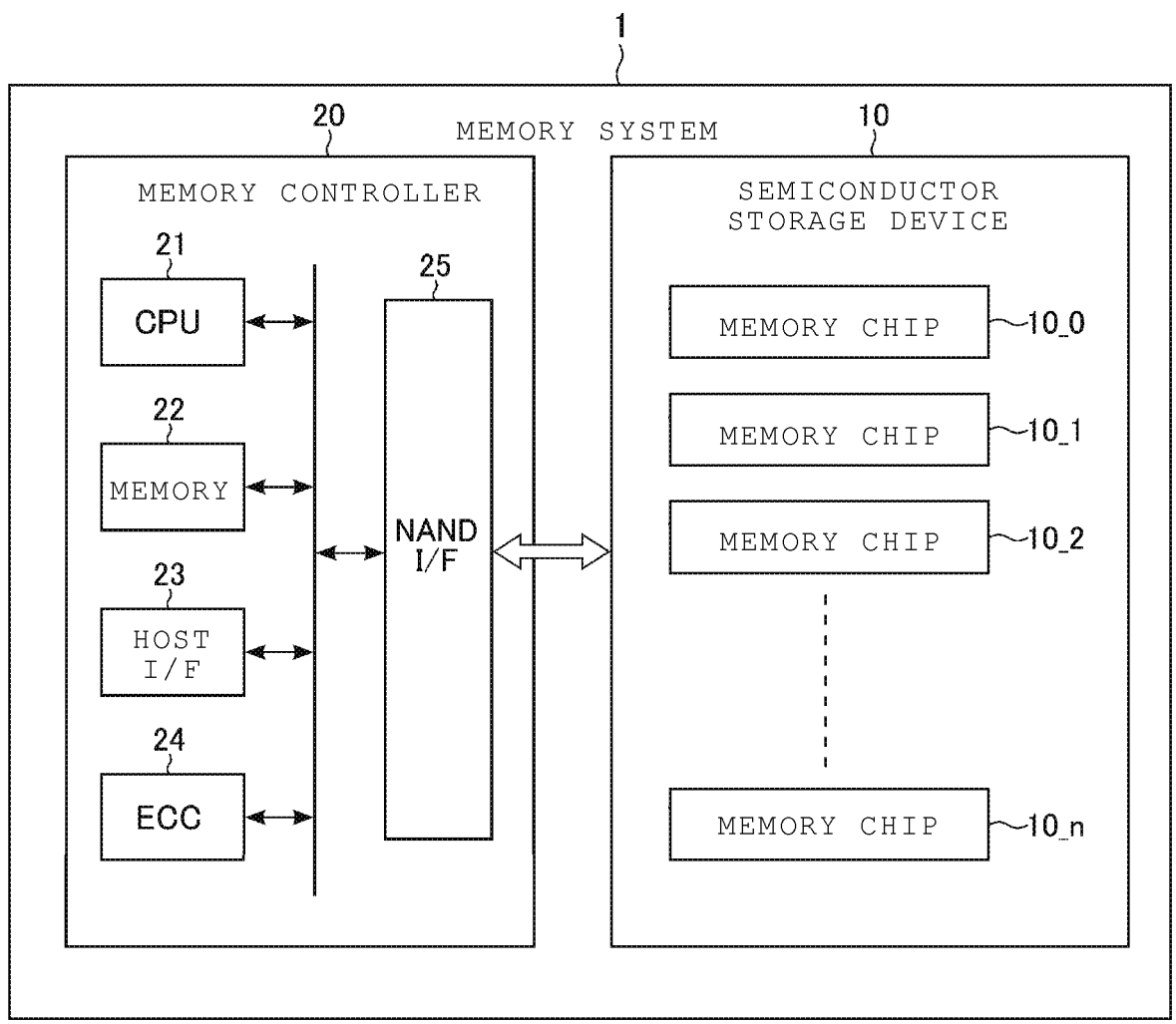
FIG. 1 is a block diagram illustrating a configuration of a memory system of a first embodiment.

First, the configuration of the memory system of the first embodiment will be described. FIG. 1 is a block diagram illustrating a configuration of the memory system of the first embodiment. The memory system 1 includes a semiconductor storage device 10 and a memory controller 20. The memory system 1 is connected to an external host device (not illustrated) and can execute various operations in response to an instruction from the host device.

The semiconductor storage device 10 includes one or a plurality of semiconductor memory chips (hereinafter, referred to as memory chips or semiconductor chips) 10_0, 10_1, 10_2, . . . , 10_$n$ (n is a natural number of 0 or more). The memory chip 10_$n$ includes a NAND flash memory and stores data in a nonvolatile manner. Details of the semiconductor storage device 10 will be described later.

The memory controller 20 is connected to the semiconductor storage device 10 via a NAND bus. The NAND bus transmits and receives signals according to a NAND interface standard. The memory controller 20 controls the semiconductor storage device 10.

One semiconductor device may be composed of the semiconductor storage device 10 and the memory controller 20, for example, and examples of the semiconductor device include a memory card including an SD® card, and a solid state drive (SSD). Further, the memory controller 20 may be, for example, a system-on-a-chip (SoC) or the like.

1.1.1 Configuration of Memory Controller 20

Subsequently, the configuration of the memory controller 20 will be described with reference to FIG. 1. The memory controller 20 includes a central processing unit (CPU) (or processor) 21, a memory 22, a host interface (host I/F) 23, an error checking and correcting (ECC) circuit 24, and a NAND interface (NAND I/F) 25.

The CPU 21 controls the operation of the entire memory controller 20. For example, when receiving a write instruction from the host device, the CPU 21 issues a write instruction to the NAND interface 25 in response to the write instruction. Similarly, when a read instruction and an erase instruction are received, a read instruction and an erase instruction are issued to the NAND interface 25 in response to the read instruction and the erase instruction.

In addition, the CPU 21 executes various processing for managing the semiconductor storage device 10, such as wear leveling. The operation of the memory controller 20 described below may be implemented by the CPU 21 executing software (or firmware), or may be implemented by hardware.

The memory 22 is, for example, a semiconductor memory such as a DRAM or a static random access memory (SRAM), and is used as a work area of the CPU 21. The memory 22 also stores firmware, various management tables, data, and the like for managing the semiconductor storage device 10.

The host interface 23 is connected to the host device via a host bus and controls communication with the host device. The host interface 23 transfers the instructions and data received from the host device to the CPU 21 and the memory 22, respectively. Further, the host interface 23 transfers the data in the memory 22 to the host device in response to the instruction from the CPU 21.

The ECC circuit 24 executes data error correction processing. The ECC circuit 24 generates parity based on the write data received from the host device during a write operation, and adds the generated parity to the write data. The ECC circuit 24 generates a syndrome based on the read data received from the semiconductor storage device 10 during a read operation, and detects and corrects an error in the read data based on the generated syndrome.

The NAND interface 25 is connected to the semiconductor storage device 10 via the NAND bus and controls communication with the semiconductor storage device 10. The NAND interface 25 transmits various signals, commands, and data to the semiconductor storage device 10 based on the instructions received from the CPU 21. The NAND interface 25 also receives various signals and data from the semiconductor storage device 10.

1.1.2 Configuration of Semiconductor Storage Device 10

Next, the configuration of the semiconductor storage device 10 of the first embodiment will be described. As illustrated in FIG. 1, the semiconductor storage device 10 includes a plurality of memory chips 10_0 to 10_$n$.

1.1.2.1 Configuration of Memory Chip 10_$n$

Figure 2:
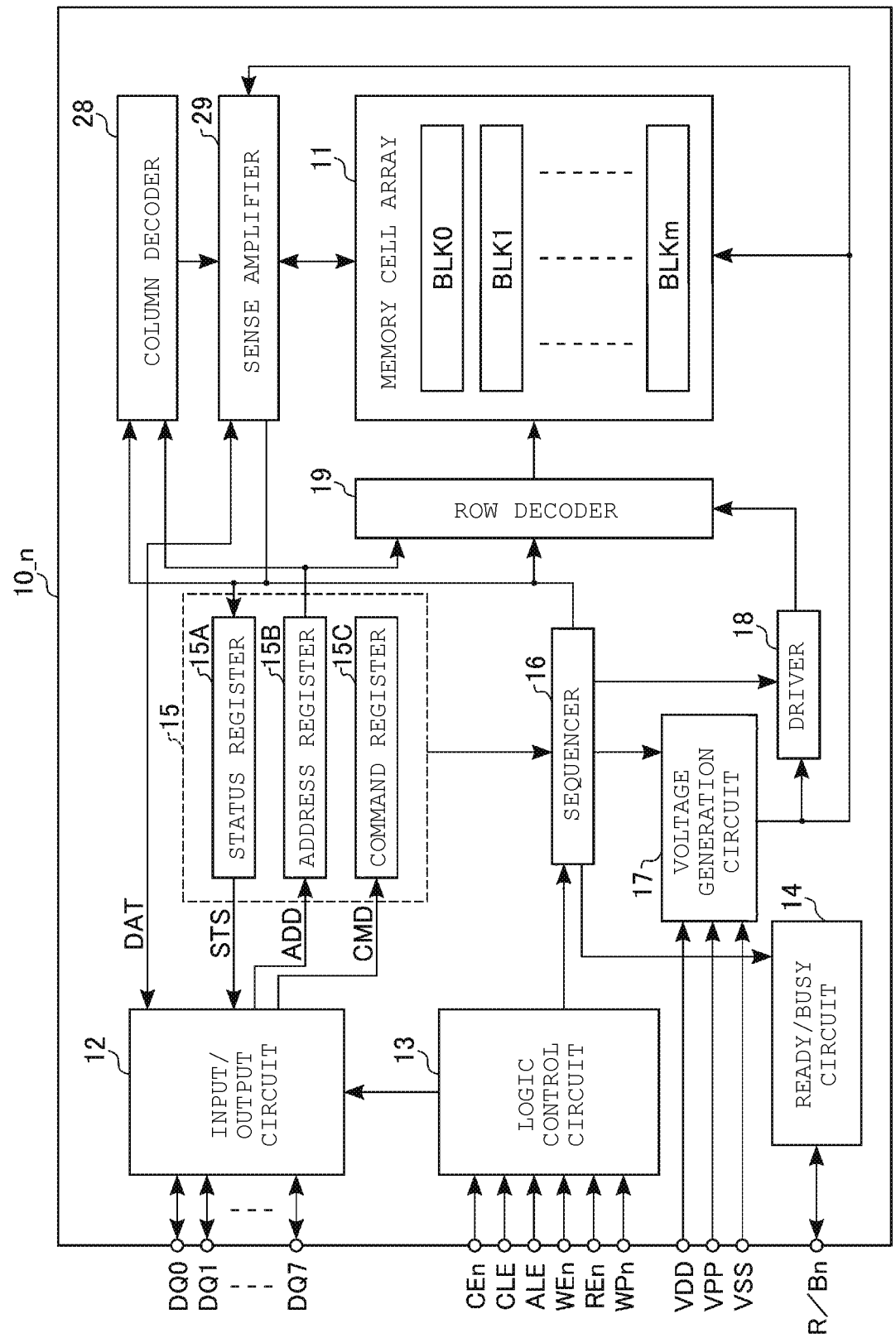
FIG. 2 is a block diagram illustrating a configuration of a memory chip in a semiconductor storage device of the first embodiment.

The configuration of memory chip 10_$n$ will be described below. FIG. 2 is a block diagram illustrating a configuration of the memory chip 10_$n$ in the semiconductor storage device 10.

The memory chip 10_$n$ includes a memory cell array 11, an input/output circuit 12, a logic control circuit 13, a ready/busy circuit 14, a register group 15, a sequencer (or control circuit) 16, a voltage generation circuit 17, a driver 18, a row decoder 19, a column decoder 28, and a sense amplifier 29. The register group 15 includes a status register 15A, an address register 15B, and a command register 15C.

The memory cell array 11 includes one or a plurality of blocks BLK0, BLK1, BLK2, ..., BLKm (m is a natural number of 0 or more). Each of the plurality of blocks BLK0 to BLKm includes a plurality of memory cell transistors (hereinafter, also referred to as memory cells) associated with rows and columns. The memory cell transistors are nonvolatile memory cells that are electrically erasable and programmable. The memory cell array 11 includes a plurality of word lines, a plurality of bit lines, and a source line for applying a voltage to the memory cell transistor. A specific configuration of the block BLKm will be described later.

The input/output circuit 12 and the logic control circuit 13 are connected to the memory controller 20 via input/output terminals (or NAND bus). The input/output circuit 12 transmits and receives I/O signals DQ (for example, DQ0, DQ1, DQ2, ..., DQ7) to and from the memory controller 20 via the input/output terminals. The I/O signal DQ contains commands, addresses, data, or the like.

The logic control circuit 13 receives an external control signal from the memory controller 20 via the input/output terminals (or NAND bus). External control signals include, for example, a chip enable signal CEn, a command latch enable signal CLE, an address latch enable signal ALE, a write enable signal WEn, a read enable signal REn, and a write protect signal WPn. The "n" added to the signal name indicates that the signal is active at a low level.

The chip enable signal CEn allows the memory chip 10_n to be selected and is asserted when the memory chip 10_n is selected. The command latch enable signal CLE allows the command transmitted as a signal DQ to be latched into the command register 15C. The address latch enable signal ALE allows the address transmitted as a signal DQ to be latched into the address register 15B. The write enable signal WEn allows the data transmitted as a signal DQ to be stored in the input/output circuit 12. The read enable signal REn allows the data read from the memory cell array 11 to be output as a signal DQ. The write protect signal WPn is asserted when prohibiting writing and erasing to the memory chip 10_n.

The ready/busy circuit 14 generates a ready/busy signal R/Bn according to the control from the sequencer 16. The ready/busy signal R/Bn indicates whether the memory chip 10_n is in a ready state or a busy state. The ready state is a state in which the memory chip 10_n can receive an instruction from the memory controller 20. The busy state is a state in which the memory chip 10_n cannot receive an instruction from the memory controller 20. The memory controller 20 is able to know whether the memory chip 10_n is in the ready state or the busy state by receiving the ready/busy signal R/Bn from the memory chip 10_n.

The status register 15A stores status information STS required for the operation of the memory chip 10_n. The status register 15A transfers the status information STS to the input/output circuit 12 according to the instruction of the sequencer 16.

The address register 15B stores an address ADD transferred from the input/output circuit 12. The address ADD includes row addresses and column addresses. The row address includes, for example, a block address that specifies the block BLKm to be operated, and a page address that specifies a word line WL to be operated in the specified block.

The command register 15C stores a command CMD transferred from the input/output circuit 12. The command CMD includes, for example, a write command that instructs the sequencer 16 to execute a write operation, a read command that instructs the sequencer 16 to execute a read operation, and the like.

For example, SRAM is used for the status register 15A, the address register 15B, and the command register 15C.

The sequencer 16 receives a command from the command register 15C and controls the memory chip 10_n according to a sequence based on the command.

The sequencer 16 controls a row decoder 19, a column decoder 28, a sense amplifier 29, a voltage generation circuit 17, the driver 18, and the like to execute a write operation, a read operation, and an erasing operation. Specifically, the sequencer 16 controls the row decoder 19, the driver 18, and the sense amplifier 29 based on the write command received from the command register 15C to write data to a plurality of memory cell transistors specified by the address ADD. The sequencer 16 also controls the row decoder 19, the driver 18, the column decoder 28, and the sense amplifier 29 based on the read command received from the command register 15C to read data from a plurality of memory cell transistors specified by the address ADD. The sequencer 16 also controls the row decoder 19, the driver 18, the column decoder 28, and the sense amplifier 29 based on the erase command received from the command register 15C to erase the data stored in the block specified by the address ADD.

The voltage generation circuit 17 receives a power supply voltage VDD (or VCC), a high power supply voltage VPP, and a reference voltage VSS from the outside of the memory chip 10_n via power supply terminals. The power supply voltage VDD is an external voltage supplied from the outside of the memory chip 10_n, and is, for example, 3.3 V. The high power supply voltage VPP is an external voltage supplied from the outside of the memory chip 10_n, and is, for example, 12 V. The reference voltage VSS is a ground voltage supplied from the outside of the memory chip 10_n, and is, for example, 0 V.

The voltage generation circuit 17 uses the power supply voltage VDD or the high power supply voltage VPP to generate a plurality of voltages required for a write operation, a read operation, and an erasing operation. The voltage generation circuit 17 supplies the generated voltage to the memory cell array 11, the driver 18, the sense amplifier 29, and the like.

The driver 18 receives a plurality of voltages from the voltage generation circuit 17. The driver 18 supplies a plurality of voltages selected according to the read operation, the write operation, and the erasing operation from the plurality of voltages supplied from the voltage generation circuit 17 to the row decoder 19 via a plurality of signal lines. For example, the driver 18 supplies a read voltage VCGRV and a voltage VREAD supplied from the voltage generation circuit 17 to a word line during a read operation.

The row decoder 19 receives a row address from the address register 15B and decodes the row address. The row decoder 19 selects one of the plurality of blocks based on the decoding result of the row address, and further selects the word line WL in a selected block BLKm. Further, the row decoder 19 transfers a plurality of voltages supplied from the driver 18 to the selected block BLKm.

The column decoder 28 receives a column address from the address register 15B and decodes the column address. The column decoder 28 selects a bit line based on the decoding result of the column address.

The sense amplifier 29 detects and amplifies the data read from the memory cell transistor into the bit line during a read operation of data. Further, the sense amplifier 29 temporarily stores the read data DAT read from the memory cell transistor, and transfers the stored read data DAT to the input/output circuit 12. Further, the sense amplifier 29 temporarily stores the write data DAT transferred from the input/output circuit 12 during a write operation of data. Further, the sense amplifier 29 transfers the write data DAT to the bit line.

1.1.2.2 Configuration of Memory Cell Array 11

Next, the circuit configuration of the memory cell array 11 in the memory chip 10_n will be described. As described above, the memory cell array 11 includes the plurality of blocks BLK0 to BLKm. The circuit configuration of the block BLKm will be described below.

Figure 3:
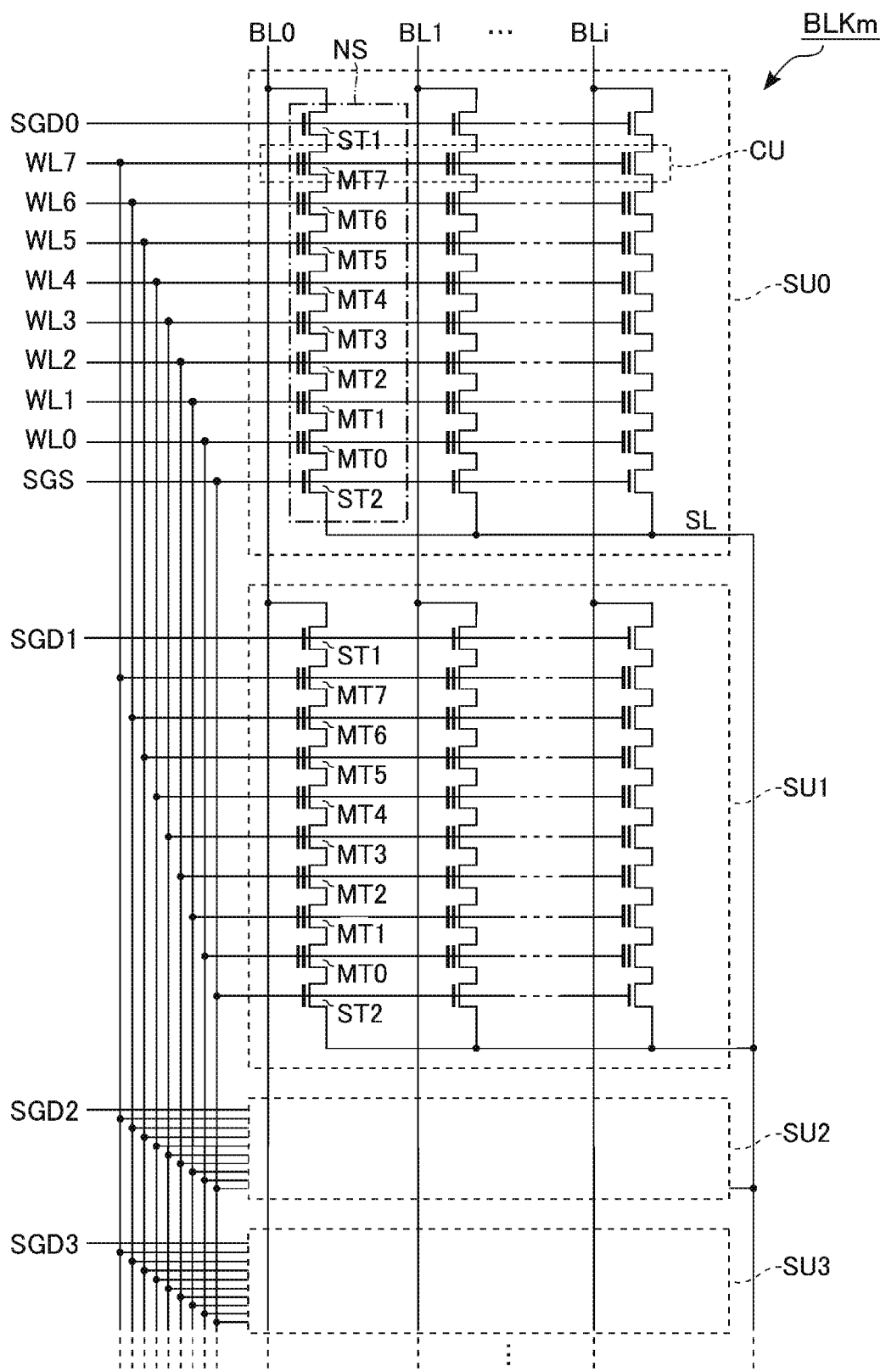
FIG. 3 is a circuit diagram of a block in a memory cell array in the first embodiment.

FIG. 3 is a circuit diagram of the block BLKm in the memory cell array 11. The block BLKm includes, for example, a plurality of string units SU0, SU1, SU2, and SU3. Hereinafter, when the term "string unit SU" is used, it means each of the string units SU0 to SU3. The string unit SU includes a plurality of NAND strings (or memory strings) NS.

Here, for the sake of simplicity, an example is illustrated in which the NAND string NS includes, for example, eight memory cell transistors MT0, MT1, MT2, . . . , MT7, and two select transistors ST1 and ST2. Hereinafter, when the term "memory cell transistor MT" is used, it means each of the memory cell transistors MT0 to MT7.

The memory cell transistor MT includes a control gate and a charge storage layer, and stores data in a nonvolatile manner. The memory cell transistors MT0 to MT7 are connected in series between the source of the select transistor ST1 and the drain of the select transistor ST2. The memory cell transistor MT can store 1-bit data or 2 or more bits of data.

The gates of a plurality of select transistors ST1 in the string unit SU0 are connected to a select gate line SGD0. Similarly, the gates of the select transistors ST1 of the string units SU1 to SU3 are connected to select gate lines SGD1 to SGD3, respectively. Each of the select gate lines SGD0 to SGD3 is independently controlled by the row decoder 19.

The gates of a plurality of select transistors ST2 in the string unit SU0 are connected to a select gate line SGS. Similarly, the gate of each of the select transistors ST2 of the string units SU1 to SU3 is connected to the select gate line SGS. Alternatively, individual select gate line SGS may be connected to the gates of the select transistors ST2 of the string units SU0 to SU3, respectively. The select transistors ST1 and ST2 are used to select the string unit SU in various operations.

The control gates of the memory cell transistors MT0 to MT7 in the block BLKm are connected to word lines WL0 to WL7, respectively. Each of the word lines WL0 to WL7 is independently controlled by the row decoder 19.

Each of the bit lines BL0 to BLi (i is a natural number of 0 or more) is connected to the plurality of blocks BLK0 to BLKm, and is connected to one NAND string NS in the string unit SU in the block BLKm. That is, each of the bit lines BL0 to BLi is connected to the drains of the select transistors ST1 of a plurality of NAND strings NS in the same column among the NAND strings NS arranged in a matrix in the block BLKm. Further, a source line SL is connected to the plurality of blocks BLK0 to BLKm. That is, the source line SL is connected to the sources of the plurality of select transistors ST2 in the block BLKm.

In short, the string unit SU includes a plurality of NAND strings NS connected to different bit lines BL and connected to the same select gate line SGD. In addition, the block BLKm includes a plurality of string units SU that share the word lines WL. Further, the memory cell array 11 includes a plurality of blocks BLK0 to BLKm that share the bit lines BL.

The block BLKm is, for example, a unit of erasing data. That is, the data stored by the memory cell transistor MT in the block BLKm is erased collectively. The data may be erased in units of the string unit SU, or may be erased in units of less than the string unit SU.

A plurality of memory cell transistors MT sharing the word line WL in one string unit SU is called a cell unit CU. A collection of 1-bit data stored in each of the plurality of memory cell transistors MT in the cell unit CU is called a page. The storage capacity of the cell unit CU changes according to the number of bits of data stored in the memory cell transistor MT. For example, the cell unit CU stores 1 page of data when each memory cell transistor MT stores 1-bit data, 2 pages of data when storing 2-bit data, and 3 pages of data when storing 3-bit data.

The write operation and read operation for the cell unit CU are performed on a page basis. In other words, the read and write operations are collectively performed on a plurality of memory cell transistors MT connected to one word line WL arranged in one string unit SU.

The number of string units provided in the block BLKm is not limited to SU0 to SU3, and may be set to any number. Further, the number of NAND strings NS in the string unit SU and the number of memory cell transistors and select transistors provided in the NAND string NS may also be set to any number. Further, the memory cell transistor MT may be a metal-oxide-nitride-oxide-silicon (MONOS) using an insulating film as a charge storage layer, or a floating gate (FG) using a conductive layer as a charge storage layer.

1.1.2.3 Threshold Voltage Distribution of Memory Cell Transistor MT

Next, the relationship between data and the possible threshold voltage distributions of the memory cell transistors MT will be described.

Figure 4:
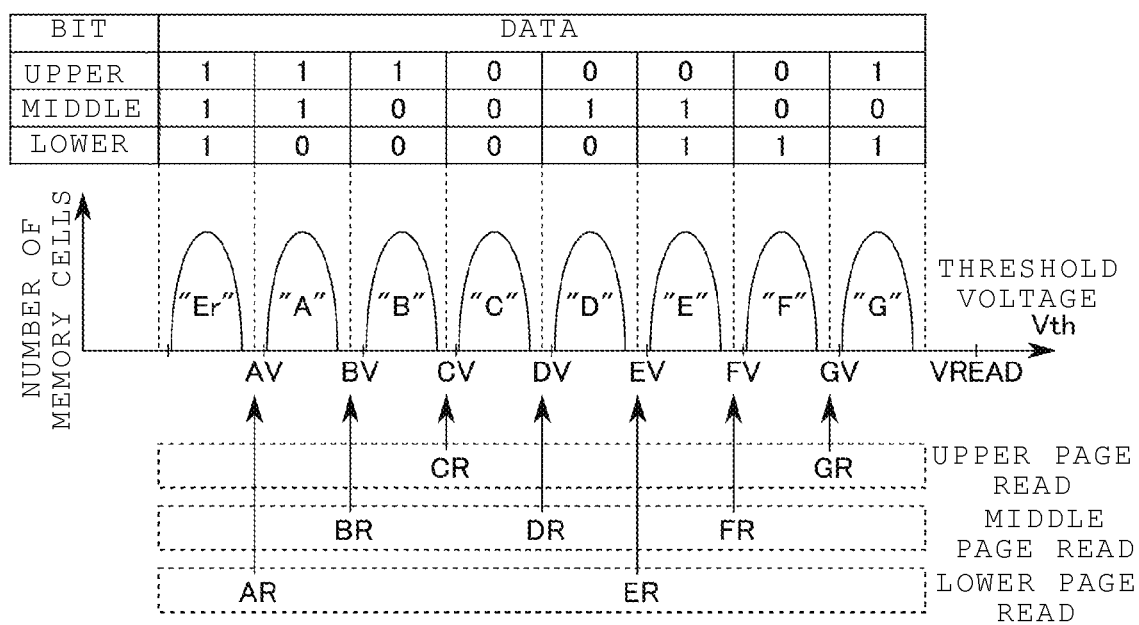
FIG. 4 is a diagram illustrating a relationship between data and possible threshold voltage distributions of memory cell transistors in the first embodiment.

FIG. 4 is a diagram illustrating the relationship between data and the possible threshold voltage distributions of the memory cell transistors MT. Here, as a storage method for the memory cell transistor MT, an example is illustrated in which a triple-level cell (TLC) method of storing 3-bit data in one memory cell transistor MT is applied. In the present embodiment, a single-level cell (SLC) method of storing 1-bit data in one memory cell transistor MT and a multi-level cell (MLC) method of storing 2-bit data in one memory cell transistor MT, a quad-level cell (QLC) method of storing 4-bit data in one memory cell transistor MT, and the like can also be applied when other storage methods are used.

The 3-bit data that may be stored in the memory cell transistor MT is defined by a lower bit, a middle bit, and an upper bit. When the memory cell transistor MT stores 3 bits, the memory cell transistor MT may take any one of eight states according to its threshold voltage. The eight states are called states "Er", "A", "B", "C", "D", "E", "F", and "G" in order from the lowest. The plurality of memory cell transistors MT belonging to each of the states "Er", and "G" form a threshold voltage distribution as illustrated in FIG. 4.

Data "111", "110", "100", "000", "010", "011", "001", and "101" are respectively allocated to the states "Er", "A", "B", "C", "D", "E", "F", and "G", for example. The sequence of bits is "Z, Y, X", where the lower bit "X", the middle bit "Y", and the upper bit "Z" are used. The assignment of the 3-bit data to the threshold voltage distribution may be set in other ways.

In order to read the data stored in the memory cell transistor MT to be read, the state to which a threshold voltage of the memory cell transistor MT belongs is determined. Read voltages AR, BR, CR, DR, ER, FR, and GR are used to determine the state.

The state "Er" corresponds to, for example, a state in which data in the memory cell transistor MT has been erased (erased state). The threshold voltage of the memory cell transistor MT belonging to the state "Er" is lower than the voltage AR and, for example, has a negative value.

The states "A" to "G" correspond to the state in which charges are injected into the charge storage layer and data is written to the memory cell transistor MT, and the threshold voltage of the memory cell transistor MT belonging to the states "A" to "G" has, for example, a positive value. The threshold voltage of the memory cell transistor MT belonging to the state "A" is higher than the read voltage AR and equal to or lower than the read voltage BR. The threshold voltage of the memory cell transistor MT belonging to the state "B" is higher than the read voltage BR and equal to or lower than the read voltage CR. The threshold voltage of the memory cell transistor MT belonging to the state "C" is higher than the read voltage CR and equal to or lower than the read voltage DR. The threshold voltage of the memory cell transistor MT belonging to the state "D" is higher than the read voltage DR and equal to or lower than the read voltage ER. The threshold voltage of the memory cell transistor MT belonging to the state "E" is higher than the read voltage ER and equal to or lower than the read voltage FR. The threshold voltage of the memory cell transistor MT belonging to the state "F" is higher than the read voltage FR and equal to or lower than the read voltage GR. The threshold voltage of the memory cell transistor MT belonging to the state "G" is higher than the read voltage GR and lower than the voltage VREAD.

The voltage VREAD is a voltage applied to the word line WL connected to the memory cell transistor MT of the cell unit CU not to be read, and is higher than the threshold voltage of the memory cell transistor MT in any state. Therefore, the voltage VREAD is applied to the control gate of the memory cell transistor MT, and thus the memory cell transistor MT is turned on regardless of the data stored therein.

Further, a verify voltage used in a write operation is set between the adjacent threshold voltage distributions. Specifically, verify voltages AV, BV, CV, DV, EV, FV, and GV corresponding to the states "A", "B", "C", "D", "E", "F", and "G" are set, respectively. For example, the verify voltages AV, BV, CV, DV, EV, FV, and GV are set slightly higher than the read voltages AR, BR, CR, DR, ER, FR, and GR, respectively.

As described above, each memory cell transistor MT is set to any of eight states and can store 3-bit data. Further, writing and reading are performed on a page basis in one cell unit CU. When the memory cell transistor MT stores 3-bit data, the lower bits, middle bits, and upper bits are allocated to the three pages in one cell unit CU, respectively. A page written by one write operation or a page read by one read operation for the lower bits, middle bits, and upper bits, that is, a collection of lower bits, a collection of middle bits, and a collection of upper bits stored by the cell unit CU are called lower page, middle page, and upper page, respectively.

When the above data assignment is applied, the lower page is determined by a read operation using the read voltages AR and ER. The middle page is determined by a read operation using the read voltages BR, DR, and FR. The upper page is determined by a read operation using the read voltages CR and GR.

1.1.2.4 Configuration of Voltage Step-Up Module in Voltage Generation Circuit 17

Next, the voltage step-up module in the voltage generation circuit 17 of the plurality of memory chips 10_0 to 10_$n$ will be described. As described above, the semiconductor storage device 10 of the first embodiment includes the plurality of memory chips 10_0 to 10_$n$. Here, for example, it is assumed that the semiconductor storage device 10 includes memory chips 10_0 to 10_3. Each of the memory chips 10_0 to 10_3 includes the voltage generation circuit 17, and the voltage generation circuit 17 includes various voltage step-up modules.

Voltage step-up modules provided in the voltage generation circuit 17 include, for example, a voltage step-up module that generates a voltage VCGRV to be supplied to a word line connected to a memory cell transistor to be read (hereafter, referred to as selected word line) during a read operation, and a voltage step-up module that generates the voltage VREAD to be supplied to a word line connected to a memory cell transistor not to be read (hereinafter, referred to as non-selected word line) during a read operation or during a program verify operation during a write operation. The voltage VREAD is a voltage that turns on the memory cell transistor regardless of the data stored by the memory cell transistor. The program verify operation will be described in detail later.

Voltage step-up modules further include a voltage step-up module that generates a voltage VPGM to be supplied to a word line to be written, a voltage step-up module that generates a voltage VPASS to be supplied to a word line not to be written, a voltage step-up module that generates a voltage to be supplied to a selected select gate line, and a voltage step-up module that generates a voltage to be supplied to a non-selected select gate line, during a write operation.

In the present embodiment, a voltage step-up module that generates a voltage VREAD to be supplied to a non-selected word line during a read operation will be described.

Figure 5:
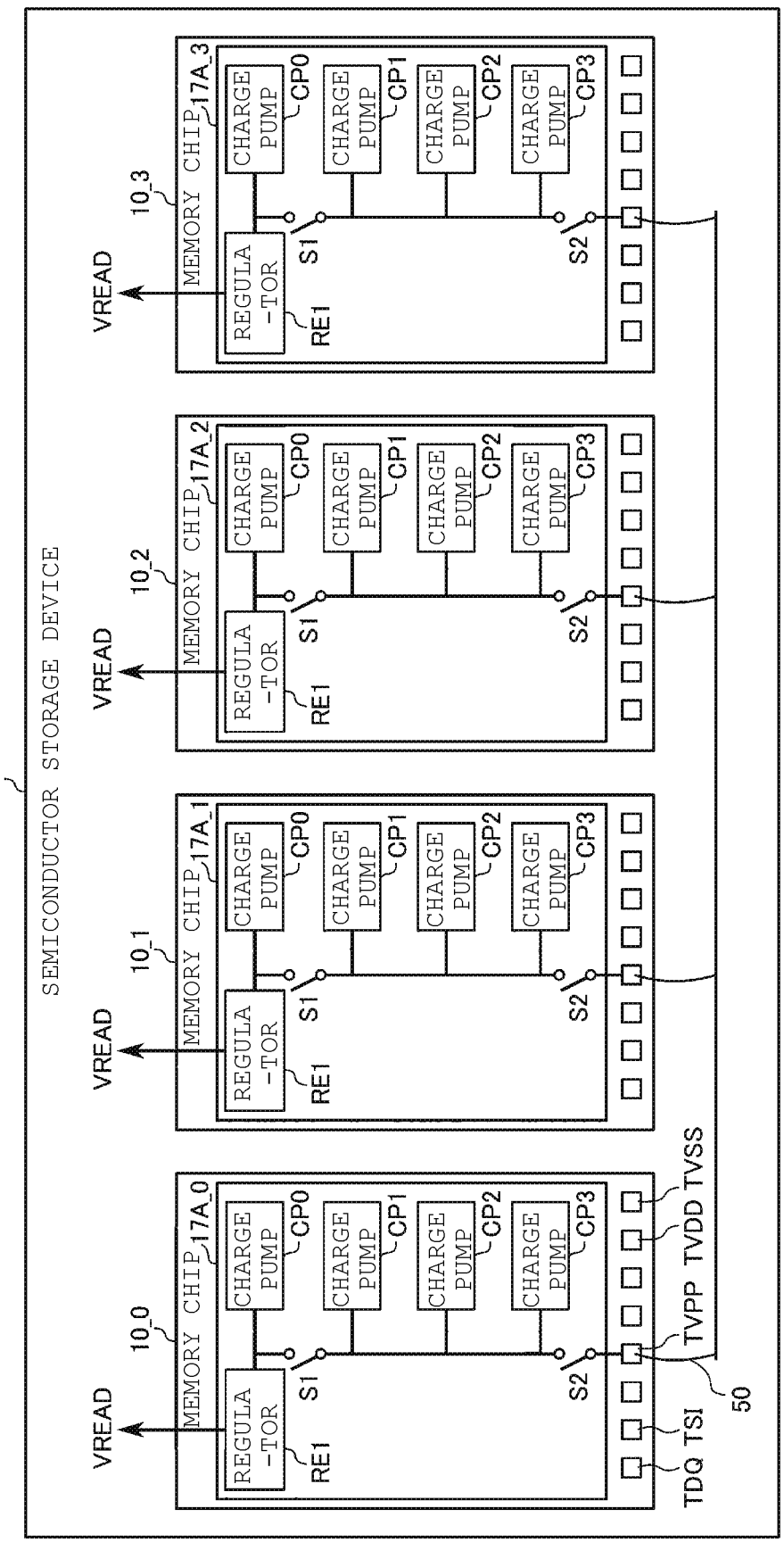
FIG. 5 is a diagram illustrating a configuration of a voltage step-up module of the memory chip in the first embodiment.

FIG. 5 is a diagram illustrating a configuration of a voltage step-up module in the voltage generation circuit 17 provided in the memory chips 10_0 to 10_3. The voltage generation circuits 17 of the memory chips 10_0 to 10_3 include voltage step-up modules 17A_0, 17A_1, 17A_2, and 17A_3, respectively. The voltage step-up modules 17A_0 to 17A_3 include voltage step-up circuits for generating a voltage VREAD. Hereinafter, when the term voltage step-up module 17A is used, it means each of the voltage step-up modules 17A_0 to 17A_3.

The voltage step-up module 17A includes a plurality of voltage step-up circuits, for example, charge pumps CP0, CP1, CP2, and CP3, a regulator RE1, and switch circuits S1 and S2. Here, an example including four charge pumps CP0, CP1, CP2, and CP3 is illustrated as a plurality of voltage step-up circuits, but a number other than four charge pumps may be used.

Each of the memory chips 10_0 to 10_3 includes a plurality of terminals (or pads) for transmitting and receiving power supply voltages, signals, and data to and from the outside, for example, a terminal TVDD, a terminal TVPP, a terminal TVSS, a terminal TDQ and a terminal TSI.

Each of the charge pumps CP0 to CP3 steps up the input power supply voltage VDD, and outputs the stepped-up voltage to the regulator RE1, for example. The regulator RE1 receives the stepped-up voltage supplied from the charge pump or the high power supply voltage VPP supplied from the outside of the memory chip, adjusts the voltage value of the stepped-up voltage or the high power supply voltage VPP, and outputs the voltage VREAD. The voltage VREAD output from the regulator RE1 is supplied to the non-selected word line.

The switch circuit S1 is between the regulator RE1 and the charge pump CP0, and the charge pumps CP1 to CP3. The switch circuit S1 switches between a connected state (or closed state) and a disconnected state (or open state).

The switch circuit S2 is between the charge pumps CP1 to CP3 and the switch circuit S1, and the terminal TVPP. The switch circuit S2 switches between a connected state and a disconnected state.

By setting the switch circuit S1 to the connected state, the voltage stepped up by the charge pumps CP1 to CP3 can be supplied to the regulator RE1. Further, by stopping the charge pumps CP0 to CP3 and setting the switch circuits S1 and S2 to the connected state, the high power supply voltage VPP supplied from the outside of the memory chip can be supplied to the regulator RE1.

On the other hand, by setting the switch circuit S1 to the disconnected state and the switch circuit S2 to the connected state, the charge pump CP0 and the charge pumps CP1 to CP3 can perform different operations. For example, the voltage stepped up by the charge pump CP0 can be supplied to the regulator RE1, and in parallel with this, the voltage stepped up by the charge pumps CP1 to CP3 can be supplied to the voltage step-up module 17A of another memory chip.

The terminal TVDD is a terminal that receives the power supply voltage VDD from the outside. The terminal TVPP is a terminal that receives the high power supply voltage VPP from the outside. The terminal TVPP is also a terminal used by one memory chip to output the voltage stepped up by the charge pump thereof to the voltage step-up module 17A of another memory chip. In addition, the terminal TVPP is a terminal used by one memory chip to receive into the voltage step-up module 17A thereof, the voltage stepped up by the charge pump of another memory chip. A plurality of terminals TVPP may be arranged, and a plurality of channels connected from the terminals TVPP to the charge pump or the regulator RE1 may be provided. By providing a plurality of channels, it is possible to prevent interference of currents transmitted and received between the voltage step-up modules 17A of the memory chips.

The terminal TVSS is a terminal that receives the reference voltage (for example, ground voltage) VSS from the outside. The terminal TDQ is a terminal that receives the I/O signal DQ from the outside. The terminal TSI is a terminal that receives an external control signal from the outside. The terminal TSI is also a terminal that outputs the ready/busy signal R/Bn.

The terminals TVPP provided in the memory chips 10_0 to 10_3 are connected to each other by, for example, a bonding wire (or via wiring) 50. Each of the memory chips 10_0 to 10_3 can transfer the voltage stepped up by the voltage step-up module 17A via the terminal TVPP and the bonding wire 50.

Figure 6:
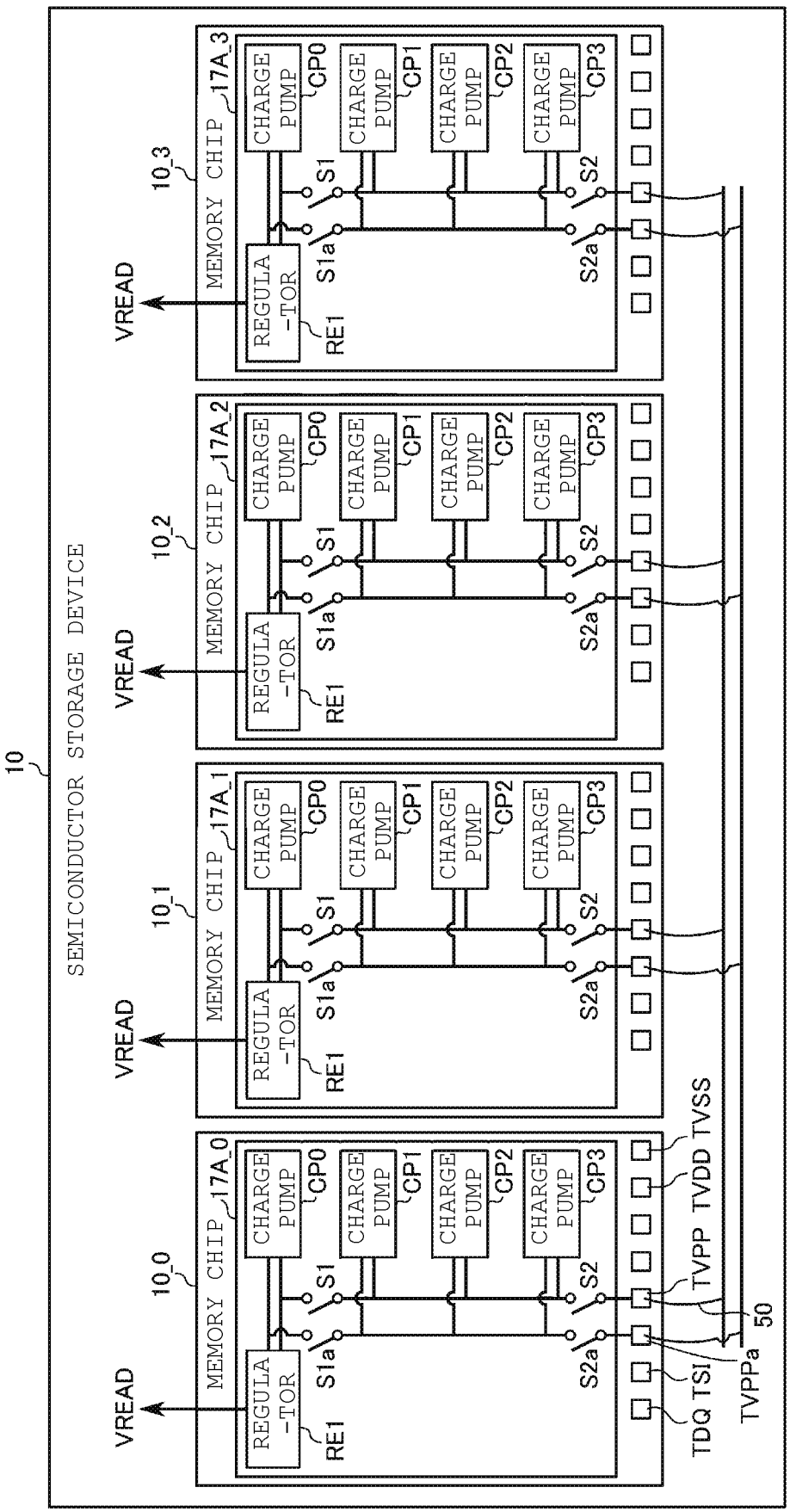
FIG. 6 is a diagram illustrating another configuration of the voltage step-up module of the memory chip in the first embodiment.

In the example illustrated in FIG. 5, one wiring for connecting the terminal TVPP, the charge pumps CP0 to CP3, and the regulator RE1 is provided in the memory chip, but a plurality of terminals TVPP may be arranged, and a plurality of wirings for connecting the plurality of terminals TVPP, the charge pumps CP0 to CP3, and the regulator RE1 may be provided. For example, as illustrated in FIG. 6, wiring may be further connected a terminal TVPPa, the charge pumps CP0 to CP3, and the regulator RE1 via the switch circuits S1a and S2a.

If two wirings, e.g., a first wiring that connects the terminal TVPP, and the charge pumps CP0 to CP3 and the regulator RE1, and a second wiring that connects the terminal TVPPa, and the charge pumps CP0 to CP3 and the regulator RE1, are used, the resistance value of the wiring between the terminals TVPP and TVPPa, and the regulator RE1 can be reduced. Further, since the above-mentioned first wiring and second wiring are provided, a plurality of memory chips can assist the voltage step-up operation of different memory chips in parallel, that is, a plurality of memory chips can supply currents to different memory chips in parallel.

Figure 7:
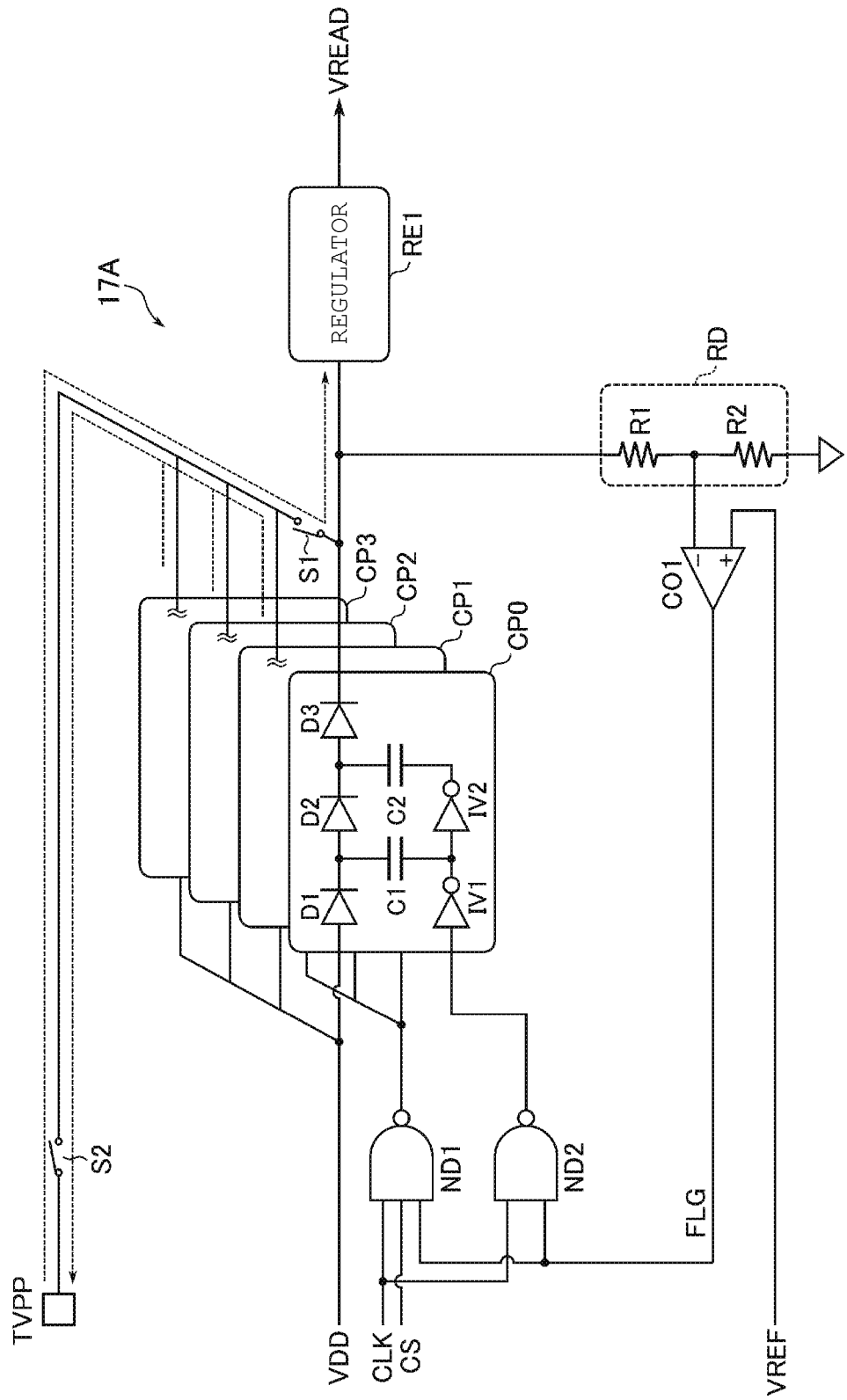
FIG. 7 is a circuit diagram of the voltage step-up module of the memory chip in the first embodiment.

FIG. 7 is a circuit diagram illustrating a configuration of the voltage step-up module 17A provided in each of the memory chips 10_0 to 10_3. The voltage step-up module 17A includes the charge pumps CP0 to CP3, the regulator RE1, the switch circuit S1, a resistance divider circuit RD, a comparator CO1, and negative logical product circuits (hereinafter, NAND circuits) ND1 and ND2. Each of the charge pumps CP0 to CP3 includes, for example, diodes D1, D2, and D3, capacitors C1 and C2, and inverters IV1 and IV2. Further, the resistance divider circuit RD includes resistors R1 and R2.

The circuit connection of the voltage step-up module 17A illustrated in FIG. 7 is as follows.

A control signal CS is input to a first input terminal of the NAND circuit ND1. A clock signal CLK is input to a second input terminal of the NAND circuit ND1 and a first input terminal of the NAND circuit ND2.

The power supply voltage VDD is supplied to the input terminal of the diode D1 provided in each of the charge pumps CP0 to CP3. The output terminal of the diode D1 is connected to the input terminal of the diode D2 and a first electrode of the capacitor C1. The output terminal of the diode D2 is connected to the input terminal of the diode D3 and a first electrode of the capacitor C2.

The output terminal of the NAND circuit ND1 is connected to the input terminal of the inverter IV1 provided in each of the charge pumps CP1 to CP3. The output terminal of the inverter IV1 is connected to a second electrode of the capacitor C1 and the input terminal of the inverter IV2. The output terminal of the inverter IV2 is connected to a second electrode of the capacitor C2. The output terminal of the NAND circuit ND2 is connected to the input terminal of the inverter IV1 provided in the charge pump CP0. The output terminal of the inverter IV1 is connected to the second electrode of the capacitor C1 and the input terminal of the inverter IV2.

The output terminal of the charge pump CP0 (that is, the output terminal of the diode D3) is connected to the input terminal of the regulator RE1 and a first terminal of the resistor R1 in the resistance divider circuit RD. The output terminals of the charge pumps CP1 to CP3 (that is, the output terminals of the diode D3) are connected to the input terminal of the regulator RE1 and the first terminal of the resistor R1 in the resistance divider circuit RD via the switch circuit S1. The output terminal of the charge pump CP0 is also connected to the terminal TVPP via the switch circuits S1 and S2. The output terminals of the charge pumps CP1 to CP3 are connected to the terminal TVPP via the switch circuit S2.

A second terminal of the resistor R1 in the resistance divider circuit RD is connected to a first terminal of the resistor R2, and a second terminal of the resistor R2 is connected to the reference voltage end. The reference voltage VSS is supplied to the reference voltage end.

The node between the resistors R1 and R2 in the resistor divider circuit RD is connected to a negative input terminal of the comparator CO1. A reference voltage VREF is supplied to a positive input terminal of the comparator CO1. The output terminal of the comparator CO1 is connected to a third input terminal of the NAND circuit ND1 and a second input terminal of the NAND circuit ND2. A signal FLG output from the comparator CO1 is input to the third input terminal of the NAND circuit ND1 and the second input terminal of the NAND circuit ND2.

The comparator CO1 compares the stepped-up voltage input to the negative input terminal thereof with the reference voltage VREF input to the positive input terminal thereof, and outputs an "H (High)" state or an "L (Low)" state as the signal FLG, according to the comparison result. For example, if the stepped-up voltage is lower than the reference voltage VREF, the comparator CO1 outputs an "H" state as the signal FLG. On the other hand, when the stepped-up voltage is equal to or higher than the reference voltage VREF, the comparator CO1 outputs an "L" state as the signal FLG.

When the "H" state is input to the NAND circuits ND1 and ND2 as the signal FLG, the clock signal CLK is supplied from the NAND circuits ND1 and ND2 to the charge pumps CP0 to CP3. As a result, the charge pumps CP0 to CP3 start a voltage step-up operation for stepping up the supplied power supply voltage VDD. Thereafter, when the stepped-up voltage becomes equal to or higher than the reference voltage VREF and the "L" state is input to the NAND circuits ND1 and ND2 as the signal FLG, the supply of the clock signal CLK from the NAND circuits ND1 and ND2 to the charge pumps CP0 to CP3 is stopped. As a result, the charge pumps CP0 to CP3 stop the voltage step-up operation.

A signal CS is a signal that controls the output of the clock signal CLK from the NAND circuit ND1 to the charge pumps CP1 to CP3. When the "H" state is input to the NAND circuit ND1 as the signal CS, the NAND circuit ND1 supplies the clock signal CLK to the charge pumps CP1 to CP3 when the signal FLG is at the "H" state, and the NAND circuit ND1 stops supplying the clock signal CLK when the signal FLG is at the "L" state. When the "L" state is input to the NAND circuit ND1 as the signal CS, the NAND circuit ND1 stops supplying the clock signal CLK to the charge pumps CP1 to CP3.

The regulator RE1 adjusts the voltage value of the voltage stepped up by the charge pumps CP0 to CP3 and outputs the voltage VREAD. The regulator RE1 also adjusts the voltage value of the high power supply voltage VPP supplied from the terminal TVPP and outputs the voltage VREAD.

In the example illustrated in FIG. 7, an example in which each of the charge pumps CP0 to CP3 is composed of a two-stage circuit including a capacitor and a diode is illustrated, but the circuit including the capacitor and the diode may be composed of three or more stages, and the number of stages of the circuit including the capacitor and the diode may be set to any number.

1.1.3 Structure of Semiconductor Storage Device 10

Next, an example of the structure of the semiconductor storage device 10 of the first embodiment will be described.

1.1.3.1 Cross-Sectional Structure of Memory Cell Array 11

Figure 8:
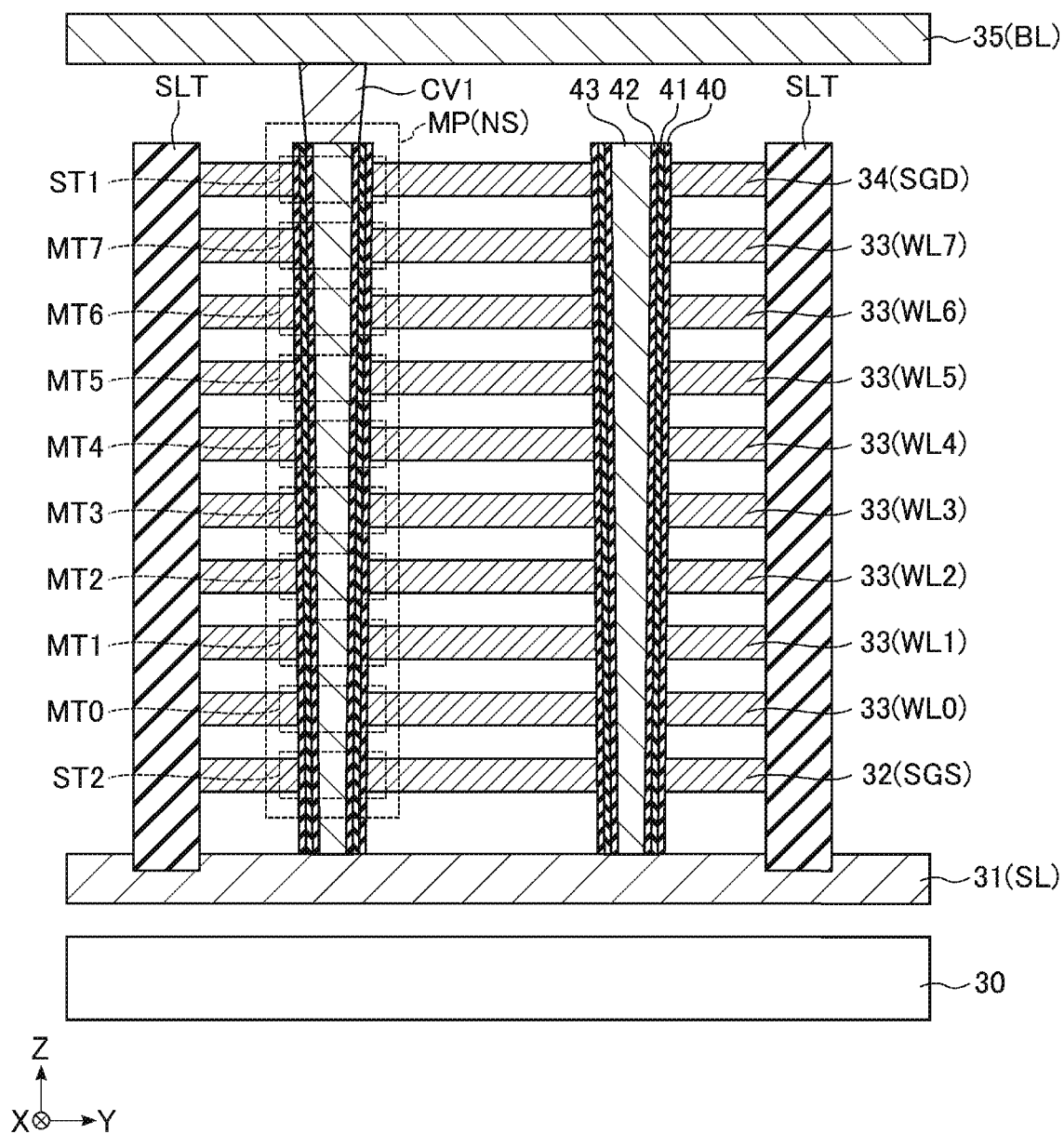
FIG. 8 is a cross-sectional diagram of the memory cell transistor in the memory cell array provided in the semiconductor storage device in the first embodiment.

FIG. 8 is a cross-sectional diagram of the memory cell transistor in the memory cell array 11 provided in the semiconductor storage device 10. In FIG. 8, two directions parallel to a semiconductor substrate 30 plane and orthogonal to each other are defined as an X direction and a Y direction, and the direction orthogonal to the plane (XY plane) including the X direction and the Y direction is defined as a Z direction. The X direction corresponds to the extending direction of the word line WL, the Y direction corresponds to the extending direction of the bit line BL, and the Z direction corresponds to the direction in which the word lines WL are stacked. In FIG. 8, the interlayer insulating layer between the conductive layers is omitted.

As illustrated in FIG. 8, the memory cell array 11 includes conductive layers 31 to 34 provided above the semiconductor substrate 30, a memory pillar MP, and a contact plug CV1. More specifically, the conductive layer 31 is provided above the semiconductor substrate 30. The conductive layer 31 is formed in a flat plate shape parallel to the main plane (or XY plane) of the semiconductor substrate 30. The conductive layer 31 functions as a source line SL. The conductive layer 31 contains, for example, polysilicon doped with impurities, or tungsten (W).

On the conductive layer 31, a plurality of slits SLT along an XZ plane are arranged in the Y direction. The structure (or stacked body) on the conductive layer 31 and between the adjacent slits SLT corresponds to, for example, one string unit SU.

The conductive layer 32, a plurality of conductive layers 33, the conductive layer 34, and the conductive layer 35 are provided in this order from the lower layer on the conductive layer 31 and between adjacent slits SLTs. Among these conductive layers, the conductive layers adjacent to each other in the Z direction are stacked via an interlayer insulating film. Each of the conductive layers 32 to 34 is formed in a flat plate shape parallel to the XY plane. The conductive layer 32 functions as a select gate line SGS. The plurality of conductive layers 33 function as word lines WL0 to WL7 in this order from the lower layer. The conductive layer 34 functions as a select gate line SGD0. The conductive layers 32 to 34 contain, for example, tungsten (W) or polysilicon.

A plurality of memory pillars MP are arranged in a staggered pattern in the X direction and the Y direction, for example. Each of the plurality of memory pillars MP extends (or penetrates) in the Z direction in the stacked body between the slits SLT. Each of the memory pillars MP is provided through the conductive layers 34, 33, and 32 so as to reach the upper surface of the conductive layer 31 from a location that is above the conductive layer 34. Each of the memory pillars MP functions as one NAND string NS.

The memory pillar MP includes, for example, a block insulating layer 40, a charge storage layer 41, a tunnel insulating layer (also referred to as tunnel insulating film) 42, and a semiconductor layer 43. Specifically, the block insulating layer 40 is provided on the inner wall of a memory hole for forming the memory pillar MP. The charge storage layer 41 is provided on the inner wall of the block insulating layer 40. The tunnel insulating layer 42 is provided on the inner wall of the charge storage layer 41. Further, the semiconductor layer 43 is provided on the inner wall of the tunnel insulating layer 42. The memory pillar MP may have a structure in which a core insulating layer is provided in the semiconductor layer 43.

In such a configuration of the memory pillar MP, the portion where the memory pillar MP and the conductive layer 32 intersect functions as the select transistor ST2. The portions where the memory pillars MP and the conductive layers 33 intersect function as the memory cell transistors MT0 to MT7, respectively. Further, the portions where the memory pillars MP and the conductive layers 34 intersect function as the select transistors ST1.

The semiconductor layer 43 functions as a channel layer of the memory cell transistors MT and the select transistors ST1 and ST2. A current path of the NAND string NS is formed in the semiconductor layer 43.

The charge storage layer 41 has a function of storing the charges injected from the semiconductor layer 43 in the memory cell transistor MT. The charge storage layer 41 contains, for example, a silicon nitride film.

The tunnel insulating layer 42 functions as a voltage barrier when charges are injected from the semiconductor layer 43 into the charge storage layer 41, or when the charges accumulated in the charge storage layer 41 diffuse to the semiconductor layer 43. The tunnel insulating layer 42 contains, for example, a silicon oxide film.

The block insulating layer 40 prevents the charges accumulated in the charge storage layer 41 from diffusing into the conductive layer 33 (word line WL). The block insulating layer 40 contains, for example, an aluminum oxide layer, a silicon oxide layer, and a silicon nitride layer.

A plurality of conductive layers 35 are provided above the upper surface of the memory pillar MP via an interlayer insulating film. The plurality of conductive layers 35 are arranged in the X direction. Each of the conductive layers 35 is a line-shaped wiring layer extending in the Y direction, and functions as the bit line BL. Each conductive layer 35 is electrically connected to one memory pillar MP of each string unit SU. Specifically, in each string unit SU, the contact plug CV1 is provided on the semiconductor layer 43 in each memory pillar MP, and one conductive layer 35 is provided on the contact plug CV1. The conductive layer 35 contains, for example, aluminum (Al) or tungsten (W). The contact plug CV1 contains a conductive layer, such as tungsten (W).

The number of word lines WL and select gate lines SGD and SGS is changed according to the number of memory cell transistors MT and select transistors ST1 and ST2, respectively.

1.2 Operation of Memory System and Semiconductor Storage Device

Next, the operation of the memory system 1 and the semiconductor storage device 10 of the first embodiment will be described.

When a read command is transmitted from the memory controller 20 to the semiconductor storage device 10, the semiconductor storage device 10 executes a read operation. In the read operation in the semiconductor storage device 10, the read voltage VCGRV is supplied to a selected word line, the voltage VREAD is supplied to a non-selected word line, and data is read from the memory cell to be read.

Figure 9:
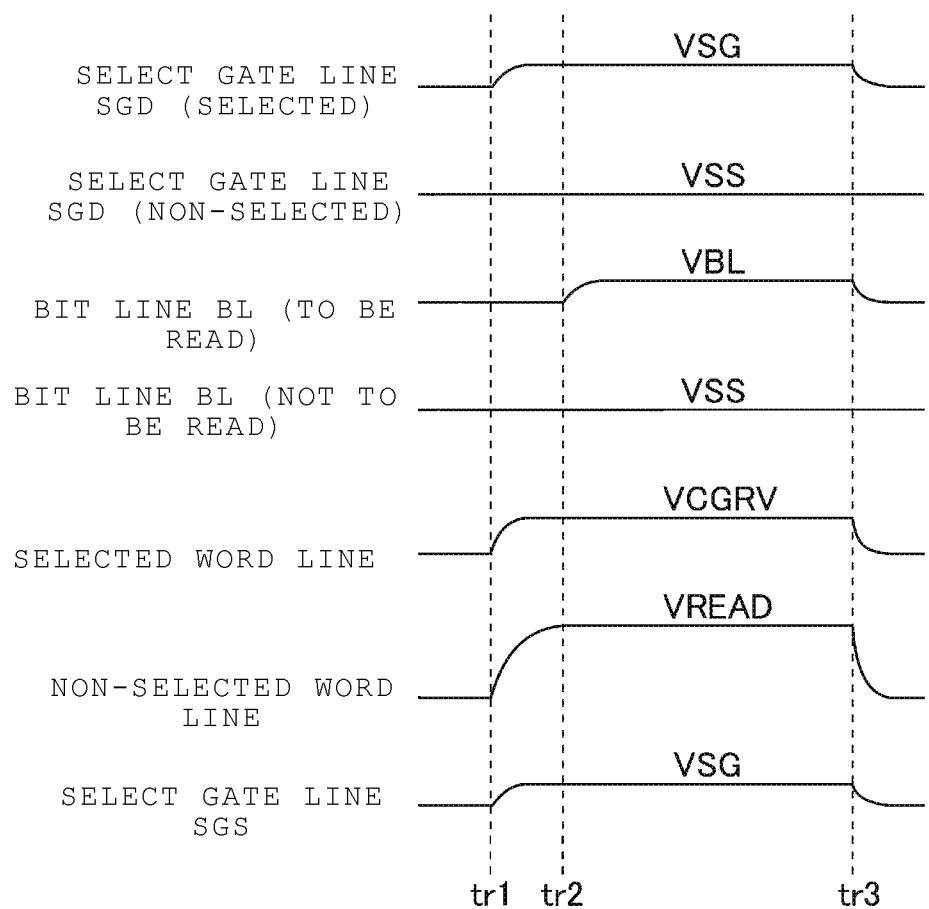
FIG. 9 is a timing chart of voltages applied to various signal lines during a read operation in the first embodiment.

The outline of a read operation will be described below with reference to FIG. 9. FIG. 9 is a timing chart of the voltages applied to the selected word line, the non-selected word line, the select gate lines SGD and SGS, and the bit line BL during the read operation.

At time tr1 illustrated in FIG. 9, the row decoder 19 applies a voltage VSG to the select gate line SGD and the select gate line SGS corresponding to the selected string unit SU. The row decoder 19 applies the voltage VSS to the select gate line SGD corresponding to the non-selected string unit SU. The voltage VSG is a voltage that turns on the select transistors ST1 and ST2 corresponding to the selected string unit SU. As a result, the select transistors ST1 and ST2 of the selected string unit SU are turned on, and the select transistor ST1 of the non-selected string unit SU is turned off.

Further, at time tr1, the row decoder 19 applies the voltage VCGRV to the selected word line and the voltage VREAD to the non-selected word line. The voltage VCGRV is a voltage set according to read data. As described above, the voltage VREAD is a voltage that turns on the memory cell transistor MT regardless of the threshold voltage of the memory cell transistor MT, and VREAD>VCGRV. For example, when the threshold voltage of the memory cell transistor MT to be read is higher than the voltage VCGRV, the memory cell transistor MT is turned off, and when the threshold voltage is equal to or less than the voltage VCGRV, the memory cell transistor MT is turned on.

Next, at time tr2, the sense amplifier 29 sets the voltage of the bit line BL connected to the memory cell transistor MT to be read to a voltage VBL. The voltage VBL is, for example, a voltage lower than the voltage VCGRV (VCGRV>VBL). Further, the sense amplifier 29 sets the voltage of the bit line BL connected to the memory cell transistor MT not to be read to the voltage VSS.

Then, at time tr3, the row decoder 19 applies the voltage VSS to the selected word line, the non-selected word line, the select gate line SGD corresponding to a selected string unit and a non-selected string unit, and the select gate line SGS. Further, the sense amplifier 29 applies the voltage VSS to the bit line BL.

By the above operation, data is read from the memory cell transistor MT connected to the selected word line of the selected string unit to the sense amplifier 29.

FIG. 9 is an example of the timing chart of a read operation of the present embodiment. It should be understood that the magnitude relationship of the voltage applied to each of the word line WL, the select gate lines SGD and SGS, and the bit line BL does not necessarily have to match the magnitude relationship of the voltages illustrated in FIG. 9.

As described above, in a read operation, the read voltage VCGRV is applied to the selected word line, and the voltage VREAD is applied to the non-selected word line. For example, a selected word line corresponds to one word line, and a non-selected word line corresponds to hundreds of word lines. As described above, the number of non-selected word lines to be stepped up to the voltage VREAD is much larger than the number of selected word lines. Therefore, the amount of current supplied to the non-selected word lines during the read operation is much larger than the amount of current supplied to the selected word lines.

When generating the voltage VREAD in the read operation, there are two operation modes, for example, a mode for generating the voltage VREAD by using the high power supply voltage VPP (hereinafter, referred to as VPP mode) and a mode for generating the voltage VREAD by using the voltage step-up module 17A (hereinafter, referred to as shared voltage step-up mode).

Generally, the VPP mode is selected when the high power supply voltage VPP is available. In the VPP mode, the high power supply voltage VPP input to the terminal TVPP is supplied to the regulator RE1 during the read operation, and is adjusted to the voltage VREAD by the regulator RE1. When the VPP mode is selected, the charge pumps CP0 to CP3 in the voltage step-up module 17A are stopped.

When the high power supply voltage VPP is not available, a shared voltage step-up mode is selected. In the shared voltage step-up mode, the voltage stepped up by the charge pumps in the plurality of memory chips is supplied to the regulator RE1 during the read operation, and is adjusted to the voltage VREAD by the regulator RE1. When the shared voltage step-up mode is selected, the supply of the high power supply voltage VPP from the terminal TVPP is cut off.

The operation described below is an operation in the shared voltage step-up mode.

1.2.1 Operation of Voltage Step-Up Modules 17A in One Memory Chip

Figure 10:
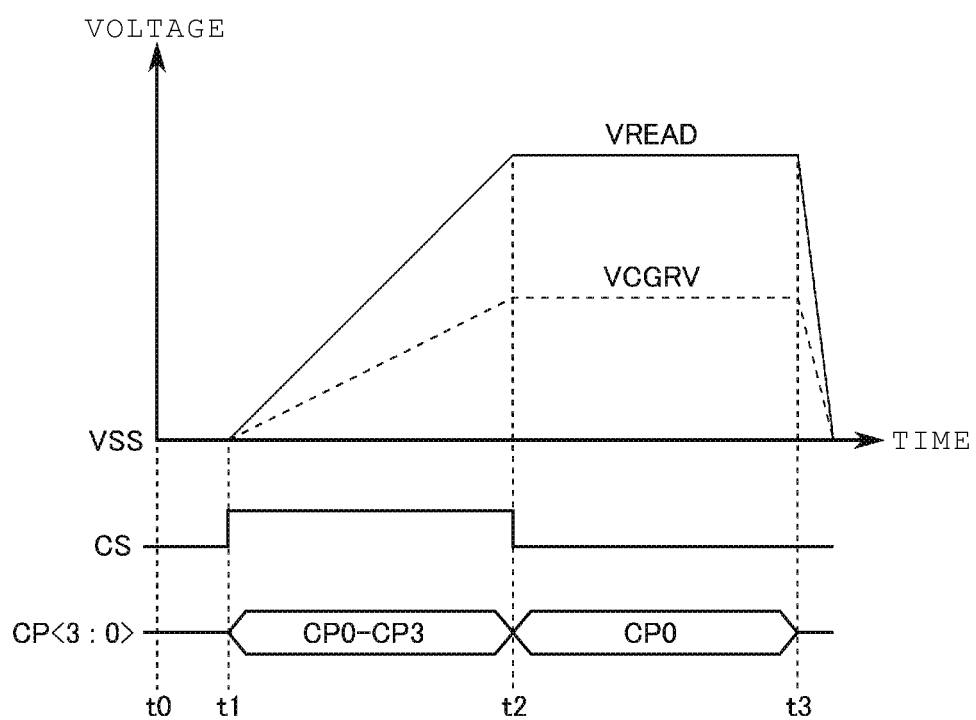
FIG. 10 is a timing chart illustrating an operation of a charge pump in the voltage step-up module of the memory chip in the first embodiment.

The operation of the voltage step-up module 17A in one memory chip of the semiconductor storage device 10 will be described below. FIG. 10 is a timing chart illustrating the operation of the charge pumps CP0 to CP3 in the voltage step-up module 17A of the memory chip.

When the control signal CS is at the "L" state at time t0, the charge pumps CP0 to CP3 are in a stopped operation state.

Next, at time t1, when the control signal CS transitions from the "L" state to the "H" state, the charge pumps CP0 to CP3 start operating. Each of the charge pumps CP0 to CP3 steps up the power supply voltage VDD and outputs the stepped-up voltage to the regulator RE1. The regulator RE1 adjusts the voltage value of the stepped-up voltage supplied from the charge pumps CP0 to CP3 and outputs the adjusted voltage. Thereafter, the voltage supplied from the regulator RE1 to the non-selected word line rises to the voltage VREAD at time t2.

At time t2, when the voltage output from the regulator RE1 reaches the voltage VREAD, the control signal CS transitions from the "H" state to the "L" state. When the control signal CS transitions to the "L" state, the charge pumps CP1 to CP3 stop operating, and only the charge pump CP0 continues to operate. As a result, the voltage supplied from the regulator RE1 to the non-selected word line is held as the voltage VREAD. Thereafter, at time t3, when the read operation ends, the charge pump CP0 stops operating.

The voltage step-up operations of the charge pumps CP0 to CP3 in one memory chip described above can be summarized as follows. As illustrated in FIG. 10, during the period of time t1 to t2, the charge pumps CP0 to CP3 operate, and the charge pumps CP0 to CP3 supply a stepped-up voltage to the regulator RE1. At time t2, when the voltage of the non-selected word line reaches the voltage VREAD, the control signal CS transitions from the "H" state to the "L" state. As a result, the charge pumps CP1 to CP3 stop operating, and the charge pump CP0 continues to operate. In this way, the charge pumps CP1 to CP3 are stopped and the stepped-up voltage is supplied from the charge pump CP0 alone to the regulator RE1 to prevent the voltage VREAD output from the regulator RE1 from fluctuating, or prevent the voltage VREAD from becoming unstable. That is, the ripple voltage of the stepped-up voltage is reduced by stopping the charge pumps CP1 to CP3 and supplying the stepped-up voltage from one charge pump CP0 to the regulator RE1. As a result, it is possible to reduce the ripple voltage of the stepped-up voltage from the charge pump from affecting the voltage VREAD output from the regulator RE1.

In addition, during the period of time t2 to t3, the charge pumps CP1 to CP3 are stopped. Therefore, it is possible to assist the step-up of the voltage of the non-selected word line to the voltage VREAD in another memory chip by the current supplied from the charge pumps CP1 to CP3 by operating these charge pumps CP1 to CP3. That is, the charge pumps CP1 to CP3 of the memory chips can assist the voltage step-up operation in the voltage step-up module 17A of another memory chip.

1.2.2 Operation of Voltage Step-Up Modules 17A in a Plurality of Memory Chips Next, the operation of the voltage step-up modules 17A_0 to 17A_3 in the memory chips 10_0 to 10_3 of the semiconductor storage device 10 will be described. The voltage step-up module 17A of each memory chip can perform the voltage step-up operation and assist the voltage step-up operation in the voltage step-up modules of other memory chips. That is, it is possible to assist the operation of stepping up the voltage applied to the non-selected word lines to the voltage VREAD mutually between the voltage step-up modules 17A_0 to 17A_3 of the memory chips 10_0 to 10_3.

Hereinafter, the operation of assisting the voltage step-up operation in the voltage step-up module 17A between the memory chips 10_0 and the memory chip 10_1 will be described as an example, but the operation of assisting the voltage step-up operation between the other memory chips is also the same. Hereinafter, the operation in which the voltage step-up module of a certain memory chip assists the voltage step-up operation in the voltage step-up module of another memory chip is referred to as an assist operation.

Figure 11:
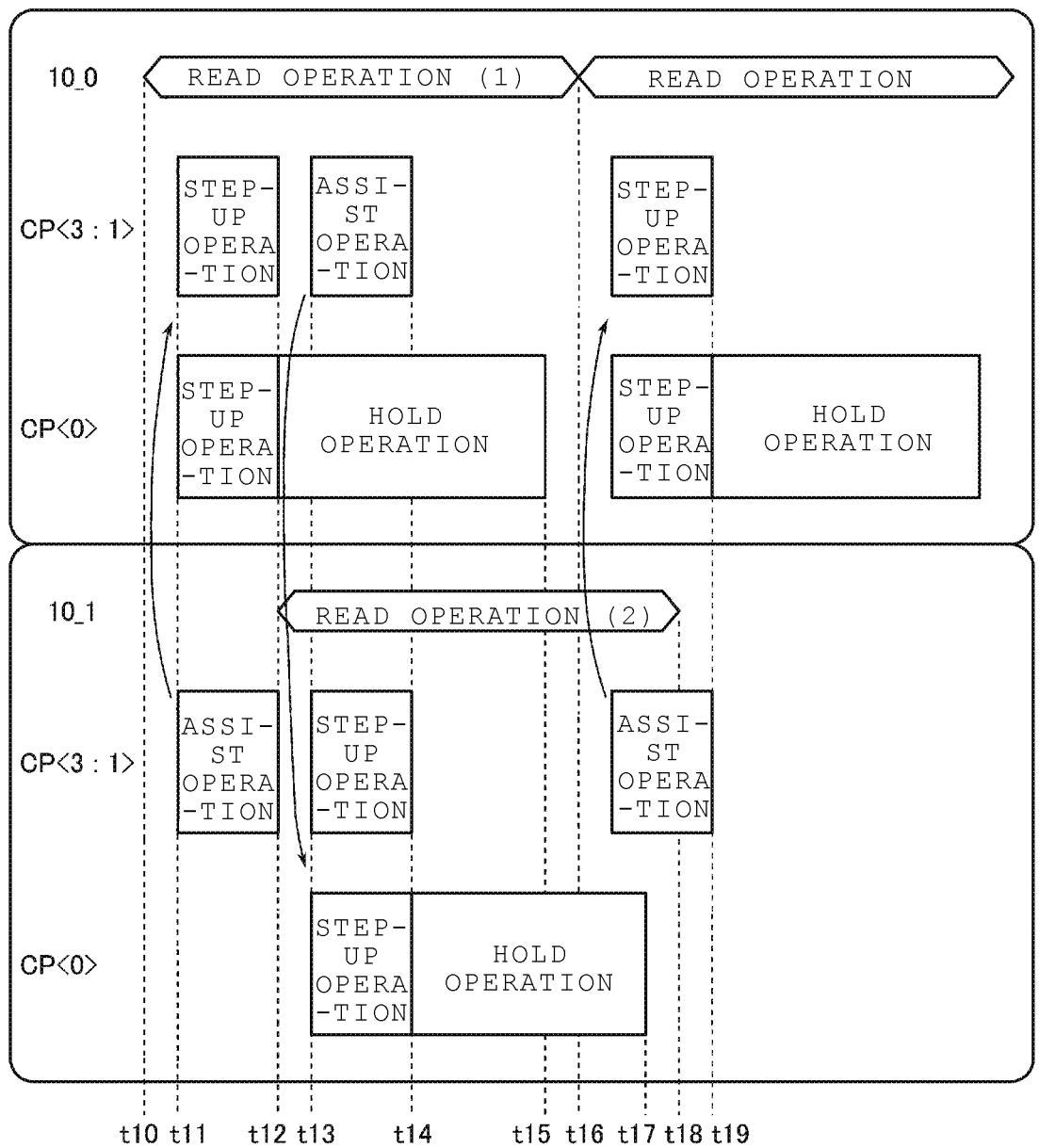
FIG. 11 is a timing chart illustrating the operation of the charge pump in the voltage step-up module of the memory chip in the first embodiment.
Figure 12:
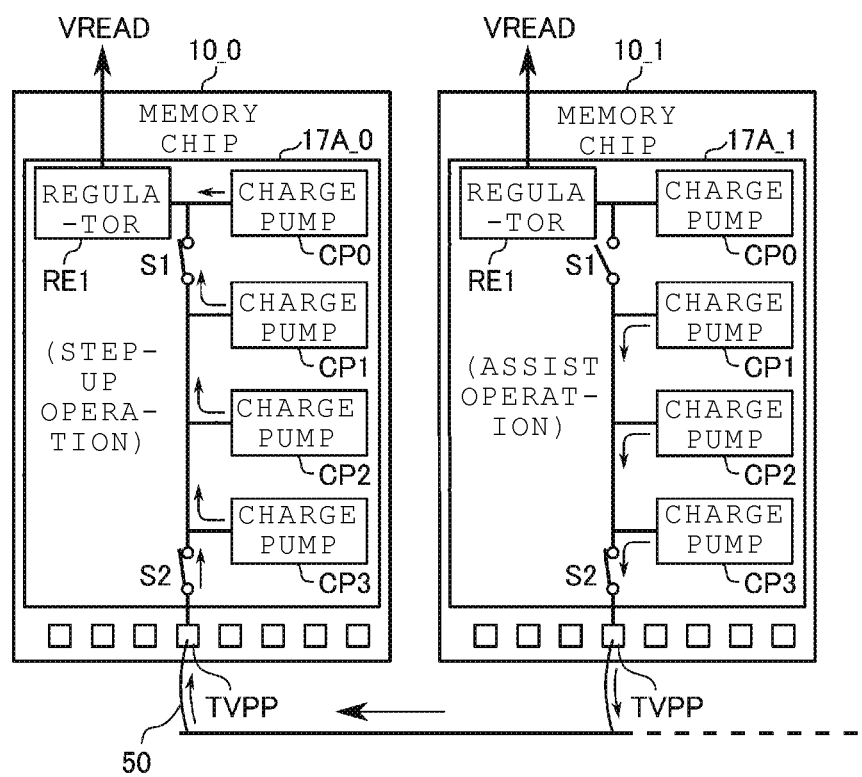
FIG. 12 is a diagram illustrating the operation of the charge pump during a part of an assist period illustrated in FIG. 11.
Figure 13:
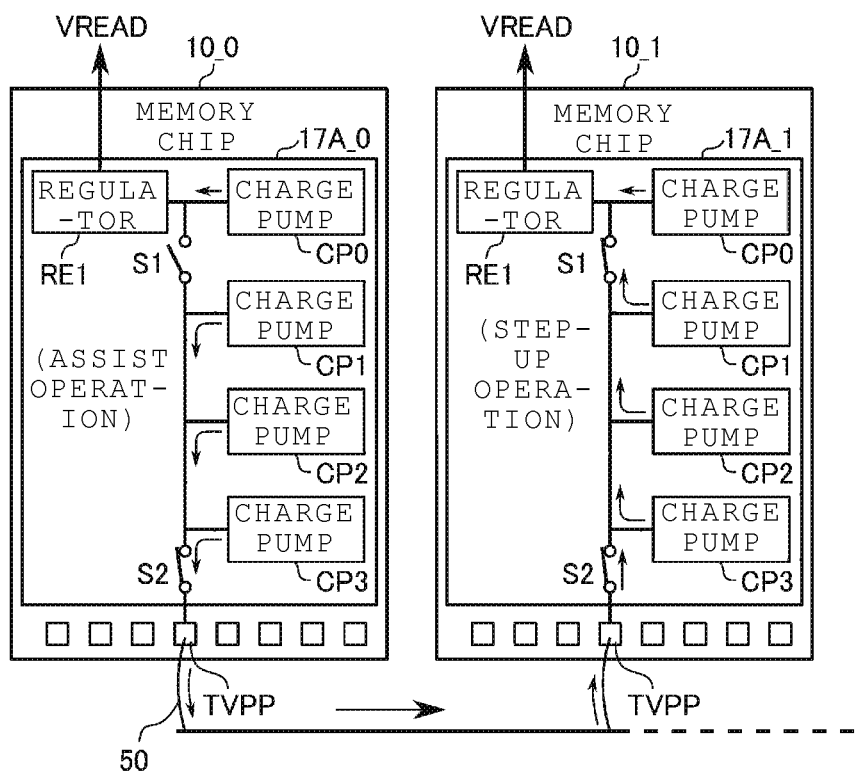
FIG. 13 is a diagram illustrating the operation of the charge pump during another part of the assist period illustrated in FIG. 11.

FIG. 11 is a timing chart illustrating the operation of the charge pumps CP0 to CP3 in the voltage step-up modules 17A_0 and 17A_1 of the memory chips 10_0 and 10_1. FIG. 12 is a diagram illustrating the operation of the charge pumps CP0 to CP3 during an assist period t11 to t12 illustrated in FIG. 11. FIG. 13 is a diagram illustrating the operation of the charge pumps CP0 to CP3 during an assist period t13 to t14 illustrated in FIG. 11.

FIG. 11 illustrates how a read operation (1) is executed by the memory chip 10_0 between times t10 and t16 and a read operation (2) is executed by the memory chip 10_1 between times t12 and t18.

First, at time t10, the read operation (1) is started in the memory chip 10_0.

When the read operation (1) is started, the charge pumps CP0 to CP3 in the memory chip 10_0 execute a voltage step-up operation from time t11 to time t12. In parallel with this, from time t11 to time t12, the charge pumps CP1 to CP3 in the memory chip 10_1 execute an assist operation. The assist operation of the memory chip 10_1 assists the voltage step-up operation by the charge pumps CP0 to CP3 in the memory chip 10_0. That is, as illustrated in FIG. 12, by the assist operation, a current is supplied from the charge pumps CP1 to CP3 in the memory chip 10_1 to the voltage step-up module 17A_0 in the memory chip 10_0.

More specifically, the charge pumps CP0 to CP3 in the memory chip 10_0 and the charge pumps CP1 to CP3 in the memory chip 10_1 are set to an operating state, and the charge pumps CP0 in the memory chip 10_1 are set to a stopped state. Further, the switch circuits S1 and S2 in the memory chip 10_0 are set to the connected state, the switch circuit S2 in the memory chip 10_1 is set to the connected state, and the switch circuit S1 in the memory chip 10_1 is set to the disconnected state. As a result, a current is supplied from the charge pumps CP0 to CP3 in the memory chip 10_0 and the charge pumps CP1 to CP3 in the memory chip 10_1 to the regulator RE1 in the memory chip 10_0.

This current supply assists the voltage step-up module 17A_0 in the memory chip 10_0 to step up the non-selected word line to the voltage VREAD. The non-selected word line in the memory chip 10_0 is quickly stepped up to the voltage VREAD by the voltage step-up operation of the charge pumps CP0 to CP3 in the memory chip 10_0 and the assist operation of the charge pumps CP1 to CP3 in the memory chip 10_1.

Thereafter, when the voltage of the non-selected word line in the memory chip 10_0 reaches the voltage VREAD, the voltage step-up operation of the charge pumps CP1 to CP3 in the memory chip 10_0 is stopped at time t12, and at the same time, the assist operation of the charge pumps CP1 to CP3 in the memory chip 10_1 is stopped. In order to hold the voltage of the non-selected word line in the memory chip 10_0 at the voltage VREAD, the voltage step-up operation of the charge pump CP0 in the memory chip 10_0 is not stopped but continued. The voltage step-up operation that is continued to hold the non-selected word line at the voltage VREAD is called a hold operation.

More specifically, the charge pump CP0 in the memory chip 10_0 is set to the operating state, and the charge pumps CP1 to CP3 in the memory chip 10_0 and the charge pumps CP0 to CP3 in the memory chip 10_1 are set to the stopped state. Further, the switch circuits S1 and S2 in the memory chip 10_0 and the memory chip 10_1 are set to the disconnected state. As a result, a current is supplied from the charge pump CP0 in the memory chip 10_0 to the regulator RE1 in the memory chip 10_0.

Thereafter, the read operation (1) in the memory chip 10_0 is continued even after time t12.

Next, at time t12, a read operation (2) is started in the memory chip 10_1.

When the read operation (2) is started, the charge pumps CP0 to CP3 in the memory chip 10_1 execute a voltage step-up operation from time t13 to time t14. In parallel with this, from time t13 to time t14, the charge pumps CP1 to CP3 in the memory chip 10_0 execute an assist operation. The assist operation of the memory chip 10_0 assists the voltage step-up operation by the charge pumps CP0 to CP3 in the memory chip 10_1. That is, as illustrated in FIG. 13, by the assist operation, a current is supplied from the charge pumps CP1 to CP3 in the memory chip 10_0 to the voltage step-up module 17A_1 in the memory chip 10_1.

More specifically, the charge pumps CP0 to CP3 in the memory chip 10_1 and the memory chips 10_0 are set to the operating state. Further, the switch circuits S1 and S2 in the memory chip 10_1 are set to the connected state, the switch circuit S2 in the memory chip 10_0 is set to the connected state, and the switch circuit S1 in the memory chip 10_0 is set to the disconnected state. As a result, a current is supplied from the charge pumps CP0 to CP3 in the memory chip 10_1 and the charge pumps CP1 to CP3 in the memory chip 10_0 to the regulator RE1 in the memory chip 10_1. Further, a current is supplied from the charge pump CP0 in the memory chip 10_0 to the regulator RE1 in the memory chip 10_0.

This current supply assists the voltage step-up module 17A_1 in the memory chip 10_1 to step up the voltage applied to the non-selected word line to the voltage VREAD. The non-selected word line in the memory chip 10_1 is quickly stepped up to the voltage VREAD by the voltage step-up operation of the charge pumps CP0 to CP3 in the memory chip 10_1 and the assist operation of the charge pumps CP1 to CP3 in the memory chip 10_0.

Thereafter, when the voltage of the non-selected word line in the memory chip 10_1 reaches the voltage VREAD, the voltage step-up operation of the charge pumps CP1 to CP3 in the memory chip 10_1 is stopped at time t14, and at the same time, the assist operation of the charge pumps CP1 to CP3 in the memory chip 10_0 is stopped. In order to hold the voltage of the non-selected word line in the memory chip 10_1 at the voltage VREAD, the voltage step-up operation of the charge pump CP0 in the memory chip 10_1 is not stopped but continued.

More specifically, the charge pumps CP0 in the memory chip 10_1 and the memory chip 10_0 are set to the operating state, and the charge pumps CP1 to CP3 in the memory chip 10_1 and the memory chip 10_0 are set to the stopped state. Further, the switch circuits S1 and S2 in the memory chip 10_1 and the memory chip 10_0 are set to the disconnected state. As a result, a current is supplied from the charge pump CP0 in the memory chip 10_1 to the regulator RE1 in the memory chip 10_1. Further, a current is supplied from the charge pump CP0 in the memory chip 10_0 to the regulator RE1 in the memory chip 10_0.

Thereafter, the read operation (2) in the memory chip 10_1 is continued even after time t14.

Thereafter, at time t15, the hold operation of the charge pump CP0 in the memory chip 10_0 is stopped. Further, at time t16, the read operation (1) in the memory chip 10_0 ends.

Thereafter, at time t17, the hold operation of the charge pump CP0 in the memory chip 10_1 is stopped. Further, at time t18, the read operation (2) in the memory chip 10_1 ends.

In the read operations (1) and (2) described above, the switch circuit S2 in the memory chips 10_2 and 10_3 is set to the disconnected state in order to prevent the current due to the assist operation from entering the memory chips 10_2 and 10_3.

In the operation illustrated in FIG. 11, from time t11 to time t12, the charge pumps CP0 to CP3 in the memory chip 10_0 execute a voltage step-up operation, and the charge pumps CP1 to CP3 in the memory chip 10_1 execute an assist operation, but the charge pump CP0 in the memory chip 10_1 does not execute an assist operation.

Figure 14:
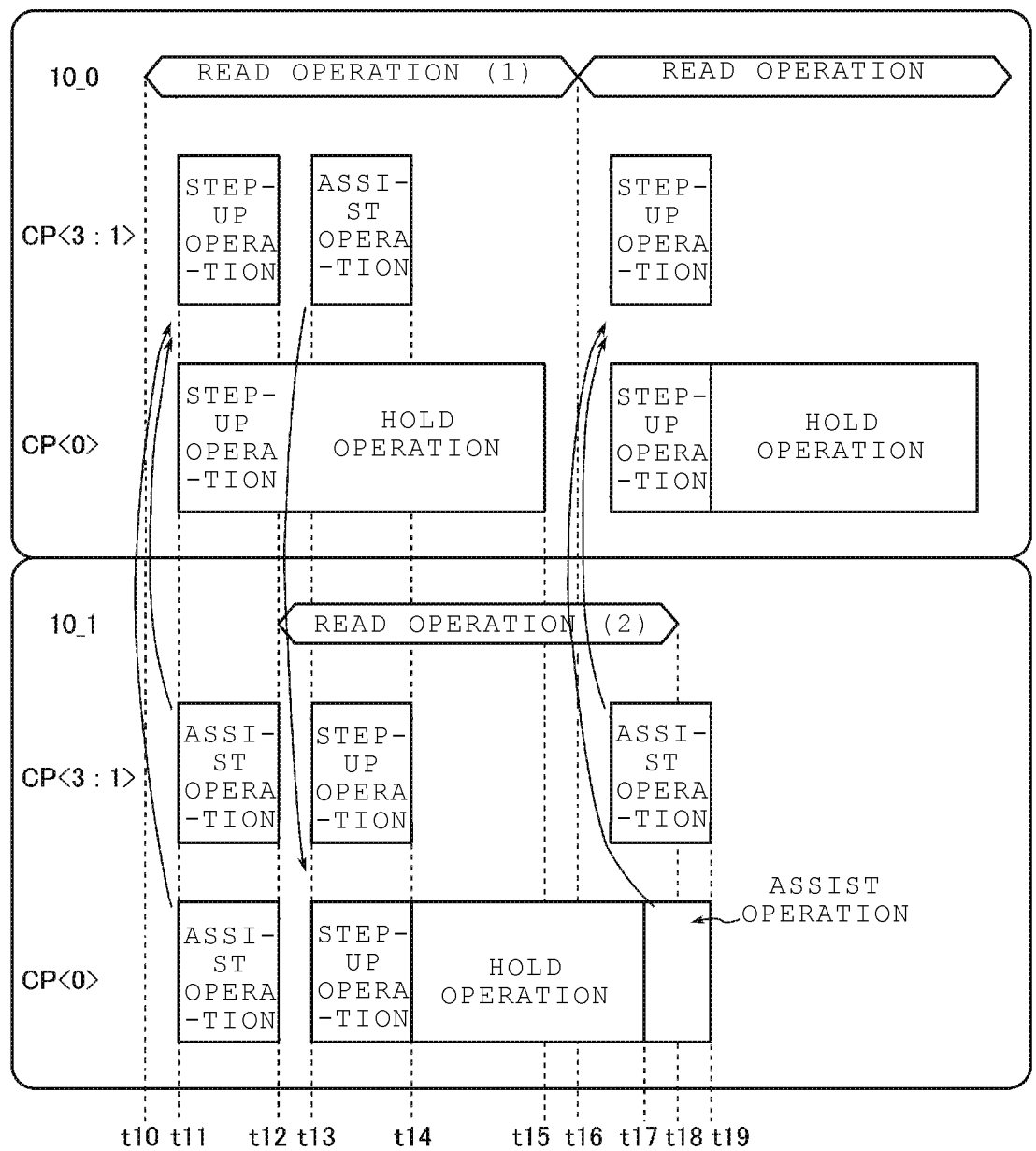
FIG. 14 is a timing chart illustrating an operation of a charge pump in a voltage step-up module of a memory chip in a modification example of the first embodiment.

Therefore, as a modification example, as illustrated in FIG. 14, from time t11 to time t12, in addition to the assist operation of the charge pumps CP1 to CP3 in the memory chip 10_1, the charge pump CP0 in the memory chip 10_1 also executes an assist operation. Further, similarly, from time t17 to time t19, if the charge pump CP0 in the memory chip 10_1 ends the hold operation, the charge pump CP0 in the memory chip 10_1 executes an assist operation.

In the memory chip in the modification example, a switch circuit S3 (not illustrated) is provided between the node between the charge pump CP0 and the switch circuit S1, and the regulator RE1. By providing the switch circuit S3, it is possible to switch between the case where a current is supplied from the charge pump CP0 to the regulator RE1 and the case where a current is supplied from the charge pump CP0 to the terminal TVPP via the switch circuits S1 and S2.

According to the modification example, a non-selected word line in the memory chip 10_0 can be stepped up to the voltage VREAD more quickly than in the example illustrated in FIG. 11.

It is also possible for the voltage step-up modules of the plurality of memory chips to assist the voltage step-up operation in the voltage step-up module of another memory chip. For example, the voltage step-up modules 17A_1 and 17A_2 of the memory chips 10_1 and 10_2 can assist the voltage step-up operation in the voltage step-up module 17A_0 of the memory chip 10_0.

Figure 15:
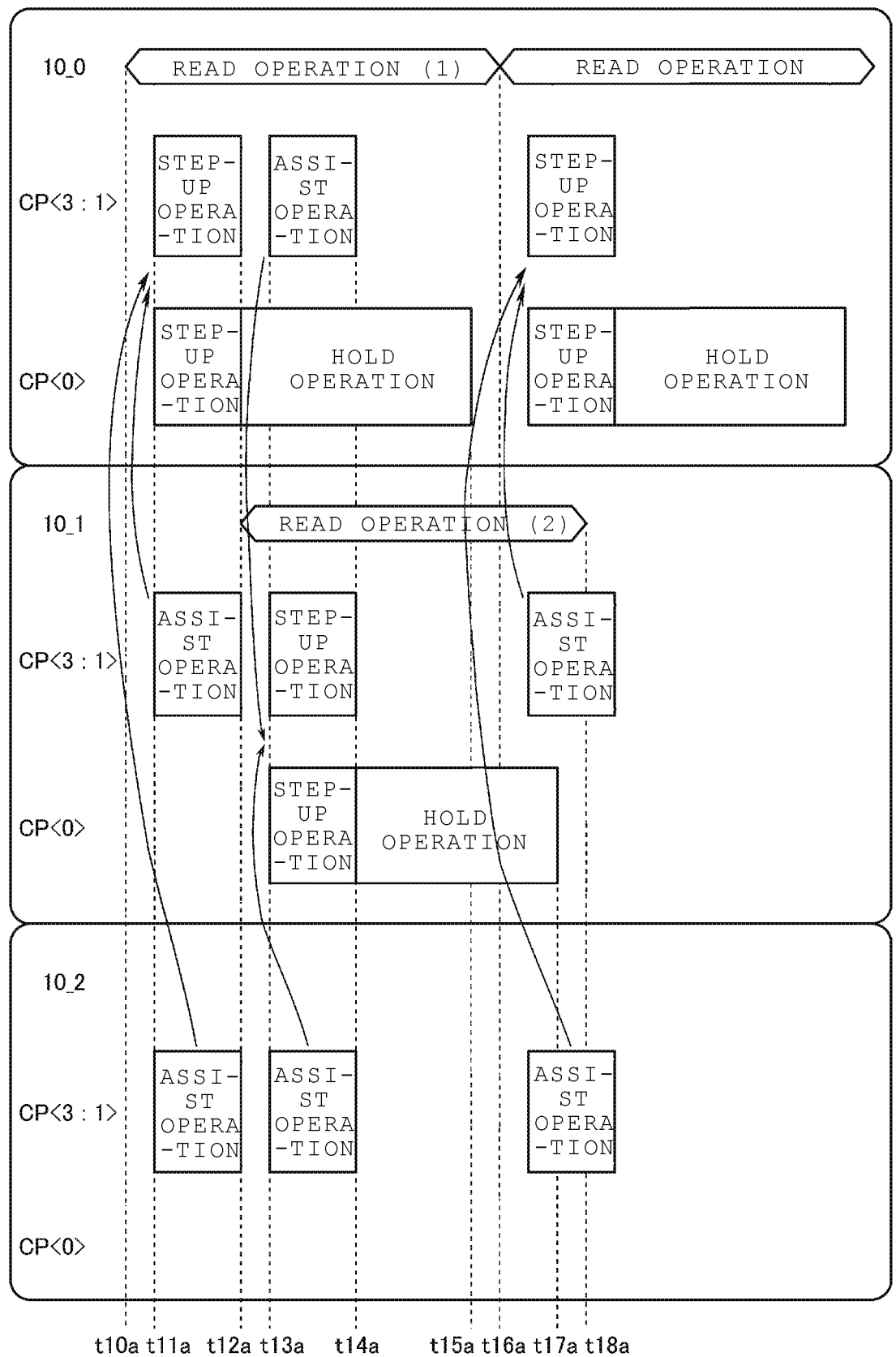
FIG. 15 is a timing chart illustrating the operation of charge pumps in voltage step-up modules of a plurality of memory chips in the first embodiment.
Figure 16:
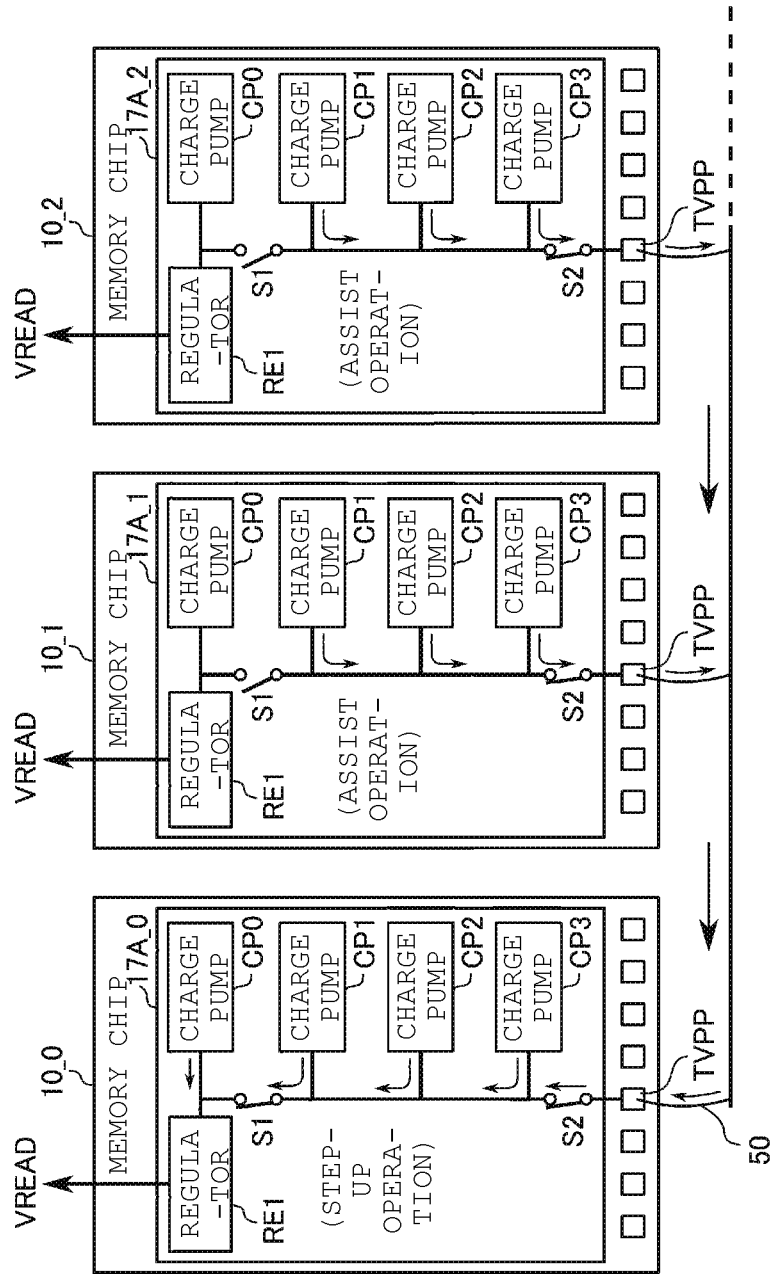
FIG. 16 is a diagram illustrating the operation of the charge pump during a part of the assist period illustrated in FIG. 15.
Figure 17:
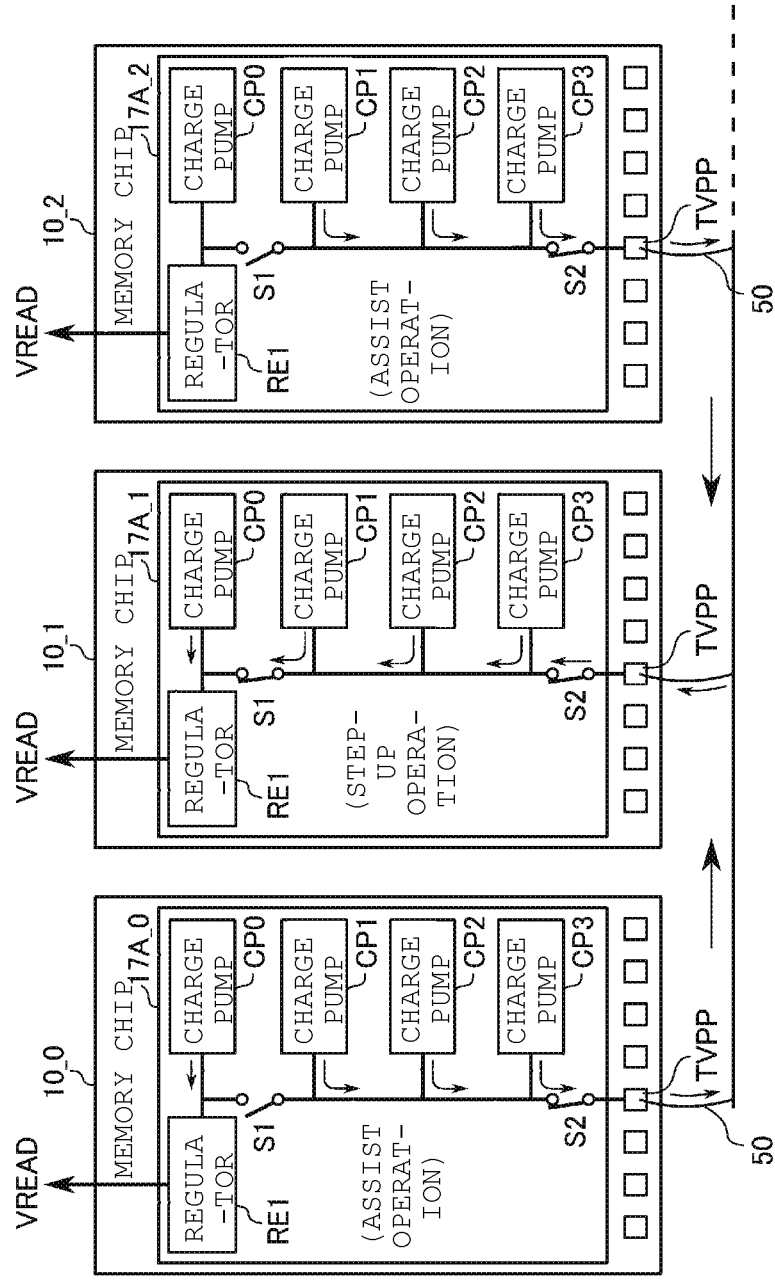
FIG. 17 is a diagram illustrating the operation of the charge pump during another part of the assist period illustrated in FIG. 15.

FIG. 15 is a timing chart illustrating the operation of the charge pumps CP0 to CP3 in the voltage step-up modules 17A_0, 17A_1 and 17A_2 of the memory chips 10_0, 10_1, and 10_2. FIG. 16 is a diagram illustrating the operation of the charge pumps CP0 to CP3 during an assist period t11a to t12a illustrated in FIG. 15. FIG. 17 is a diagram illustrating the operation of the charge pumps CP0 to CP3 during an assist period t13a to t14a illustrated in FIG. 15.

FIG. 15 illustrates how the read operation (1) is executed by the memory chip 10_0 between times t10a and t16a and the read operation (2) is executed by the memory chip 10_1 between times t12a and t18a.

First, at time t10a, the read operation (1) is started in the memory chip 10_0.

When the read operation (1) is started, the charge pumps CP0 to CP3 in the memory chip 10_0 execute a voltage step-up operation from time t11a to time t12a. In parallel with this, from time t11a to time t12a, the charge pumps CP1 to CP3 in the memory chip 10_1 and the charge pumps CP1 to CP3 in the memory chip 10_2 execute an assist operation. That is, as illustrated in FIG. 16, by the assist operation, a current is supplied from the charge pumps CP1 to CP3 in the memory chips 10_1 and 10_2 to the voltage step-up module 17A_0 in the memory chip 10_0.

More specifically, the charge pumps CP0 to CP3 in the memory chips 10_0 and the charge pumps CP1 to CP3 in the memory chips 10_1 and 10_2 are set to the operating state, and the charge pumps CP0 in the memory chips 10_1 and 10_2 are set to the stopped state. Further, the switch circuits S1 and S2 in the memory chip 10_0 are set to the connected state, the switch circuits S2 in the memory chips 10_1 and 10_2 are set to the connected state, and the switch circuit S1 in each of the memory chips 10_1 and 10_2 is set to the disconnected state. As a result, a current is supplied from the charge pumps CP0 to CP3 in the memory chip 10_0 and the charge pumps CP1 to CP3 in the memory chips 10_1 and 10_2 to the regulator RE1 in the memory chip 10_0.

This current supply assists the voltage step-up module 17A_0 in the memory chip 10_0 to step up the voltage applied to the non-selected word line to the voltage VREAD. The non-selected word line in the memory chip 10_0 is quickly stepped up to the voltage VREAD by the voltage step-up operation of the charge pumps CP0 to CP3 in the memory chip 10_0 and the assist operation of the charge pumps CP1 to CP3 in the memory chips 10_1 and 10_2.

Thereafter, when the voltage of the non-selected word line in the memory chip 10_0 reaches the voltage VREAD, the voltage step-up operation of the charge pumps CP1 to CP3 in the memory chip 10_0 is stopped at time t12a, and at the same time, the assist operation of the charge pumps CP1 to CP3 in the memory chips 10_1 and 10_2 is stopped. In order to hold the voltage of the non-selected word line in the memory chip 10_0 at the voltage VREAD, the voltage step-up operation of the charge pump CP0 in the memory chip 10_0 is not stopped but continued.

More specifically, the charge pump CP0 in the memory chip 10_0 is set to the operating state, and the charge pumps CP1 to CP3 in the memory chip 10_0 and the charge pumps CP0 to CP3 in the memory chips 10_1 and 10_2 are set to the stopped state. Further, the switch circuits S1 and S2 in the memory chips 10_0, 10_1, and 10_2 are set to the disconnected state. As a result, a current is supplied from only the charge pump CP0 in the memory chip 10_0 to the regulator RE1 in the memory chip 10_0.

Thereafter, the read operation (1) in the memory chip 10_0 is continued even after time t12a.

Next, at time t12a, the read operation (2) is started in the memory chip 10_1.

When the read operation (2) is started, the charge pumps CP0 to CP3 in the memory chip 10_1 execute a voltage step-up operation from time t13a to time t14a. In parallel with this, from time t13a to time t14a, the charge pumps CP1 to CP3 in the memory chips 10_0 and 10_2 execute an assist operation. That is, as illustrated in FIG. 17, by the assist operation, a current is supplied from the charge pumps CP1 to CP3 in the memory chips 10_0 and 10_2 to the voltage step-up module 17A_1 in the memory chip 10_1.

More specifically, the charge pumps CP0 to CP3 in the memory chips 10_0 and 10_1 are set to the operating state. The charge pumps CP1 to CP3 in the memory chip 10_2 are set to the operating state, and the charge pump CP0 in the memory chip 10_2 is set to the stopped state. Further, the switch circuits S1 and S2 in the memory chip 10_1 are set to the connected state, the switch circuits S2 in the memory chips 10_0 and 10_2 are set to the connected state, and the switch circuit S1 in each of the memory chips 10_0 and 10_2 is set to the disconnected state. As a result, a current is supplied to the regulator RE1 in the memory chip 10_1 from the charge pumps CP0 to CP3 in the memory chip 10_1 and the charge pumps CP1 to CP3 in the memory chips 10_0 and 10_2. Further, a current is supplied from the charge pump CP0 in the memory chip 10_0 to the regulator RE1 in the memory chip 10_0.

This current supply assists the voltage step-up module 17A_1 in the memory chip 10_1 to step up the non-selected word line to the voltage VREAD. The non-selected word line in the memory chip 10_1 is quickly stepped up to the voltage VREAD by the voltage step-up operation of the charge pumps CP0 to CP3 in the memory chip 10_1 and the assist operation of the charge pumps CP1 to CP3 in the memory chips 10_0 and 10_2.

Thereafter, when the voltage of the non-selected word line in the memory chip 10_1 reaches the voltage VREAD, the voltage step-up operation of the charge pumps CP1 to CP3 in the memory chip 10_1 is stopped at time t14a, and at the same time, the assist operation of the charge pumps CP1 to CP3 in the memory chips 10_0 and 10_2 is stopped. In order to hold the voltage of the non-selected word line in the memory chip 10_1 at the voltage VREAD, the voltage step-up operation of the charge pump CP0 in the memory chip 10_1 is not stopped but continued.

More specifically, the charge pumps CP0 in the memory chips 10_0 and 10_1 are set to the operating state, and the charge pumps CP1 to CP3 in the memory chips 10_0 and 10_1 are set to the stopped state. The charge pumps CP0 to CP3 in the memory chip 10_2 are set to the stopped state. Further, the switch circuits S1 and S2 in the memory chips 10_0, 10_1, and 10_2 are set to the disconnected state. As a result, a current is supplied from only the charge pump CP0 in the memory chip 10_1 to the regulator RE1 in the memory chip 10_1. Further, a current is supplied from only the charge pump CP0 in the memory chip 10_0 to the regulator RE1 in the memory chip 10_0.

Thereafter, the read operation (2) in the memory chip 10_1 is continued even after time t14a.

Thereafter, at time t15a, the hold operation of the charge pump CP0 in the memory chip 10_0 is stopped. Further, at time t16a, the read operation (1) in the memory chip 10_0 ends.

Thereafter, at time t17a, the hold operation of the charge pump CP0 in the memory chip 10_1 is stopped. Further, at time t18a, the read operation (2) in the memory chip 10_1 ends.

In the read operations (1) and (2) described above, the switch circuit S2 in the memory chip 10_3 is set to the disconnected state in order to prevent the current due to the assist operation from entering the memory chip 10_3.

In the operation illustrated in FIG. 15, from time t11a to time t12a, the charge pump CP0 in the memory chips 10_1 and 10_2 does not execute an assist operation, but the charge pump CP0 in the memory chips 10_1 and 10_2 may execute an assist operation. Similarly, from time t13a to time t14a, the charge pump CP0 in the memory chip 10_2 may execute an assist operation.

1.2.3 Control of Voltage Step-Up Module 17A by Memory Controller 20

Next, an example of controlling the voltage step-up module 17A of the memory chip by the memory controller 20 will be described. The memory controller 20 controls the voltage step-up modules 17A_0 to 17A_3 of the memory chips 10_0 to 10_3 during a read operation or a write operation.

1.2.3.1 Assist Operation Control (1) During Read Operation

The memory controller 20 controls the voltage step-up modules 17A_0 to 17A_3 of the memory chips 10_0 to 10_3 during a read operation. The memory controller 20 checks the status of the memory chips 10_0 to 10_3, and controls the voltage step-up operation and the assist operation by the voltage step-up modules 17A_0 to 17A_3 based on the checked status.

Figure 18:
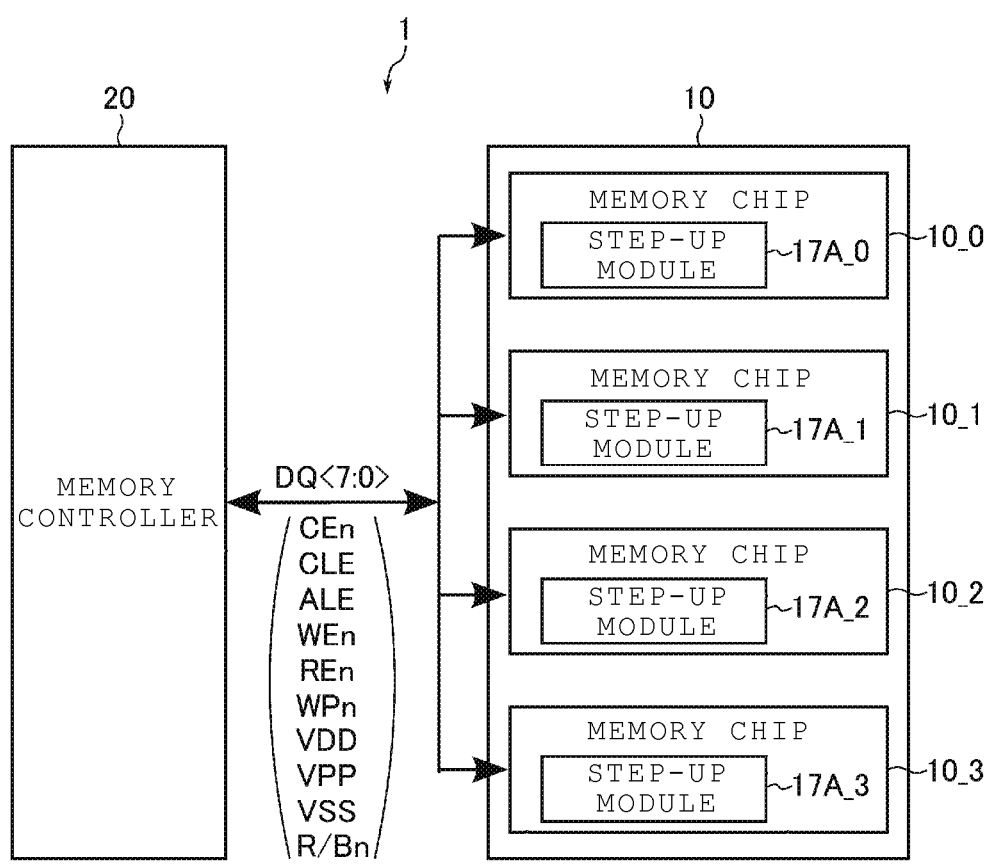
FIG. 18 is a diagram illustrating the exchange of signals between the memory controller and the memory chip in the first embodiment.
Figure 19:
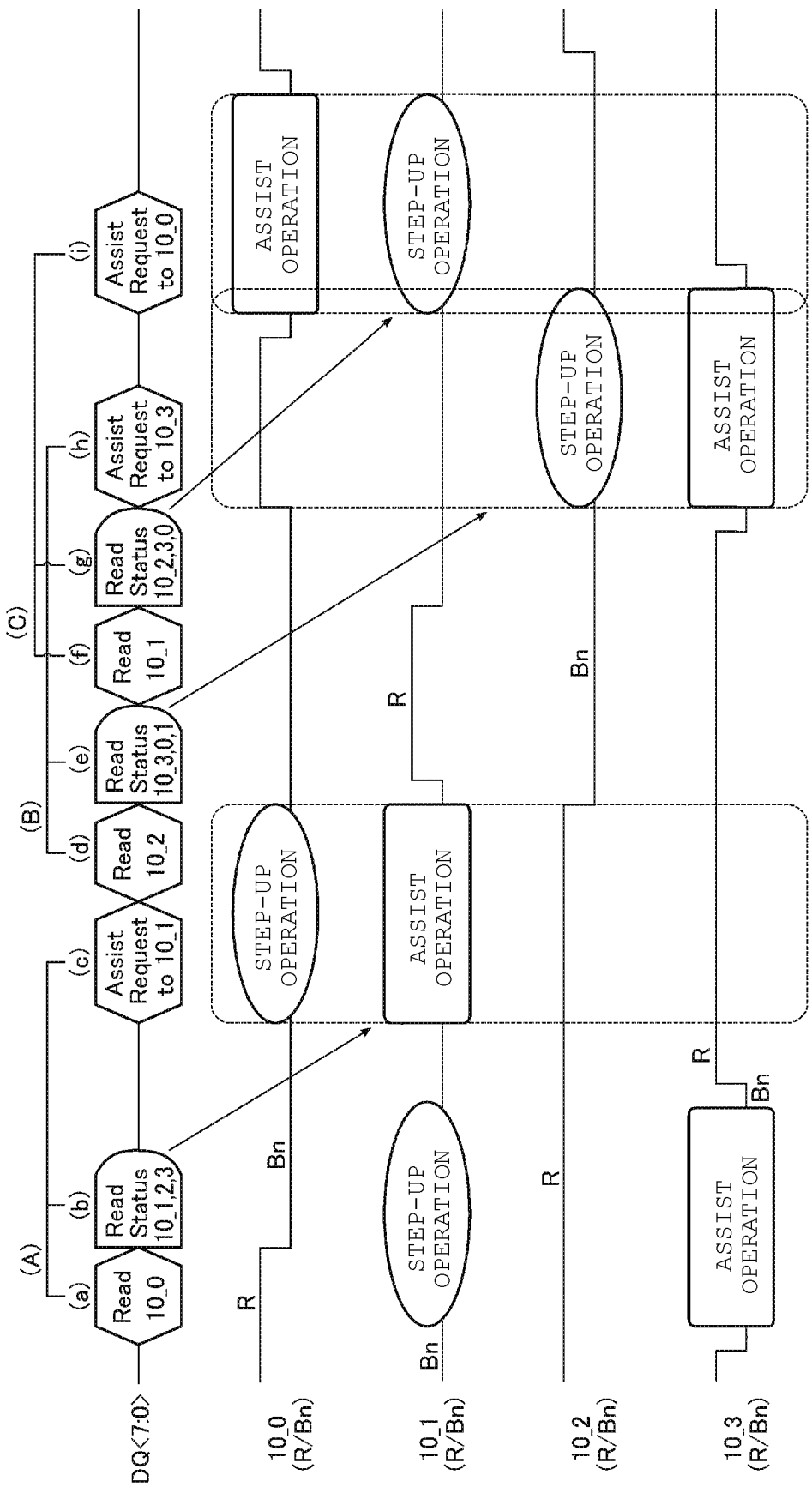
FIG. 19 is a timing chart illustrating an operation of a signal output from the memory controller and an operation of the memory chip in the first embodiment.

FIG. 18 is a diagram illustrating the exchange of signals between the memory controller 20 and the memory chips 10_0 to 10_3. FIG. 19 is a timing chart illustrating the signals output from the memory controller 20 and the operation of the memory chips 10_0 to 10_3.

As illustrated in FIG. 18, the memory controller 20 uses the I/O signal DQ to transmit signals for controlling the semiconductor storage device 10, such as various commands, addresses, and data, to the semiconductor storage device 10. Further, the memory controller 20 receives data or the like from the semiconductor storage device 10 by using the I/O signal DQ.

The memory controller 20 also checks whether the memory chips 10_0 to 10_3 are in the ready state or the busy state by the ready/busy signals R/Bn output from the memory chips 10_0 to 10_3. In FIG. 19, when the signal from each of the memory chips 10_0 to 10_3 is R, it indicates that the memory chip is in the ready state, and when the signal from each of the memory chips 10_0 to 10_3 is Bn, it indicates that the memory chip is in the busy state.

In the example illustrated in FIG. 19, a read operation (A) is performed in the memory chip 10_0, then a read operation (B) is performed in the memory chip 10_2, and further, a read operation (C) is performed in the memory chip 10_1.

The control of the voltage step-up operation and the assist operation of the voltage step-up modules 17A_0 to 17A_3 by the memory controller 20 will be described below.

First, as illustrated in (a) of FIG. 19, the memory controller 20 transmits a read command and an address for instructing a read operation to the memory chip 10_0.

Subsequently, as illustrated in (b) of FIG. 19, the memory controller 20 transmits a read status command for checking the status of the memory chips 10_1 to 10_3 to the memory chips 10_1 to 10_3 excluding the memory chips 10_0.

Next, as illustrated in (c) of FIG. 19, the memory controller 20 transmits a command for instructing the assist operation to the memory chips available for an assist operation based on the status returned from the memory chips 10_1 to 10_3. For example, here, the memory controller 20 verifies that the memory chip 10_1 is a memory chip that is available for an assist operation based on the status returned from the memory chip 10_1. Then, the memory controller 20 transmits an assist request command for instructing an assist operation to the memory chip 10_1.

More specifically, the memory controller 20 checks whether or not the memory chips 10_1 to 10_3 are executing a voltage step-up operation (including hold operation) or an assist operation in the period during which the memory chips 10_0 perform a voltage step-up operation based on the status returned from the memory chips 10_1 to 10_3. For example, when the memory controller 20 verifies that the memory chip 10_1 is not performing a voltage step-up operation or an assist operation in the period during which the memory chip 10_0 performs a voltage step-up operation, an assist request command for instructing an assist operation is transmitted to the memory chip 10_1 assuming that the memory chip 10_1 is available for an assist operation.

More specifically, the memory controller 20 checks the state of a timer in the memory chips 10_1 to 10_3 that manages the sequences of the sequencers 16 of the memory chips 10_1 to 10_3. Here, the timer includes information indicating whether or not the voltage step-up modules 17A_1 to 17A_3 are executing a voltage step-up operation and an assist operation at the time of the check or thereafter. The memory controller 20 checks whether or not the voltage step-up modules 17A_1 to 17A_3 of the memory chips 10_1 to 10_3 are available for an operation in the period during which the memory chip 10_0 performs a voltage step-up operation based on the timer. For example, when it is verified that the voltage step-up module 17A_1 of the memory chip 10_1 is available for the assist operation, the memory controller 20 transmits an assist request command for instructing an assist operation to the memory chip 10_1.

It is also possible to check the status of the voltage step-up modules 17A_1 to 17A_3 of the memory chips 10_1 to 10_3 by the following method. Each of the voltage step-up modules 17A_1 to 17A_3 of the memory chips 10_1 to 10_3 may include a timer indicating its operation status (including an operation end time). In this case, the memory controller 20 checks the timers of the voltage step-up modules 17A_1 to 17A_3. Then, based on the operation status indicated by the timer, for example, when it is verified that the voltage step-up module 17A_1 of the memory chip 10_1 is available for the assist operation, the memory controller 20 transmits an assist request command for instructing an assist operation to the memory chip 10_1. Alternatively, when it is verified that the voltage step-up module 17A_1 of the memory chip 10_1 is available for the assist operation after a predetermined time elapses based on the operation status indicated by the timer, the memory controller 20 transmits an assist request command for instructing an assist operation to the memory chip 10_1 after the predetermined time.

Figure 20:
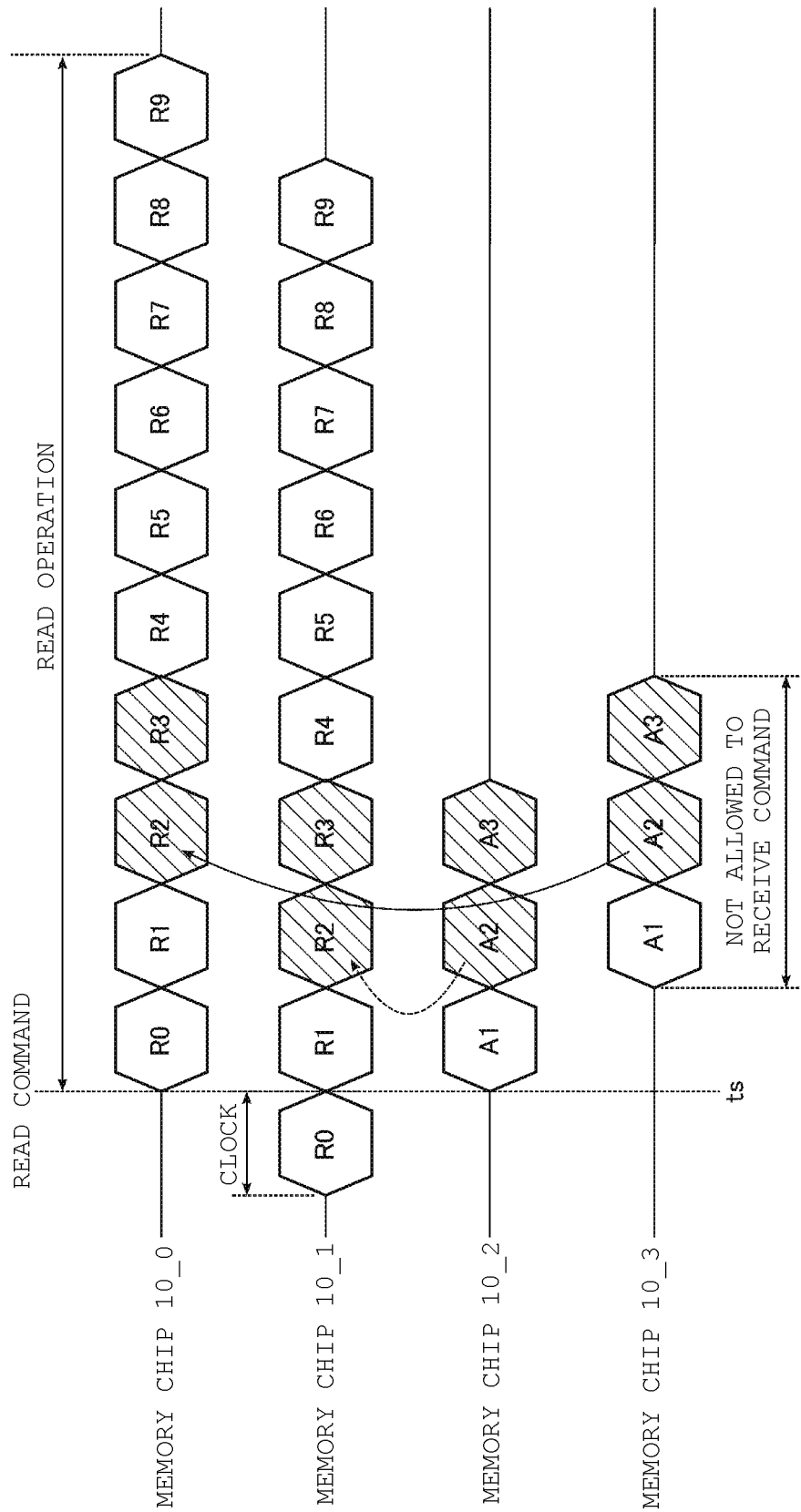
FIG. 20 is a diagram illustrating a state of a timer provided in the memory controller during a read operation in the first embodiment.

It is also possible to check the status of the voltage step-up modules 17A_1 to 17A_3 of the memory chips 10_1 to 10_3 by the following other methods. The memory controller 20 manages the status of the voltage step-up modules 17A_1 to 17A_3 of the memory chips 10_1 to 10_3. FIG. 20 is a diagram illustrating the state of a timer provided in the memory controller 20 during a read operation. For example, a period of the read operation is divided into regions R0 to R9. Here, the regions R2 and R3 are defined as a voltage step-up operation period. In the memory chip that executes an assist operation, assist operation regions A1, A2, and A3 are allocated at the time regions R1, R2, and R3 are allocated to the memory chip executing the read operation, respectively. The assist operation is actually performed in the regions A2 and A3 as illustrated by arrows. The region A1 is added to recognize that the memory chip has been allocated for the assist operation at that time.

In FIG. 20, for example, a read command is issued to the memory chip 10_0 at time ts. In response to the read command to the memory chip 10_0, the region R0 is allocated to the memory chip 10_0. The region R1 and region A1 are added to the memory chips 10_1 and 10_2, respectively, at time ts when the read command is issued to the memory chip 10_0. This is because a read command was issued to the memory chip 10_1 one clock cycle before the time ts.

The region R1 is allocated to the memory chip 10_0 and a read status command for checking the status of the memory chips 10_1 to 10_3 is issued one clock cycle after time ts. For example, when other memory chips are in the states of the regions R1 and R2 and the regions A1 and A2 at the time the memory chip is executing the read operation in region R1, the other memory chips cannot perform an assist operation during the voltage step-up operation period (regions R2 and R3) of the memory chip executing the read operation. In FIG. 20, the memory chips 10_1 and 10_2 cannot perform the assist operation for the memory chip 10_0.

Here, it is determined that the memory chip 10_3 can assist the voltage step-up operation of the memory chip 10_0, and the region A1 is allocated to the memory chip 10_3 one clock cycle after time ts.

Subsequently, two and three clock cycles after time ts, the regions R2 and R3 are allocated to the memory chip 10_0, and a voltage step-up operation is executed. At this time, the regions A2 and A3 are allocated to the memory chip 10_3, and the assist operation is executed in the memory chip 10_3.

The period during which the regions A1, A2, and A3 are allocated to the memory chip is the period during which the memory chip cannot receive commands.

Although not illustrated, it is assumed as an example that the memory chip 10_2 receives a read command and the region R0 is allocated at the time the region R5 is allocated to the memory chip 10_0. The memory chip 10_3 is available to perform the assist operation because it is in an idle state. In addition, the memory chip 10_0 is in the region R7 after 2 clock cycles (at which time the voltage step-up operation will be executed in the memory chip 10_2), and the memory chip 10_1 is in the region R8 after 2 clock cycles. Therefore, it is determined that the memory chips 10_0 and 10_1 will also be available for the assist operation.

Next, the description is continued by returning to FIG. 19. Thereafter, the charge pumps CP0 to CP3 in the voltage step-up module 17A_0 of the memory chip 10_0 perform a voltage step-up operation to generate the voltage VREAD. In parallel with this, the charge pumps CP1 to CP3 in the voltage step-up module 17A_1 of the memory chip 10_1 perform an assist operation to assist the voltage step-up operation in the voltage step-up module 17A_0 of the memory chip 10_0. Thereafter, when the non-selected word line in the memory chip 10_0 reaches the voltage VREAD, data is read from the memory cell transistor MT to be read in the memory chip 10_0.

Next, as illustrated in (d) of FIG. 19, the memory controller 20 transmits a read command and an address for instructing a read operation to the memory chip 10_2.

Subsequently, as illustrated in (e) of FIG. 19, the memory controller 20 transmits a read status command for checking the status of the memory chips 10_3, 10_0, and 10_1 to the memory chips 10_3, 10_0, and 10_1 excluding the memory chip 10_2.

Next, as illustrated in (f) of FIG. 19, the memory controller 20 transmits a read command and an address for instructing a read operation to the memory chip 10_1.

Subsequently, as illustrated in (g) of FIG. 19, the memory controller 20 transmits a read status command for checking the status of the memory chips 10_2, 10_3, and 10_0 to the memory chips 10_2, 10_3, and 10_0 excluding the memory chip 10_1.

Next, as illustrated in (h) of FIG. 19, the memory controller 20 transmits a command for instructing an assist operation to the memory chip available for an assist operation based on the status returned from the memory chips 10_3, 10_0, and 10_1. For example, here, the memory controller 20 verifies that the memory chip 10_3 is a memory chip that is available for an assist operation based on the status returned from the memory chip 10_3. Then, the memory controller 20 transmits an assist request command for instructing an assist operation to the memory chip 10_3.

Thereafter, the charge pumps CP0 to CP3 in the voltage step-up module 17A_2 of the memory chip 10_2 perform a voltage step-up operation to generate the voltage VREAD. In parallel with this, the charge pumps CP1 to CP3 in the voltage step-up module 17A_3 of the memory chip 10_3 perform an assist operation to assist the voltage step-up operation in the voltage step-up module 17A_2 of the memory chip 10_2. Thereafter, when the non-selected word line in the memory chip 10_2 reaches the voltage VREAD, data is read from the memory cell transistor MT to be read in the memory chip 10_2.

Next, as illustrated in (i) of FIG. 19, the memory controller 20 transmits a command for instructing an assist operation to the memory chip available for an assist operation based on the status returned from the memory chips 10_2, 10_3, and 10_0. For example, here, the memory controller 20 verifies that the memory chip 10_0 is stopping the voltage step-up operation or the assist operation and the memory chips 10_2 and 10_3 are performing a voltage step-up operation and an assist operation, respectively, based on the status returned from the memory chips 10_2, 10_3, and 10_0. Then, the memory controller 20 determines that the memory chip 10_0 is available for an assist operation, but the memory chips 10_2 and 10_3 are not available for an assist operation, and transmits an assist request command for instructing an assist operation only to the memory chip 10_0.

Thereafter, the charge pumps CP0 to CP3 in the voltage step-up module 17A_1 of the memory chip 10_1 perform a voltage step-up operation to generate the voltage VREAD. In parallel with this, the charge pumps CP1 to CP3 in the voltage step-up module 17A_0 of the memory chip 10_0 perform an assist operation to assist the voltage step-up operation in the voltage step-up module 17A_1 of the memory chip 10_1. Thereafter, when the non-selected word line in the memory chip 10_1 reaches the voltage VREAD, data is read from the memory cell to be read in the memory chip 10_1.

1.2.3.2 Assist Operation Control (2) During Read Operation

The memory controller 20 manages the status of the memory chips 10_0 to 10_3 at all times or at regular time intervals. The memory controller 20 transmits, for example, a set feature command to the memory chips 10_0 to 10_3, and executes an assist operation control (2). The memory controller 20 grasps the status of the memory chips 10_0 to 10_3. The status is operation information including whether or not the voltage step-up modules 17A_0 to 17A_3 of the memory chips 10_0 to 10_3 are currently executing a voltage step-up operation and an assist operation, and the execution schedule of the voltage step-up operation and the assist operation. The memory 22 in the memory controller 20 stores the status of the memory chips 10_0 to 10_3 managed by the memory controller 20. The memory controller 20 controls the voltage step-up operation and the assist operation by the voltage step-up modules 17A_0 to 17A_3 based on the status stored in the memory 22, that is, the operation information of the voltage step-up operation and the assist operation in the memory chips 10_0 to 10_3.

In the assist operation control (2), since the memory controller 20 always knows the status of the memory chips 10_0 to 10_3, it is not necessary to transmit a command for checking the status of memory chips 10_0 to 10_3 to the memory chips 10_0 to 10_3 every time a read command is transmitted. Other input signals other than the command for checking the status, and the voltage step-up operation and assist operation by the voltage step-up modules 17A_0 to 17A_3 are the same as those in the assist operation control (1) described above.

Figure 21:
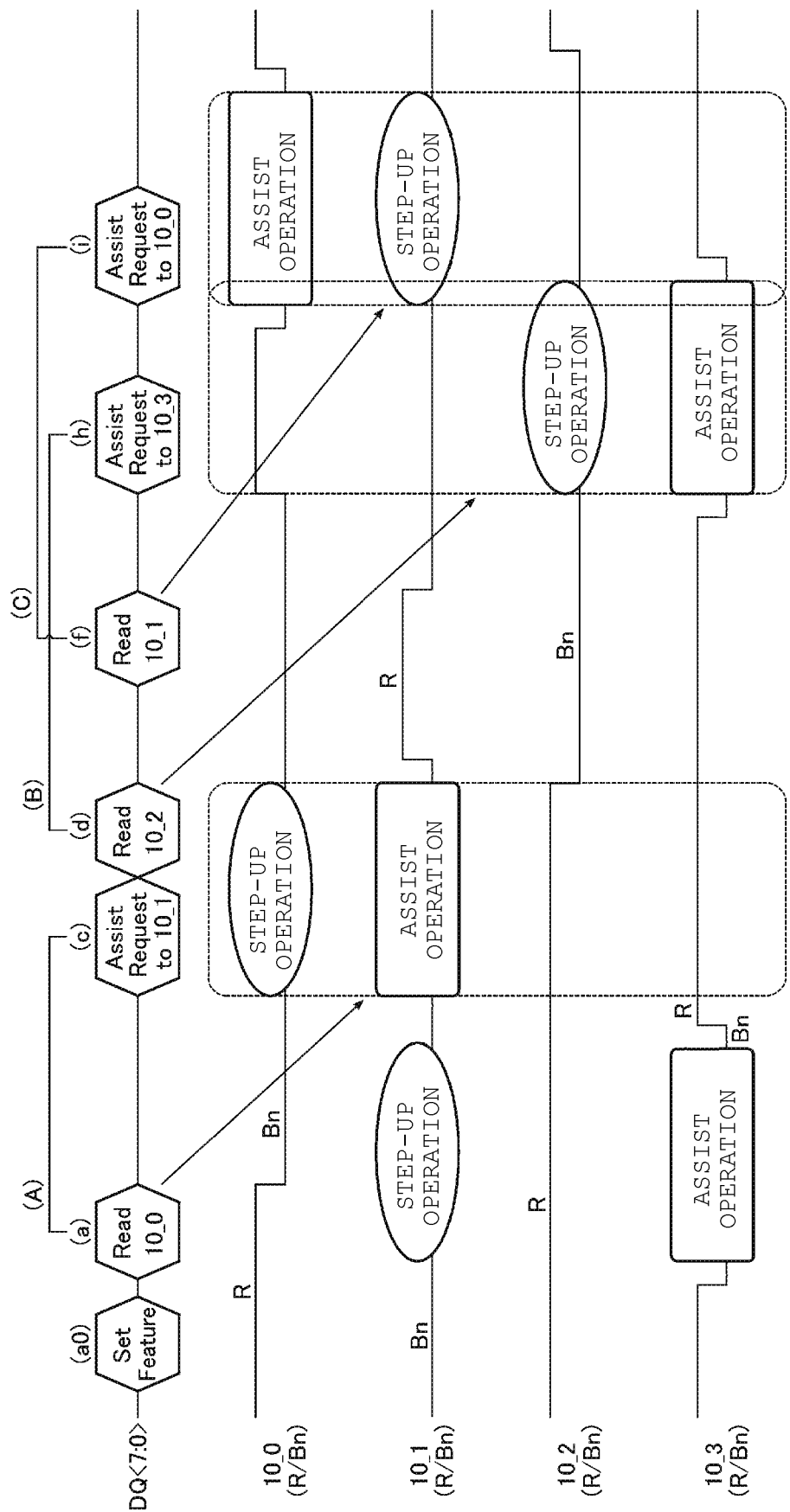
FIG. 21 is a timing chart illustrating the operation of the signal output from the memory controller and the operation of the memory chip in the first embodiment.

FIG. 21 is a timing chart illustrating the signals output from the memory controller 20 and the operation of the memory chips 10_0 to 10_3.

In the example illustrated in FIG. 21, the read operation (A) is performed in the memory chip 10_0, then a read operation (B) is performed in the memory chip 10_2, and further, a read operation (C) is performed in the memory chip 10_1.

The control of the voltage step-up operation and the assist operation of the voltage step-up modules 17A_0 to 17A_3 by the memory controller 20 will be described below.

First, as illustrated in (a0) of FIG. 21, the memory controller 20 transmits a set feature command for instructing the execution of the assist operation control (2) to the memory chips 10_0 to 10_3. Upon receiving a set feature command, each of the memory chips 10_0 to 10_3 transmits a status to the memory controller 20 at regular time intervals. As a result, the memory controller 20 grasps the status of the memory chips 10_0 to 10_3. As described above, the status is operation information related to the voltage step-up operation and the assist operation of the voltage step-up modules 17A_0 to 17A_3 of the memory chips 10_0 to 10_3.

Subsequently, as illustrated in (a) of FIG. 21, the memory controller 20 transmits a read command and an address for instructing a read operation to the memory chip 10_0.

Next, as illustrated in (c) of FIG. 21, the memory controller 20 transmits a command for instructing an assist operation to the memory chip available for an assist operation based on the status stored in the memory 22. For example, here, the memory controller 20 verifies that the memory chip 10_1 is a memory chip that is available for an assist operation based on the status stored in the memory 22. Then, the memory controller 20 transmits an assist request command for instructing an assist operation to the memory chip 10_1.

Thereafter, the charge pumps CP0 to CP3 in the voltage step-up module 17A_0 of the memory chip 10_0 perform a voltage step-up operation to generate the voltage VREAD. In parallel with this, the charge pumps CP1 to CP3 in the voltage step-up module 17A_1 of the memory chip 10_1 perform an assist operation to assist the voltage step-up operation in the voltage step-up module 17A_0 of the memory chip 10_0. Thereafter, when the non-selected word line in the memory chip 10_0 reaches the voltage VREAD, data is read from the memory cell to be read in the memory chip 10_0.

Next, as illustrated in (d) of FIG. 21, the memory controller 20 transmits a read command and an address for instructing a read operation to the memory chip 10_2.

Next, as illustrated in (f) of FIG. 21, the memory controller 20 transmits a read command and an address for instructing a read operation to the memory chip 10_1.

Next, as illustrated in (h) of FIG. 21, the memory controller 20 transmits a command for instructing an assist operation to the memory chip available for an assist operation based on the status stored in the memory 22. For example, here, the memory controller 20 verifies that the memory chip 10_3 is a memory chip that is available for an assist operation based on the status stored in the memory 22. Then, the memory controller 20 transmits an assist request command for instructing an assist operation to the memory chip 10_3.

Thereafter, the charge pumps CP0 to CP3 in the voltage step-up module 17A_2 of the memory chip 10_2 perform a voltage step-up operation to generate the voltage VREAD. In parallel with this, the charge pumps CP1 to CP3 in the voltage step-up module 17A_3 of the memory chip 10_3 perform an assist operation to assist the voltage step-up operation in the voltage step-up module 17A_2 of the memory chip 10_2. Thereafter, when the non-selected word line in the memory chip 10_2 reaches the voltage VREAD, data is read from the memory cell to be read in the memory chip 10_2.

Next, as illustrated in (i) of FIG. 21, the memory controller 20 transmits a command for instructing an assist operation to the memory chip available for an assist operation based on the status stored in the memory 22. For example, here, the memory controller 20 verifies that the memory chip 10_0 is a memory chip that is available for an assist operation based on the status stored in the memory 22. Then, the memory controller 20 transmits an assist request command for instructing an assist operation to the memory chip 10_0.

Thereafter, the charge pumps CP0 to CP3 in the voltage step-up module 17A_1 of the memory chip 10_1 perform a voltage step-up operation to generate the voltage VREAD. In parallel with this, the charge pumps CP1 to CP3 in the voltage step-up module 17A_0 of the memory chip 10_0 perform an assist operation to assist the voltage step-up operation in the voltage step-up module 17A_1 of the memory chip 10_1. Thereafter, when the non-selected word line in the memory chip 10_1 reaches the voltage VREAD, data is read from the memory cell to be read in the memory chip 10_1.

1.2.3.3 Assist Operation Control During Write Operation

The write operation includes a program operation and a program verify operation. The program operation is an operation of injecting charges into the charge storage layer 41 of the memory cell transistor MT to raise the threshold voltage of the memory cell transistor by applying the write voltage VPGM to the gate electrode of the memory cell transistor MT. In the program operation, for example, the write voltage VPGM is applied to the selected word line, and the voltage VPASS is applied to the non-selected word line.

The program verify operation is a read operation for verifying whether or not the threshold voltage of the memory cell transistor MT generated by applying a write voltage reaches a target voltage. In the program verify operation, for example, a program verify voltage VPV is applied to the selected word line, and the voltage VREAD is applied to the non-selected word line.

In a write operation, the program operation and the program verify operation are combined into one write loop, and the write loop is repeated until the verification by the program verify operation is passed. Specifically, in the verification by the program verify operation after the program operation, when the threshold voltage of the memory cell transistor does not reach a predetermined threshold voltage, that is, when the verification fails, the write voltage VPGM is increased by a constant voltage ΔV, the program operation is executed again, and the program verify operation is further executed. Then, the write loop is repeated until the verification is passed.

Figure 22:
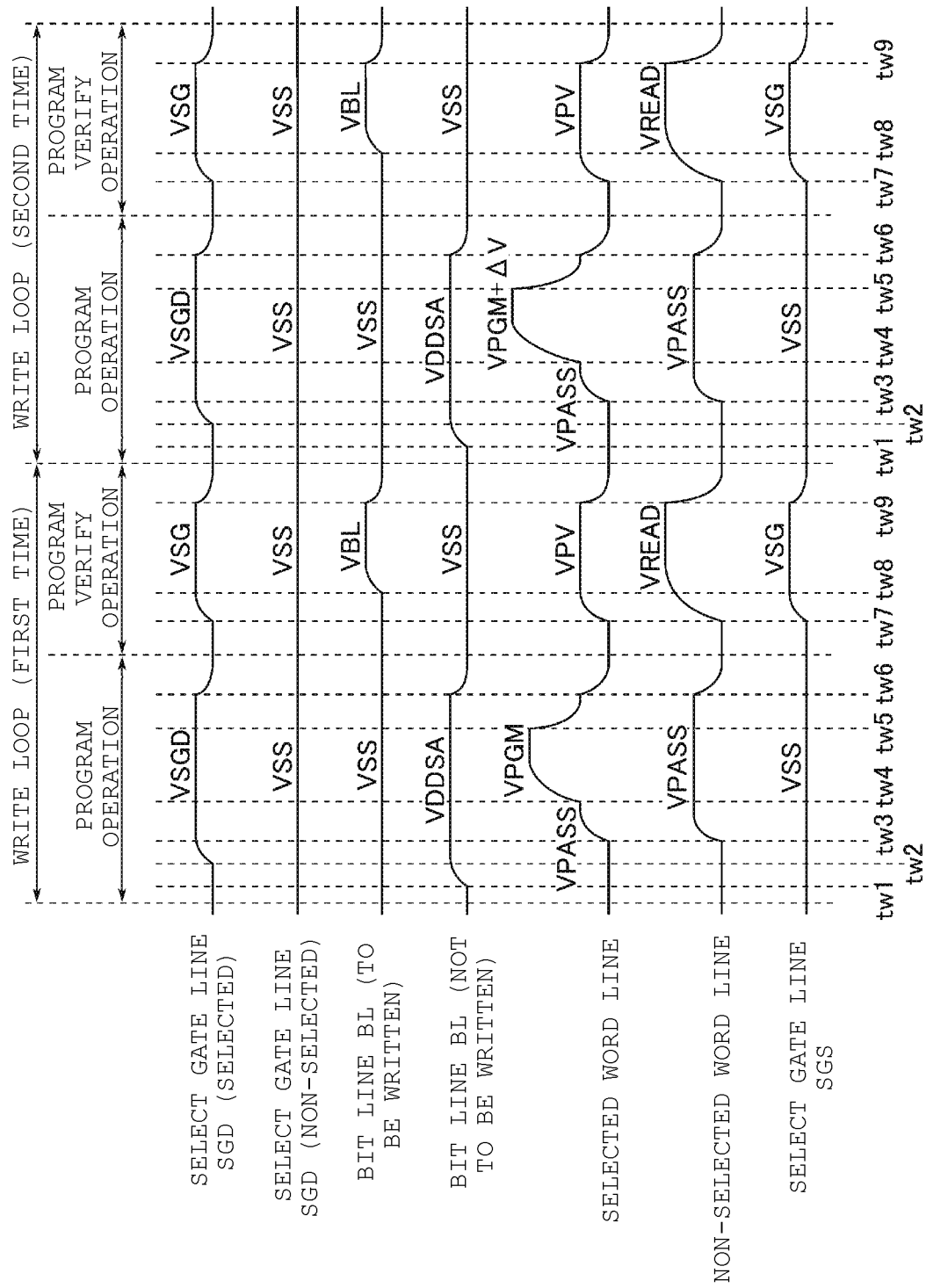
FIG. 22 is a timing chart of a voltage applied to a signal line during a write operation in the first embodiment.

The outline of a write operation including a program operation and a program verify operation will be described with reference to FIG. 22. FIG. 22 is a timing chart of the voltage applied to the selected word line, the non-selected word line, the select gate line SGD and SGS, and the bit line BL during a write operation.

First, a program operation is executed.

At time tw1, the sense amplifier 29 applies a voltage VDDSA to the bit line BL connected to the memory cell transistor MT not to be written (or write-protected, non-selected). Further, the sense amplifier 29 supplies the voltage VSS to the bit line BL connected to the memory cell transistor MT to be written (or selected). The voltage VDDSA is a voltage at which the select transistor ST1 is turned off when a voltage VSGD is applied to the selected select gate line SGD.

Next, at time tw2, the row decoder 19 applies the voltage VSGD to the selected select gate line SGD and also supplies the voltage VSS to the non-selected select gate line SGD. The voltage VSGD is a voltage higher than the voltage VSS.

Next, at time tw3, the row decoder 19 applies the voltage VPASS to the selected word line and the non-selected word line.

Subsequently, at time two, the row decoder 19 applies the write voltage VPGM (for example, 14 to 20 V) to the selected word line. The write voltage VPGM is a voltage for injecting electrons into the charge storage layer 41 of the memory cell transistor MT to be written. The write voltage VPGM is higher than the voltage VPASS. By applying the write voltage VPGM, electrons are injected into the charge storage layer 41 of the memory cell transistor MT to be written connected to the selected word line, and writing is performed. Further, in the memory cell transistor MT of the selected word line not to be written, the channel voltage of the memory cell transistor is boosted, that is, the channel voltage rises, and almost no charge is injected into the charge storage layer 41.

Next, at time tw5, the row decoder 19 reduces the voltage applied to the selected word line from the write voltage VPGM to the voltage VPASS.

Then, at time tw6, the voltage VSS is supplied to the selected word line, the non-selected word line, the select gate line SGD and SGS, and the bit line BL. With the above, the program operation ends.

Next, a program verify operation is executed.

At time tw7, the row decoder 19 applies the voltage VSG to the selected select gate line SGD and select gate line SGS. The row decoder 19 applies the voltage VSS to the non-selected select gate line SGD. The voltage VSG is a voltage that turns on the select transistors ST1 and ST2 corresponding to the selected string unit SU. As a result, the select transistors ST1 and ST2 of the selected string unit SU are turned on, and the select transistor ST1 of the non-selected string unit SU is turned off.

Further, at time tw7, the row decoder 19 applies the verify voltage VPV to the selected word line and the voltage VREAD to the non-selected word line. The verify voltage VPV is a voltage set according to write data. As described above, the voltage VREAD is a voltage that turns on the memory cell transistor MT regardless of the threshold voltage of the memory cell transistor MT, and VREAD>VPV. For example, when the threshold voltage of the memory cell transistor MT to be written is higher than the voltage VPV, the memory cell transistor MT is turned off, and when the threshold voltage is equal to or less than the voltage VPV, the memory cell transistor MT is turned on.

Next, at time tw8, the sense amplifier 29 sets the voltage of the bit line BL connected to the memory cell transistor MT to be written to the voltage VBL. The voltage VBL is, for example, a voltage lower than the voltage VPV (VPV>VBL). Further, the sense amplifier 29 sets the voltage of the bit line BL connected to the memory cell transistor MT not to be written to the voltage VSS.

Then, at time tw9, the row decoder 19 applies the voltage VSS to the selected word line, the non-selected word line, the select gate line SGD, and the select gate line SGS. Further, the sense amplifier 29 applies the voltage VSS to the bit line BL.

By the above operation, data is read from the memory cell transistor MT connected to the selected word line of the selected string unit. When the read data passes the verification, the write operation ends. On the other hand, when the read data fails in the verification, the write voltage VPGM is increased by the voltage ΔV, and a write loop including a program operation and a program verify operation is repeated until the verification is passed.

FIG. 22 is an example of the timing chart of a write operation of the present embodiment. The magnitude relationship of the voltage applied to each of the word line WL, the select gate lines SGD and SGS, and the bit line BL does not necessarily have to match the magnitude relationship of the voltages illustrated in FIG. 22.

The present embodiment can be applied not only to the generation of the voltage VREAD in a read operation described above, but also to the generation of the voltage VPASS in a program operation and the voltage VREAD in a program verify operation provided in a write operation. That is, the memory controller 20 checks the status of the memory chips 10_0 to 10_3 during the program operation and the program verify operation, and controls the voltage step-up operation and the assist operation by the voltage step-up modules 17A_0 to 17A_3 based on the checked status. The memory chips 10_0 to 10_3 cause the voltage step-up modules 17A_0 to 17A_3 to execute the voltage step-up operation and the assist operation according to the instruction received from the memory controller 20, and generate the voltage VPASS and the voltage VREAD.

Figure 23:
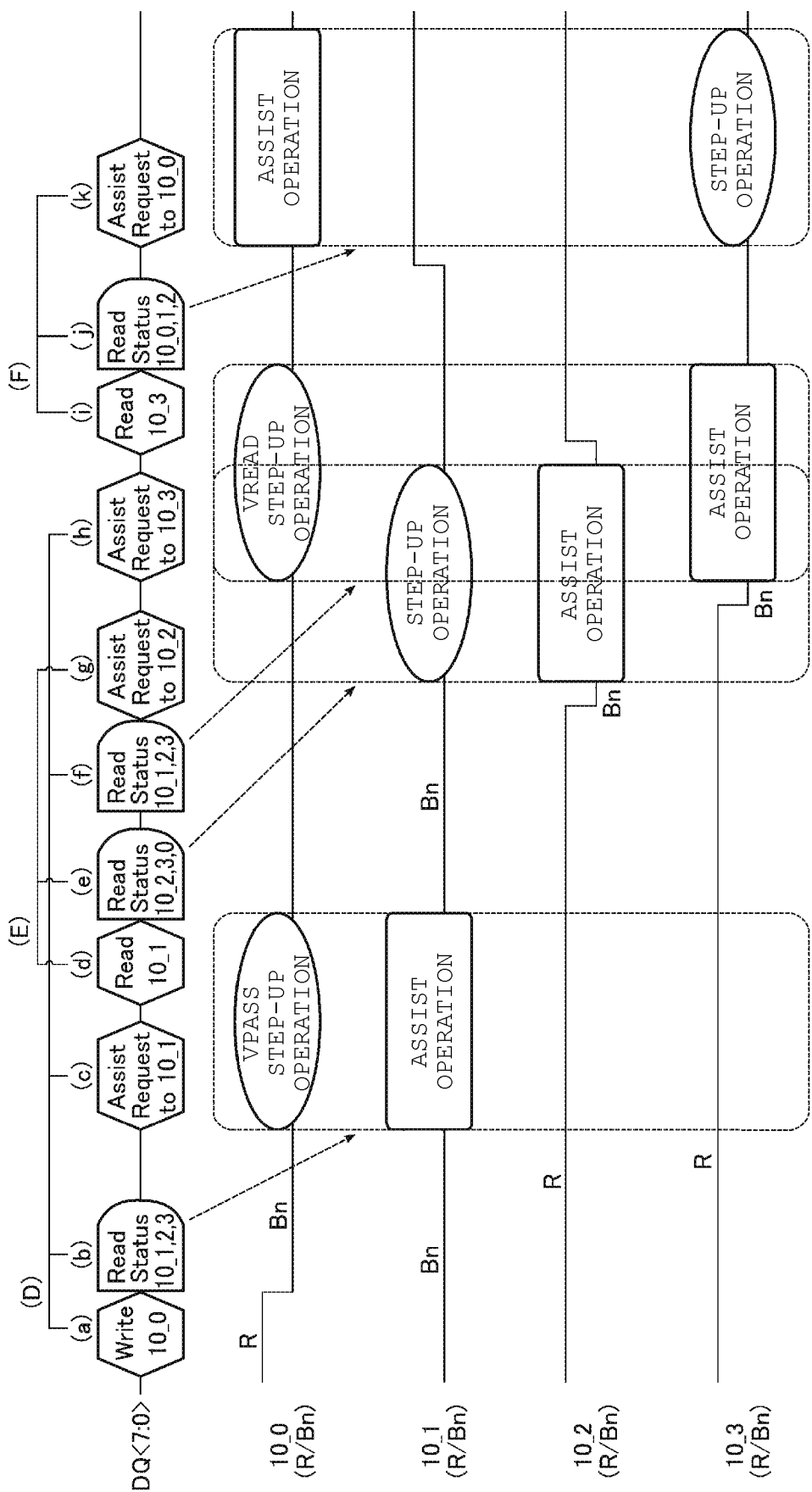
FIG. 23 is a timing chart illustrating the operation of the signal output from the memory controller and the operation of the memory chip in the first embodiment.

FIG. 23 is a timing chart illustrating the signals output from the memory controller 20 and the operation of the memory chips 10_0 to 10_3.

In the example illustrated in FIG. 23, the program operation and the program verify operation as a write operation (D) are performed in the memory chip 10_0, and a read operation (E) is performed in the memory chip 10_1 between the program operation and the program verify operation, and further, a read operation (F) is performed in the memory chip 10_3 after the program verify operation ends. Here, as the write operation (D), an example in which a write loop including a program operation and a program verify operation is executed only once is illustrated, but if the verification by the verify operation is not passed, the write loop is executed a plurality of times.

The control of the voltage step-up operation and the assist operation of the voltage step-up modules 17A_0 to 17A_3 by the memory controller 20 will be described below.

First, as illustrated in (a) of FIG. 23, the memory controller 20 transmits a write command and an address for instructing a write operation to the memory chip 10_0.

Subsequently, as illustrated in (b) of FIG. 23, the memory controller 20 transmits a read status command for checking the status of the memory chips 10_1 to 10_3 to the memory chips 10_1 to 10_3 excluding the memory chips 10_0.

Next, as illustrated in (c) of FIG. 23, the memory controller 20 transmits a command for instructing an assist operation to the memory chip available for an assist operation based on the status returned from the memory chips 10_1 to 10_3. For example, here, the memory controller 20 verifies that the memory chip 10_1 is a memory chip that is available for an assist operation based on the status returned from the memory chip 10_1. Then, the memory controller 20 transmits an assist request command for instructing an assist operation to the memory chip 10_1.

Thereafter, the charge pumps CP0 to CP3 in the voltage step-up module 17A_0 of the memory chip 10_0 perform a voltage step-up operation to generate the voltage VPASS. In parallel with this, the charge pumps CP1 to CP3 in the voltage step-up module 17A_1 of the memory chip 10_1 perform an assist operation to assist the voltage step-up operation in the voltage step-up module 17A_0 of the memory chip 10_0. Thereafter, when the non-selected word line in the memory chip 10_0 reaches the voltage VPASS, a program operation for writing data to the memory cell transistor MT to be written is performed in the memory chip 10_0. In the memory chip 10_0, a program verify operation is performed following the program operation. In this example, the read operation (E) is performed in the memory chip 10_1 prior to the program verify operation in the memory chip 10_0.

As illustrated in (d) of FIG. 23, the memory controller 20 transmits a read command and an address for instructing a read operation to the memory chip 10_1.

Subsequently, for the read operation of the memory chip 10_1, as illustrated in (e) of FIG. 23, the memory controller 20 transmits a read status command for checking the status of the memory chips 10_2, 10_3, and 10_0 to the memory chips 10_2, 10_3, and 10_0 excluding the memory chip 10_1.

Subsequently, for the program verify operation of the memory chip 10_0, as illustrated in (f) of FIG. 23, the memory controller 20 transmits a read status command for checking the status of the memory chips 10_1, 10_2, and 10_3 to the memory chips 10_1, 10_2, and 10_3 excluding the memory chip 10_0.

Next, for the read operation of the memory chip 10_1, as illustrated in (g) of FIG. 23, the memory controller 20 transmits a command for instructing an assist operation to the memory chip available for an assist operation based on the status returned from the memory chips 10_2, 10_3, and 10_0. For example, here, the memory controller 20 verifies that the memory chip 10_2 is a memory chip that is available for an assist operation based on the status returned from the memory chip 10_2. Then, the memory controller 20 transmits an assist request command for instructing an assist operation to the memory chip 10_2.

Thereafter, the charge pumps CP0 to CP3 in the voltage step-up module 17A_1 of the memory chip 10_1 perform a voltage step-up operation to generate the voltage VREAD. In parallel with this, the charge pumps CP1 to CP3 in the voltage step-up module 17A_2 of the memory chip 10_2 perform an assist operation to assist the voltage step-up operation in the voltage step-up module 17A_1 of the memory chip 10_1. Thereafter, when the non-selected word line in the memory chip 10_1 reaches the voltage VREAD, data is read from the memory cell transistor MT to be read in the memory chip 10_1.

Next, for the program verify operation of the memory chip 10_0, as illustrated in (h) of FIG. 23, the memory controller 20 transmits a command for instructing an assist operation to the memory chip available for an assist operation based on the status returned from the memory chips 10_1, 10_2, and 10_3. For example, here, the memory controller 20 verifies that the memory chip 10_3 is a memory chip that is available for an assist operation based on the status returned from the memory chip 10_3. Then, the memory controller 20 transmits an assist request command for instructing an assist operation to the memory chip 10_3.

Thereafter, the charge pumps CP0 to CP3 in the voltage step-up module 17A_0 of the memory chip 10_0 perform a voltage step-up operation to generate the voltage VREAD. In parallel with this, the charge pumps CP1 to CP3 in the voltage step-up module 17A_3 of the memory chip 10_3 perform an assist operation to assist the voltage step-up operation in the voltage step-up module 17A_0 of the memory chip 10_0. Thereafter, when the non-selected word line in the memory chip 10_0 reaches the voltage VREAD, data is read from the memory cell transistor MT to be written in the memory chip 10_0.

Next, for the read operation of the memory chip 10_3, as illustrated in (i) of FIG. 23, the memory controller 20 transmits a read command and an address for instructing a read operation to the memory chip 10_3.

Next, as illustrated in (j) of FIG. 23, the memory controller 20 transmits a read status command for checking the status of the memory chips 10_0, 10_1, and 10_2 to the memory chips 10_0, 10_1, and 10_2 excluding the memory chip 10_3.

Next, as illustrated in (k) of FIG. 23, the memory controller 20 transmits a command for instructing an assist operation to the memory chip available for an assist operation based on the status returned from the memory chips 10_0, 10_1, and 10_2. For example, here, the memory controller 20 verifies that the memory chip 10_0 is a memory chip that is available for an assist operation based on the status returned from the memory chip 10_0. Then, the memory controller 20 transmits an assist request command for instructing an assist operation to the memory chip 10_0.

Thereafter, the charge pumps CP0 to CP3 in the voltage step-up module 17A_3 of the memory chip 10_3 perform a voltage step-up operation to generate the voltage VREAD. In parallel with this, the charge pumps CP1 to CP3 in the voltage step-up module 17A_0 of the memory chip 10_0 perform an assist operation to assist the voltage step-up operation in the voltage step-up module 17A_3 of the memory chip 10_3. Thereafter, when the non-selected word line in the memory chip 10_3 reaches the voltage VREAD, data is read from the memory cell transistor MT to be read in the memory chip 10_3.

1.2.3.4 Assist Operation Control During Erasing Operation

The present embodiment can be applied not only to the generation of voltage VREAD in a read operation and the voltage VPASS in a write operation, but also to the generation of the voltage VERA in an erasing operation. The erasing operation is an operation of transitioning the threshold voltage of the memory cell transistor MT into the threshold voltage distribution of the state "Er" by recombining the electrons accumulated in the charge storage layer 41 of the memory cell transistor MT with the holes injected in the erasing operation to eliminate the electrons.

In an erasing operation, for example, the erase voltage VERA is applied to the source line SL. The source line SL is connected to the semiconductor layer 43 of a plurality of NAND strings NS arranged in the block BLK, and has a large load. The voltage step-up module 17A of the present embodiment can also be applied to supply the erase voltage VERA to the source line SL during an erasing operation.

Figure 24:
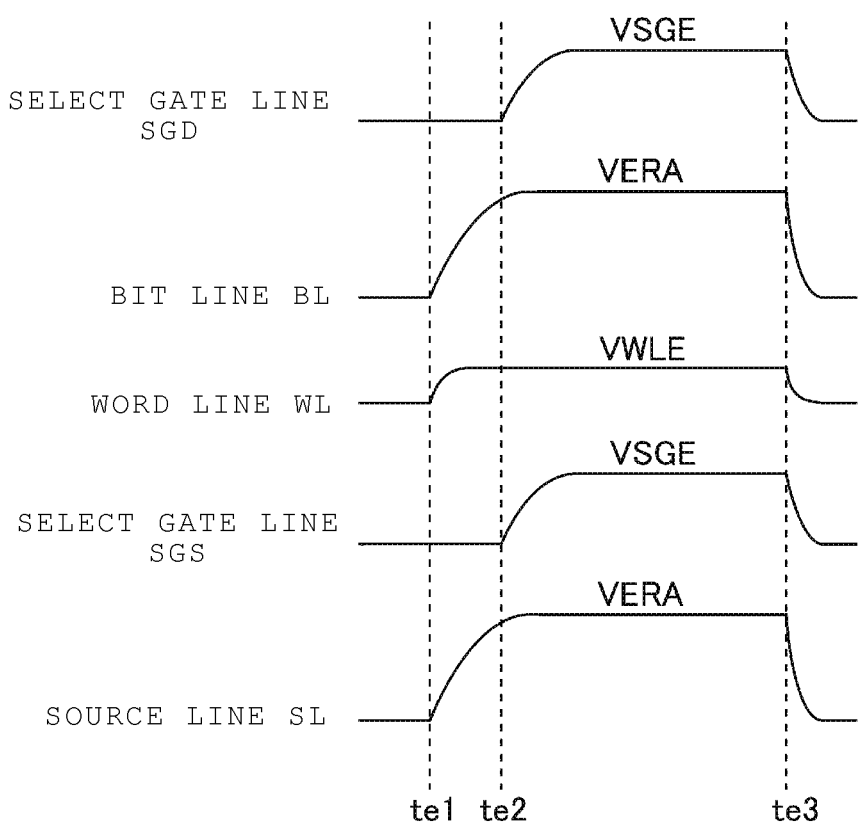
FIG. 24 is a timing chart of voltages applied to various signal lines during an erasing operation in the first embodiment.

The outline of an erasing operation will be described with reference to FIG. 24. FIG. 24 is a timing chart of the voltage applied to the word line WL, the select gate line SGD and SGS, the bit line BL, and the source line SL during an erasing operation.

At time te1, the driver 18 applies the erase voltage VERA to the source line SL. The sense amplifier 29 applies the erase voltage VERA to the bit line BL in the block BLK to be erased.

Further, the row decoder 19 applies a voltage VWLE to the word line WL in the block BLK to be erased. The voltage VWLE is, for example, a voltage equal to or higher than the voltage VSS and lower than the voltage VERA. The voltage VWLE is not limited to the above-mentioned voltage, and may be a voltage less than the voltage VSS.

Next, at time te2, the row decoder 19 applies a voltage VSGE to the select gate lines SGS and SGD in the block BLK to be erased. The voltage VSGE is higher than the voltage VWLE and lower than the voltage VERA.

With the above-mentioned voltage application, in the select transistor ST1 side of the NAND string NS, due to the voltage VERA applied to the bit line BL, a gate-induced drain leakage (GIDL) current flows from the bit line BL toward the select transistor ST1. Further, in the select transistor ST2 side of the NAND string NS, a GIDL current flows from the source line SL toward the select transistor ST2 due to the voltage VERA applied to the source line SL.

Due to the GIDL currents, the generated electrons of the paired electron-holes move to the source line SL and bit line BL outside the channel of the NAND string NS, and the holes move inside the channel of the NAND string NS. As a result, the holes generated in the channel of the NAND string NS raise the voltage of the channel, and the holes are injected into the charge storage layer 41. Then, by recombining the injected holes with the electrons injected into the charge storage layer 41 of the NAND string NS by a write operation or the like, the electrons are eliminated from the charge storage layer 41 of the memory cell transistor MT of the NAND string NS. As a result, the threshold voltage of the memory cell transistor MT of the NAND string decreases.

At time te3, the row decoder 19 applies the voltage VSS to the word line WL and the select gate lines SGS and SGD. The sense amplifier 29 applies the voltage VSS to the bit line BL. The driver 18 also applies the voltage VSS to the source line SL. With the above, the erasing operation ends.

The case where the voltage VSGE is applied to the select gate lines SGS and SGD at time te2 is described, but the present embodiment is not limited thereto. The voltage applied to each of the select gate lines SGS and SGD may be a voltage that allows the GIDL current to flow, and may be different voltages.

The present embodiment can also be applied to the generation of the voltage VERA in the above-mentioned erasing operation. That is, the memory controller 20 checks the status of the memory chips 10_0 to 10_3 during an erasing operation, and controls the voltage step-up operation and the assist operation by the voltage step-up modules 17A_0 to 17A_3 when the erase voltage VERA is stepped up based on the checked status. The memory chips 10_0 to 10_3 cause the voltage step-up modules 17A_0 to 17A_3 to execute the voltage step-up operation and the assist operation according to the instruction received from the memory controller 20, and generate the erase voltage VERA.

1.2.4 Control of Voltage Step-Up Module 17A by Memory Chip

Next, an example in which the voltage step-up modules 17A_0 to 17A_3 are mutually controlled between the memory chips 10_0 to 10_3 without being controlled by the memory controller 20 will be described. The memory chip that receives a read command from the memory controller 20 checks the status of the other memory chips, and controls the voltage step-up operation and the assist operation by the voltage step-up modules 17A_0 to 17A_3 based on the checked status.

Figure 25:
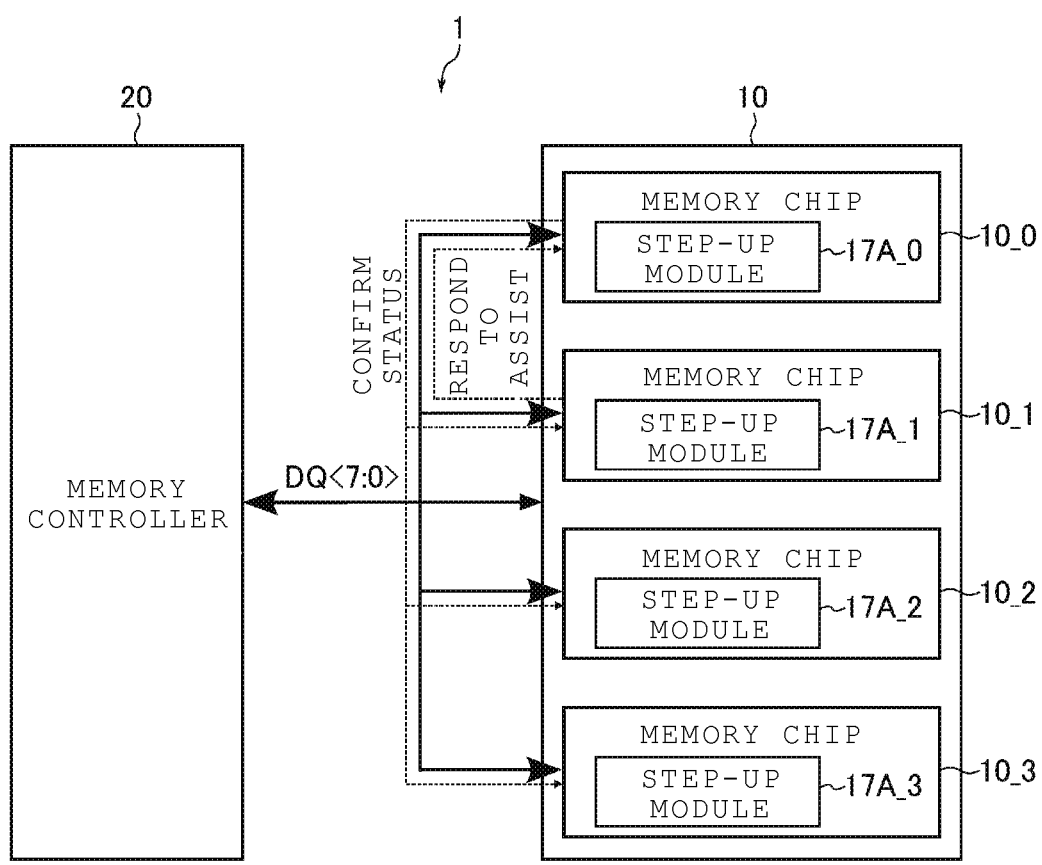
FIG. 25 is a diagram illustrating the exchange of signals between memory chips in the first embodiment.
Figure 26:
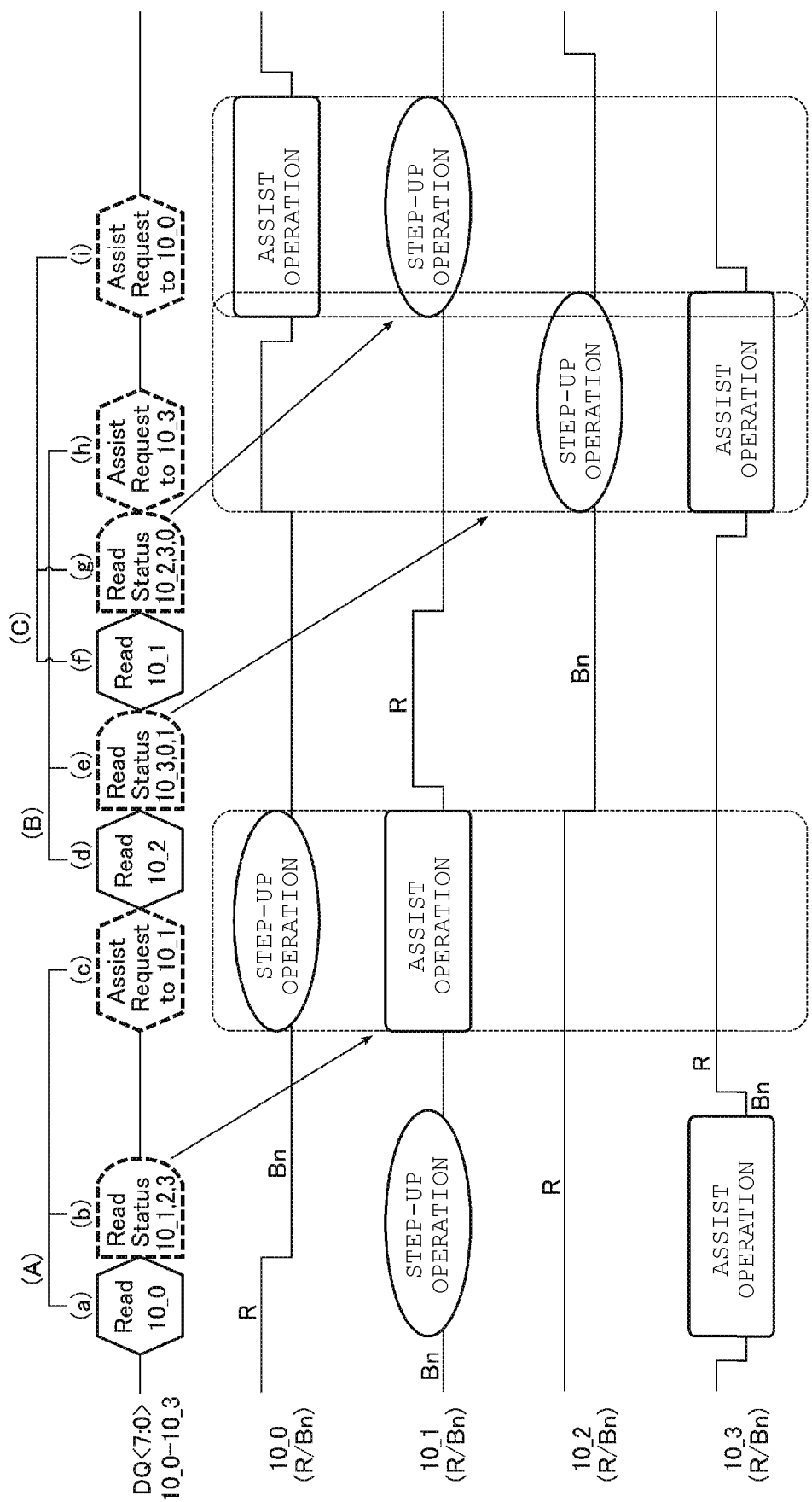
FIG. 26 is a timing chart illustrating a signal output from the memory controller and the memory chip and the operation of the memory chip in the first embodiment.

FIG. 25 is a diagram illustrating the exchange of signals between the memory chips 10_0 to 10_3. FIG. 25 illustrates the exchange of signals when the memory chip 10_0 receives a read command. FIG. 26 is a timing chart illustrating the signals output from the memory controller 20 and the memory chips 10_0 to 10_3 and the operation of the memory chips 10_0 to 10_3.

In the example illustrated in FIG. 26, the read operation (A) in the memory chip 10_0, the read operation (B) in the memory chip 10_2, and the read operation (C) in the memory chip 10_1 are performed in this order.

The control of the voltage step-up operation and the assist operation of the voltage step-up modules 17A_0 to 17A_3 by the memory chips 10_0 to 10_3 will be described below.

First, as illustrated in (a) of FIG. 26, the memory controller 20 transmits a read command and an address for instructing a read operation to the memory chip 10_0.

Upon receiving a read command, as illustrated in FIG. 25 and (b) of FIG. 26, the memory chip 10_0 transmits a read status command for checking the status of the memory chips 10_1 to 10_3 to the memory chips 10_1 to 10_3 excluding the memory chip 10_0. The status is operation information including whether or not the voltage step-up modules 17A_1 to 17A_3 of the memory chips 10_1 to 10_3 are currently executing a voltage step-up operation and an assist operation, and the execution schedule of the voltage step-up operation and the assist operation of the voltage step-up modules 17A_1 to 17A_3.

Subsequently, as illustrated in (c) of FIG. 26, the memory chip 10_0 transmits a command for instructing an assist operation to the memory chip available for an assist operation based on the status returned from the memory chips 10_1 to 10_3. For example, here, the memory chip 10_0 verifies that the memory chip 10_1 is a memory chip that is available for an assist operation based on the status returned from the memory chip 10_1 as illustrated in FIG. 25. Although it is not illustrated, the memory chip 10_0 also verifies that the memory chip 10_2 and 10_3 are available for an assist operation based on the status returned from the memory chip 10_2 and 10_3 respectively. Then, the memory chip 10_0 transmits an assist request command for instructing an assist operation to the memory chip 10_1.

Thereafter, the charge pumps CP0 to CP3 in the voltage step-up module 17A_0 of the memory chip 10_0 perform a voltage step-up operation to generate the voltage VREAD. In parallel with this, the charge pumps CP1 to CP3 in the voltage step-up module 17A_1 of the memory chip 10_1 perform an assist operation to assist the voltage step-up operation in the voltage step-up module 17A_0 of the memory chip 10_0. Thereafter, when the non-selected word line in the memory chip 10_0 reaches the voltage VREAD, data is read from the memory cell transistor MT to be read in the memory chip 10_0.

Next, as illustrated in (d) of FIG. 26, the memory controller 20 transmits a read command and an address for instructing a read operation to the memory chip 10_2.

Upon receiving a read command, as illustrated in (e) in FIG. 26, the memory chip 10_2 transmits a read status command for checking the status of the memory chips 10_3, 10_0, and 10_1 to the memory chips 10_3, 10_0, and 10_1 excluding the memory chip 10_2.

Next, as illustrated in (f) of FIG. 26, the memory controller 20 transmits a read command and an address for instructing a read operation to the memory chip 10_1.

Upon receiving a read command, as illustrated in (g) of FIG. 26, the memory chip 10_1 transmits a read status command for checking the status of the memory chips 10_2, 10_3, and 10_0 to the memory chips 10_2, 10_3, and 10_0 excluding the memory chip 10_1.

Subsequently, as illustrated in (h) of FIG. 26, the memory chip 10_2 transmits a command for instructing an assist operation to the memory chip available for an assist operation based on the status returned from the memory chips 10_3, 10_0, and 10_1. For example, here, the memory chip 10_2 verifies that the memory chip 10_3 is a memory chip that is available for an assist operation based on the status returned from the memory chip 10_3. Then, the memory chip 10_2 transmits an assist request command for instructing an assist operation to the memory chip 10_3.

Thereafter, the charge pumps CP0 to CP3 in the voltage step-up module 17A_2 of the memory chip 10_2 perform a voltage step-up operation to generate the voltage VREAD. In parallel with this, the charge pumps CP1 to CP3 in the voltage step-up module 17A_3 of the memory chip 10_3 perform an assist operation to assist the voltage step-up operation in the voltage step-up module 17A_2 of the memory chip 10_2. Thereafter, when the non-selected word line in the memory chip 10_2 reaches the voltage VREAD, data is read from the memory cell transistor MT to be read in the memory chip 10_2.

Subsequently, as illustrated in (i) of FIG. 26, the memory chip 10_1 transmits a command for instructing an assist operation to the memory chip available for an assist operation based on the status returned from the memory chips 10_2, 10_3, and 10_0. For example, here, the memory chip 10_1 verifies that the memory chip 10_0 is a memory chip that is available for an assist operation based on the status returned from the memory chip 10_0. Then, the memory chip 10_1 transmits an assist request command for instructing an assist operation to the memory chip 10_0.

Thereafter, the charge pumps CP0 to CP3 in the voltage step-up module 17A_1 of the memory chip 10_1 perform a voltage step-up operation to generate the voltage VREAD. In parallel with this, the charge pumps CP1 to CP3 in the voltage step-up module 17A_0 of the memory chip 10_0 perform an assist operation to assist the voltage step-up operation in the voltage step-up module 17A_1 of the memory chip 10_1. Thereafter, when the non-selected word line in the memory chip 10_1 reaches the voltage VREAD, data is read from the memory cell transistor MT to be read in the memory chip 10_1.

1.3 Effects of First Embodiment

According to the first embodiment, it is possible to provide a semiconductor storage device and a memory system including a voltage step-up circuit capable of improving the voltage step-up performance and reducing the circuit area.

The assist operation in the semiconductor storage device as a comparative example will be described below, and then the effects of the semiconductor storage device and the memory system of the first embodiment will be described.

Figure 27:
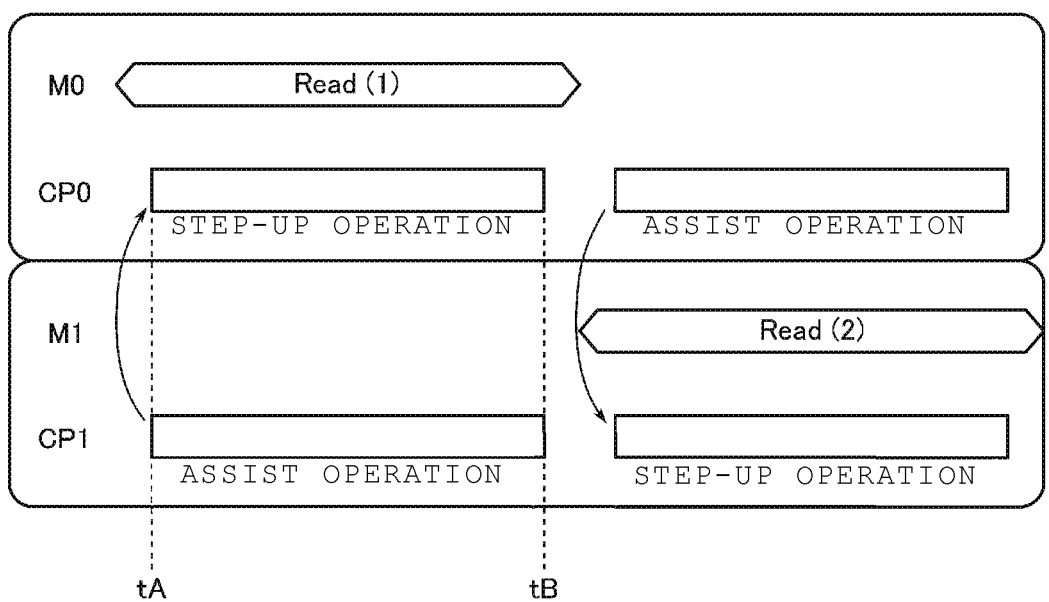
FIG. 27 is a timing chart illustrating an operation of a charge pump of a memory chip in a comparative example.

FIG. 27 is a timing chart illustrating the operation of a charge pump of a memory chip provided in a semiconductor storage device of the comparative example. The semiconductor storage device of the comparative example includes a memory chip M0 and a memory chip M1. The memory chip M0 includes a charge pump CP0, and the memory chip M1 includes a charge pump CP1. FIG. 27 illustrates how a read operation (1) is first executed in the memory chip M0, and then a read operation (2) is executed in the memory chip M1.

When the read operation (1) is started in the memory chip M0, the voltage step-up operation by the charge pump CP0 is started. In parallel with the voltage step-up operation by the charge pump CP0, the assist operation by the charge pump CP1 in the memory chip M1 is started. The assist operation by the charge pump CP1 assists the voltage step-up operation in the memory chip M0. Here, the memory chip M1 cannot receive commands from the outside in a period tA to tB during which the charge pump CP1 is performing the assist operation.

Thereafter, the read operation (1) in the memory chip M0 ends, and the assist operation of the charge pump CP1 in the memory chip M1 also ends. When the assist operation ends, the memory chip M1 can receive commands from the outside.

Subsequently, the memory chip M1 receives a read command from the outside, and the memory chip M1 starts the read operation (2). When the read operation is started by the memory chip M1, the voltage step-up operation by the charge pump CP1 is started. In parallel with the voltage step-up operation by the charge pump CP1, the assist operation by the charge pump CP0 in the memory chip M0 is started. The assist operation by the charge pump CP0 assists the voltage step-up operation in the memory chip M1.

In the semiconductor storage device of the comparative example, as described above, the memory chip M1 cannot and thus does not receive commands from the outside while the charge pump CP1 in the memory chip M1 is performing an assist operation. Therefore, the memory chip M1 cannot execute a read operation in a period during which the memory chip M0 is executing a read operation. As a result, the performance of the read operation in the semiconductor storage device is deteriorated.

On the other hand, the semiconductor storage device of the first embodiment has the following configuration. The semiconductor storage device includes the memory chip 10_0 and the memory chip 10_1. The memory chip 10_0 includes a first memory cell, a first word line connected to the first memory cell, and a first voltage step-up circuit (for example, charge pump CP0) and a second voltage step-up circuit (for example, charge pump CP1) that supply a voltage to the first word line. The memory chip 10_1 includes a second memory cell, a second word line connected to the second memory cell, and a third voltage step-up circuit (for example, charge pump CP0) and a fourth voltage step-up circuit (for example, charge pump CP1) that supply a voltage to the second word line. In a first read operation of the memory chip 10_0, the first voltage step-up circuit, the second voltage step-up circuit, and the fourth voltage step-up circuit supply a first voltage to the first word line. When the voltage of the first word line reaches a first voltage, the first voltage step-up circuit continues to supply the first voltage to the first word line, and the second voltage step-up circuit and the fourth voltage step-up circuit stop supplying the first voltage to the first word line.

As described above, in the first read operation in the memory chip 10_0, when the voltage of the first word line reaches the first voltage, the fourth voltage step-up circuit of the memory chip 10_1 supplies the first voltage to the first word line. As a result, the period of the assist operation in which the fourth voltage step-up circuit of the memory chip 10_1 supplies the first voltage to the first word line can be shortened. If the period of the assist operation by the fourth voltage step-up circuit can be shortened, the memory chip 10_1 can receive a read command earlier than in the comparative example. As a result, a second read operation in the memory chip 10_1 can be started before the first read operation ends, and the performance of the read operation in the semiconductor storage device 10 can be improved. Further, when stepping up the voltage applied to the word line in the memory chip 10_0, the assist operation by the voltage step-up circuit of another memory chip 10_1 can be used, thereby reducing the area of each voltage step-up circuit provided in the memory chip.

Further, when the memory controller 20 transmits a read command for instructing the first read operation to the memory chip 10_0 of the semiconductor storage device 10, the memory controller 20 transmits a read status command for checking the status to the memory chip 10_1. Next, when the memory controller 20 verifies that the memory chip 10_1 is available for an assist operation based on the status obtained by the read status command, the memory controller 20 transmits an assist request command for instructing an assist operation to the memory chip 10_1. As a result, the above-mentioned first read operation can be executed by an instruction from the memory controller 20 to the semiconductor storage device 10.

As described above, according to the first embodiment, it is possible to provide a semiconductor storage device and a memory system including a voltage step-up circuit capable of improving the voltage step-up performance and reducing the circuit area. Further, since the circuit area of the voltage step-up circuit can be reduced, the chip area of each memory chip can be reduced. Furthermore, the semiconductor storage device can be reduced in size.

2. Second Embodiment

A semiconductor storage device of a second embodiment will be described below. In the first embodiment described above, an example has been described in which a voltage step-up module is shared between a plurality of memory chips and the voltage step-up operation to the voltage VREAD is assisted between the plurality of memory chips. In the second embodiment, an example in which a voltage step-up module is shared between a plurality of planes in one memory chip and the voltage step-up operation to the voltage VREAD is assisted between the plurality of planes will be described. In the second embodiment, the differences from the first embodiment will be mainly described. Other configurations and operations not described are the same as those in the first embodiment.

2.1 Configuration of Memory Chip 10_n

Figure 28:
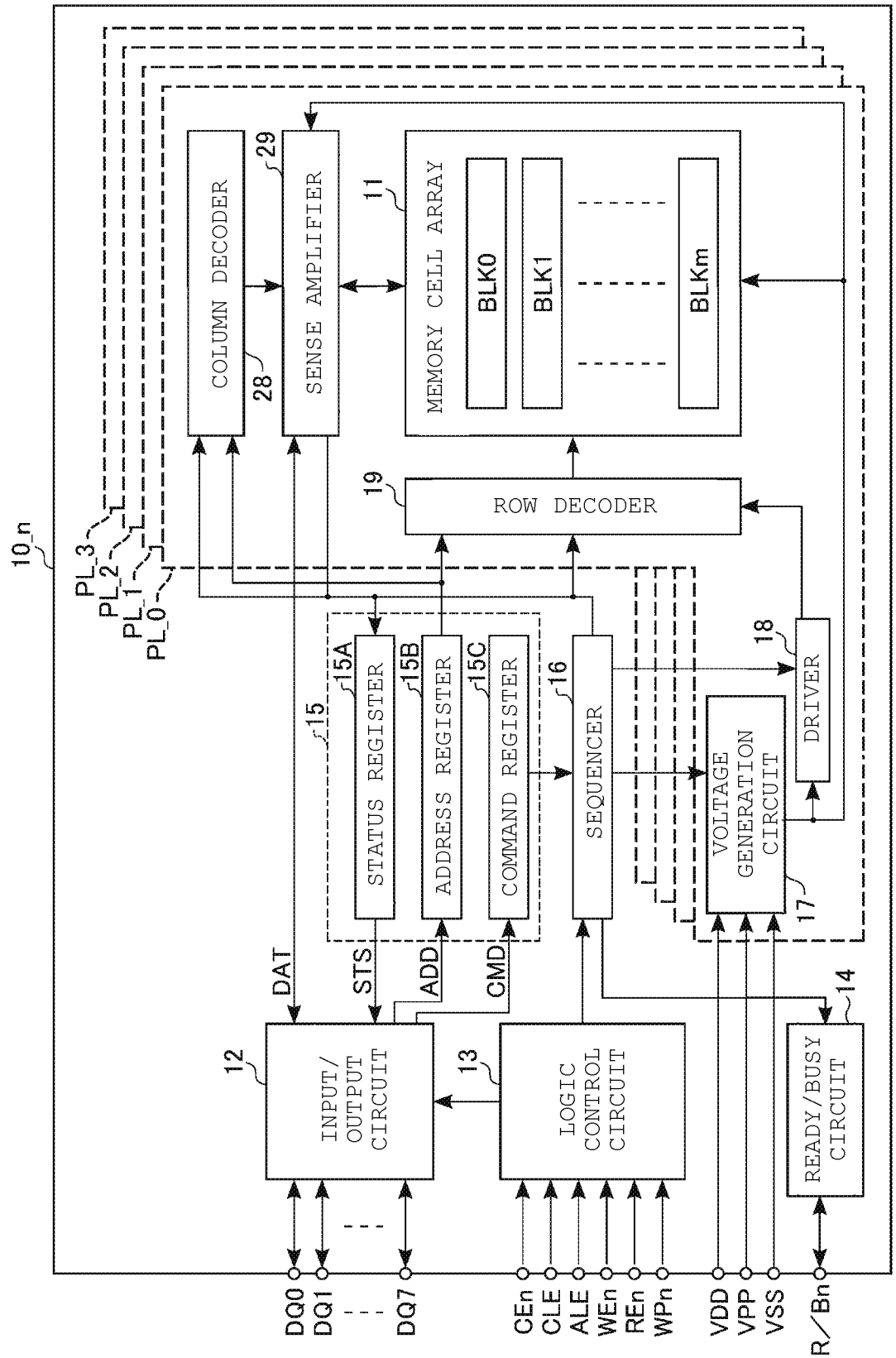
FIG. 28 is a block diagram illustrating a configuration of a memory chip in a semiconductor storage device of a second embodiment.

FIG. 28 is a block diagram illustrating a configuration of a memory chip 10_n in a semiconductor storage device 10 of the second embodiment.

The memory chip 10_n includes a plurality of planes, for example, planes PL_0, PL_1, PL_2, PL_3, an input/output circuit 12, a logic control circuit 13, a ready/busy circuit 14, a register group 15, and a sequencer (or control circuit) 16.

Each of the planes PL_0 to PL_3 includes a memory cell array 11, a voltage generation circuit 17, a driver 18, a row decoder 19, a column decoder 28, and a sense amplifier 29. Each of the planes PL_0 to PL_3 is a structural unit in which a read operation, a write operation, and an erasing operation can be performed independently of other planes. Hereinafter, when the term "plane PL" is used, it means each of the planes PL_0 to PL_3. Although the example in which the plurality of planes is four is illustrated here, a number of planes other than four may be provided.

2.1.1 Configuration of Voltage Step-Up Module in Voltage Generation Circuit 17

Next, the voltage step-up module in the voltage generation circuits 17 of the planes PL_0 to PL_3 provided in the memory chip 10_n will be described. The memory chip 10_n of the second embodiment includes the planes PL_0 to PL_3 as described above. Each of the planes PL_0 to PL_3 includes a voltage generation circuit 17. The voltage generation circuit 17 includes, for example, a voltage step-up module 17A for generating a voltage VREAD to be supplied to a non-selected word line.

Figure 29:
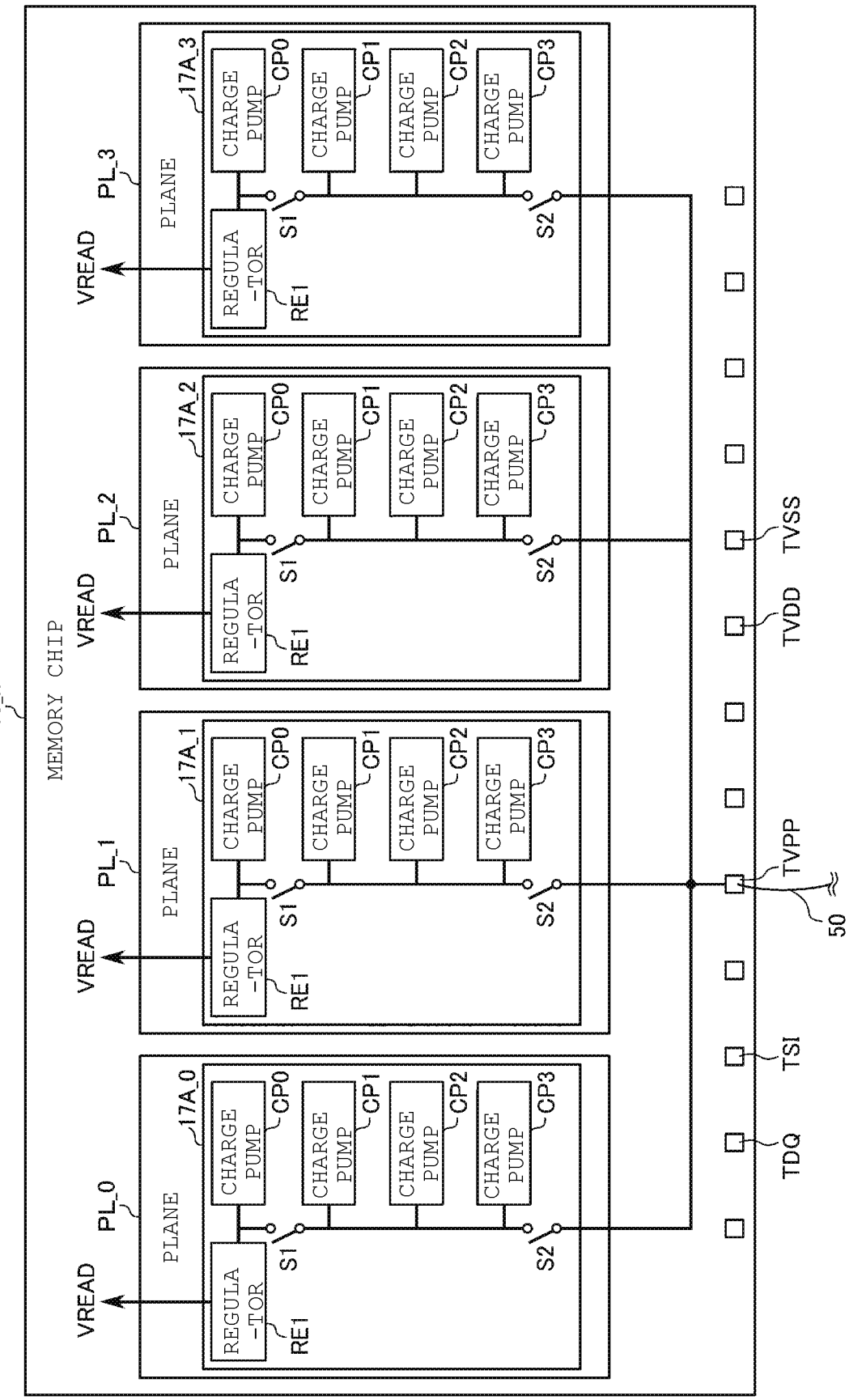
FIG. 29 is a diagram illustrating a configuration of a voltage step-up module in a plane of the memory chip in the second embodiment.

FIG. 29 is a diagram illustrating a configuration of the voltage step-up module in the voltage generation circuit 17 provided in the planes PL_0 to PL_3. Each of the voltage generation circuits 17 of the planes PL_0 to PL_3 includes voltage step-up modules 17A_0, 17A_1, 17A_2, and 17A_3, respectively. The voltage step-up module 17A is a voltage step-up circuit for generating a voltage VREAD.

The voltage step-up module 17A includes a plurality of voltage step-up circuits, for example, charge pumps CP0, CP1, CP2, and CP3, a regulator RE1, and switch circuits S1 and S2.

As described in the first embodiment, the memory chip 10_n includes a plurality of terminals (or pads) for transmitting and receiving power supply voltages, signals, and data to and from the outside, for example, a terminal TVDD, a terminal TVPP, a terminal TVSS, a terminal TDQ, and a terminal TSI.

The terminal TVPP is connected to the switch circuit S2 provided in each of the planes PL_0 to PL_3.

2.2 Operation of Voltage Step-up Module 17A in a Plurality of Planes

Next, the operation of the voltage step-up modules 17A_0 to 17A_3 of the planes PL_0 to PL_3 of the memory chip 10_n will be described. The voltage step-up module 17A of each plane can perform a voltage step-up operation and assist the voltage step-up operation in the voltage step-up modules of the other planes. That is, it is possible to assist the operation of stepping up the voltage applied to the non-selected word lines to the voltage VREAD mutually between the voltage step-up modules 17A_0 to 17A_3 of the planes PL_0 to PL_3.

The operation of assisting the voltage step-up operation in the voltage step-up module 17A between the planes PL_0 and the plane PL_1 will be described below as an example, but the operation of assisting the voltage step-up operation between the other planes is also the same. Hereinafter, the operation in which the voltage step-up module of a certain plane assists the voltage step-up operation in the voltage step-up module of another plane is referred to as an assist operation.

Figure 30:
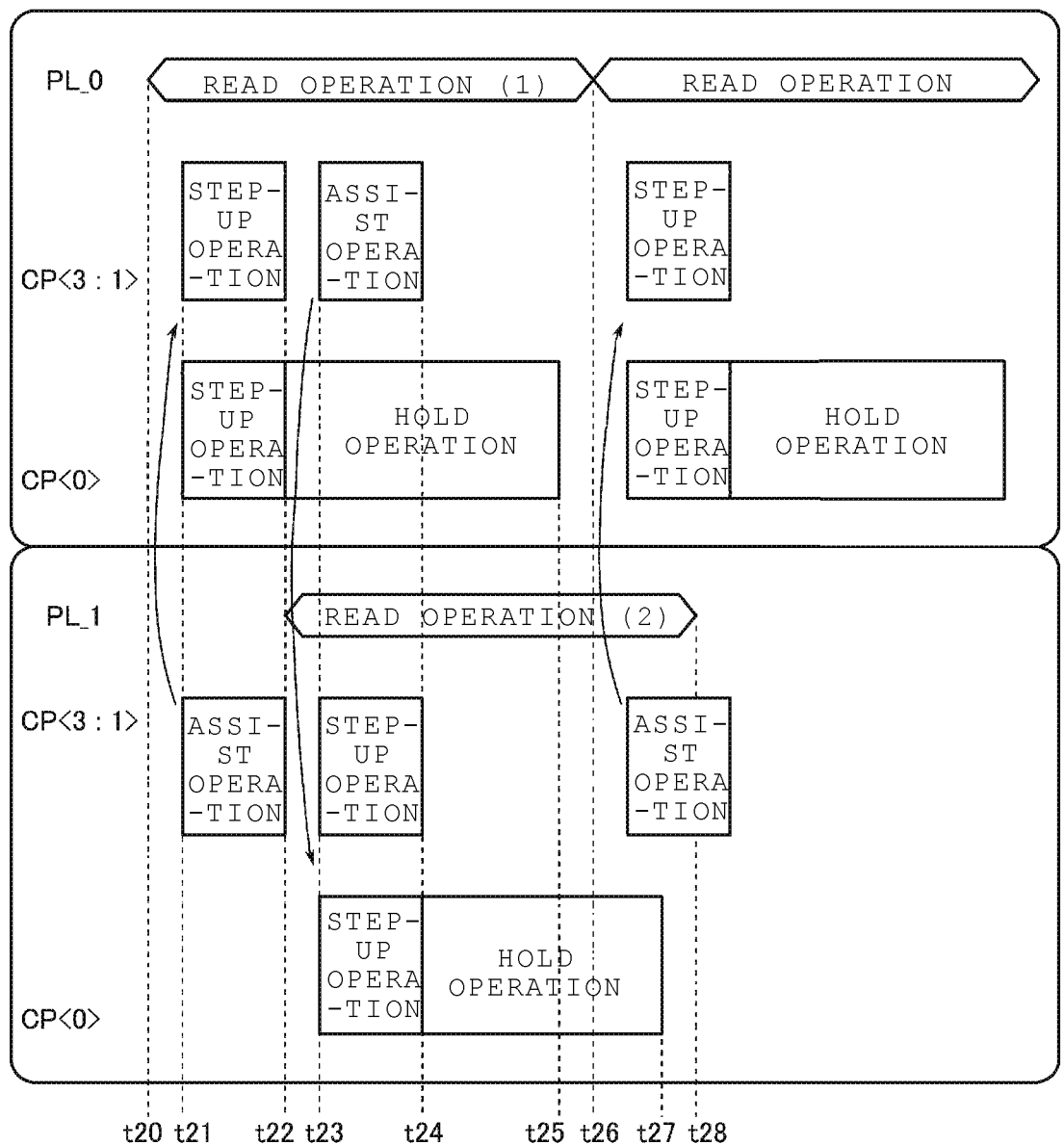
FIG. 30 is a timing chart illustrating an operation of a charge pump in a voltage step-up module of a plane in the second embodiment.
Figure 31:
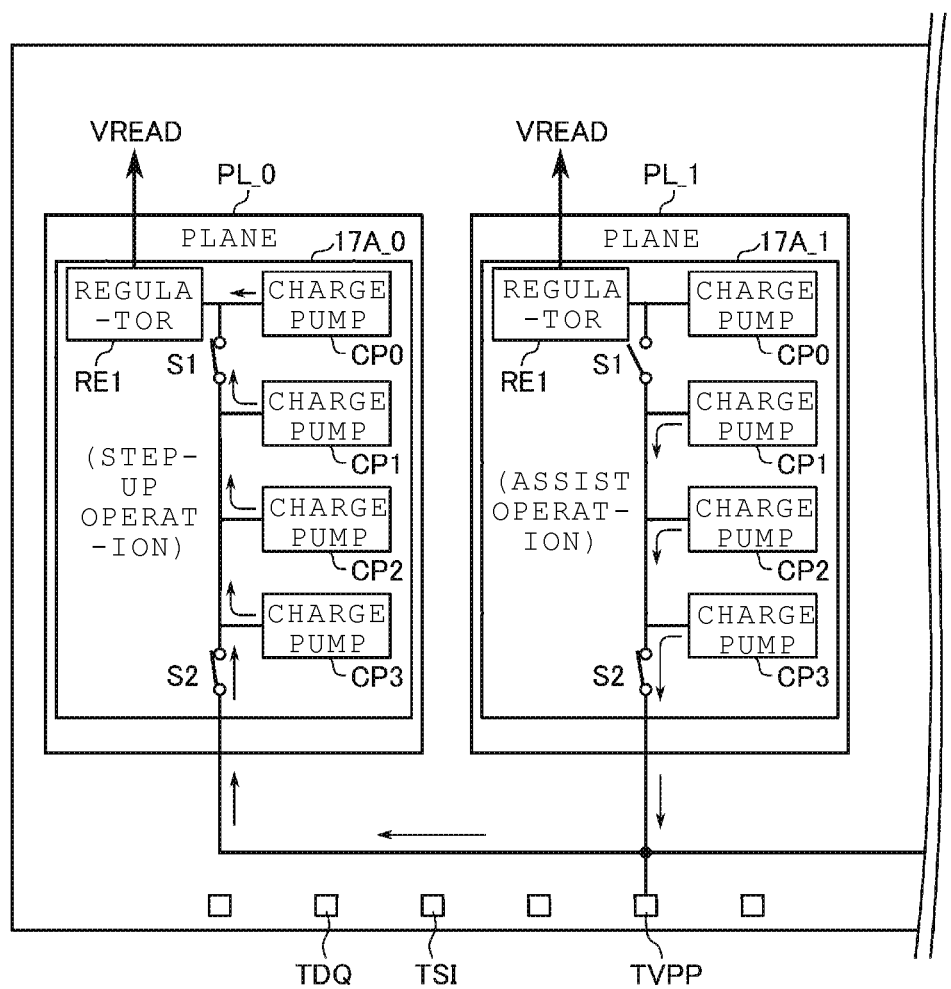
FIG. 31 is a diagram illustrating the operation of the charge pump during a part of an assist period illustrated in FIG. 30.
Figure 32:
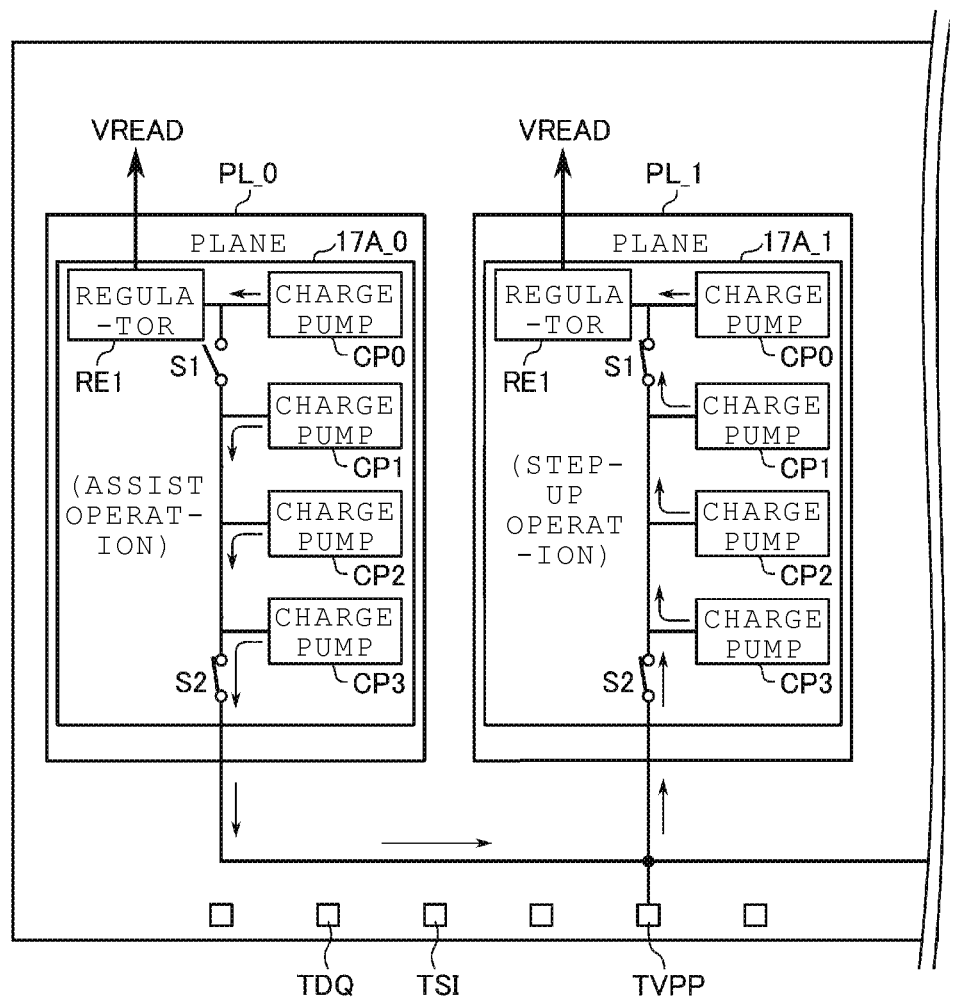
FIG. 32 is a diagram illustrating the operation of the charge pump during another part of the assist period illustrated in FIG. 30.

FIG. 30 is a timing chart illustrating the operation of the charge pumps CP0 to CP3 in the voltage step-up modules 17A_0 and 17A_1 of the planes PL_0 and PL_1. FIG. 31 is a diagram illustrating the operation of the charge pumps CP0 to CP3 during an assist period t21 to t22 illustrated in FIG. 30. FIG. 32 is a diagram illustrating the operation of the charge pumps CP0 to CP3 during an assist period t23 to t24 illustrated in FIG. 30.

FIG. 30 illustrates how a read operation (1) is executed in the plane PL_0 between times t20 and t26, and a read operation (2) is executed in the plane PL_1 between times t22 and t28.

First, at time t20, the read operation (1) is started in the plane PL_0.

When the read operation (1) is started, the charge pumps CP0 to CP3 in the plane PL_0 execute a voltage step-up operation from time t21 to time t22. In parallel with this, from time t21 to time t22, the charge pumps CP1 to CP3 in the plane PL_1 execute an assist operation. The assist operation of the plane PL_1 assists the voltage step-up operation by the charge pumps CP0 to CP3 in the plane PL_0. That is, as illustrated in FIG. 31, by the assist operation, a current is supplied from the charge pumps CP1 to CP3 in the plane PL_1 to the voltage step-up module 17A_0 in the plane PL_0.

More specifically, the charge pumps CP0 to CP3 in the plane PL_0 and the charge pumps CP1 to CP3 in the plane PL_1 are set to an operating state, and the charge pumps CP0 in the plane PL_1 are set to a stopped state. The switch circuits S1 and S2 in the plane PL_0 are set to a connected state, the switch circuit S2 in the plane PL_1 is set to a connected state, and the switch circuit S1 in the plane PL_1 is set to a disconnected state. Further, the switch circuit S2 in the planes PL_2 and PL_3 is set to the disconnected state. As a result, a current is supplied from the charge pumps CP0 to CP3 in the plane PL_0 and the charge pumps CP1 to CP3 in the plane PL_1 to the regulator RE1 in the plane PL_0.

This current supply assists the voltage step-up module 17A_0 in plane PL_0 to step up the voltage applied to the non-selected word line to the voltage VREAD. The non-selected word line in the plane PL_0 is quickly stepped up to the voltage VREAD by the voltage step-up operation of the charge pumps CP0 to CP3 in the plane PL_0 and the assist operation of the charge pumps CP1 to CP3 in the plane PL_1.

Thereafter, when the voltage of the non-selected word line in the plane PL_0 reaches the voltage VREAD, the voltage step-up operation of the charge pumps CP1 to CP3 in the plane PL_0 is stopped at time t22, and at the same time, the assist operation of the charge pumps CP1 to CP3 in the plane PL_1 is stopped.

In order to hold the voltage of the non-selected word line in the plane PL_0 at the voltage VREAD, the voltage step-up operation of the charge pump CP0 in the plane PL_0 is not stopped but continued. Thereafter, the read operation (1) in the plane PL_0 is continued even after time t22.

Next, at time t22, the read operation (2) is started in the plane PL_1.

When the read operation (2) is started, the charge pumps CP0 to CP3 in the plane PL_1 execute a voltage step-up operation from time t23 to time t24. In parallel with this, from time t23 to time t24, the charge pumps CP1 to CP3 in the plane PL_0 execute an assist operation. The assist operation of the plane PL_0 assists the voltage step-up operation by the charge pumps CP0 to CP3 in the plane PL_1. That is, as illustrated in FIG. 32, by the assist operation, a current is supplied from the charge pumps CP1 to CP3 in the plane PL_0 to the voltage step-up module 17A_1 in the plane PL_1.

More specifically, the charge pumps CP0 to CP3 in the plane PL_1 and the plane PL_0 are set to the operating state. The switch circuits S1 and S2 in the plane PL_1 are set to the connected state, the switch circuit S2 in the plane PL_0 is set to the connected state, and the switch circuit S1 in the plane PL_0 is set to the disconnected state. Further, the switch circuit S2 in the planes PL_2 and PL_3 is set to the disconnected state. As a result, a current is supplied from the charge pumps CP0 to CP3 in the plane PL_1 and the charge pumps CP1 to CP3 in the plane PL_0 to the regulator RE1 in the plane PL_1. In addition, a current is supplied from the charge pump CP0 in the plane PL_0 to the regulator RE1 in the plane PL_0.

This assists the operation of stepping up the voltage applied to the non-selected word line in plane PL_1 to the voltage VREAD. The non-selected word line in the plane PL_1 is quickly stepped up to the voltage VREAD by the voltage step-up operation of the charge pumps CP0 to CP3 in the plane PL_1 and the assist operation of the charge pumps CP1 to CP3 in the plane PL_0.

Thereafter, when the voltage of the non-selected word line in the plane PL_1 reaches the voltage VREAD, the voltage step-up operation of the charge pumps CP1 to CP3 in the plane PL_1 is stopped at time t24, and at the same time, the assist operation of the charge pumps CP1 to CP3 in the plane PL_0 is stopped.

In order to hold the voltage of the non-selected word line in the plane PL_1 at the voltage VREAD, the voltage step-up operation of the charge pump CP0 in the plane PL_1 is not stopped but continued (hold operation illustrated in FIG. 30). Thereafter, the read operation (2) on the plane PL_1 is continued even after time t24.

Thereafter, at time t25, the hold operation of the charge pump CP0 in the plane PL_0 is stopped. Further, at time t26, the read operation (1) in the plane PL_0 ends.

Thereafter, at time t27, the voltage step-up operation of the charge pump CP0 in the plane PL_1 is stopped. Further, at time t28, the read operation (2) in the plane PL_1 ends.

2.3 Effects of Second Embodiment

According to the second embodiment, as in the first embodiment, it is possible to provide a semiconductor storage device and a memory system including a voltage step-up circuit capable of improving the voltage step-up performance and reducing the circuit area.

In the second embodiment, a voltage step-up operation can be mutually assisted between the voltage step-up circuits (for example, charge pumps) of a plurality of planes in the memory chip 10_n. As a result, the circuit area of the voltage step-up circuit in the plane can be reduced, thereby reducing the chip area of the memory chip 10_n. Furthermore, the semiconductor storage device can be reduced in size.

3.3. Other Modification Examples

In the above-described embodiment, an example of assisting the generation of the voltage VREAD used in a read operation in a certain memory chip (or a certain plane) with a charge pump in another memory chip (or another plane) has been described, but the above-described embodiment can be applied not only to the generation of the voltage VREAD but also to the generation of the voltage VPASS and the voltage VREAD respectively used in the program operation and the program verify operation of a write operation.

Further, although the above-described embodiment has been described by taking a NAND flash memory as an example of the semiconductor storage device, the embodiment can be applied not only to the NAND flash memory but also to other semiconductor storage devices.

Below, a dynamic random access memory (DRAM) and a NOR flash memory will be described as examples of a semiconductor storage device to which the above-described embodiment can be applied.

Figure 33:
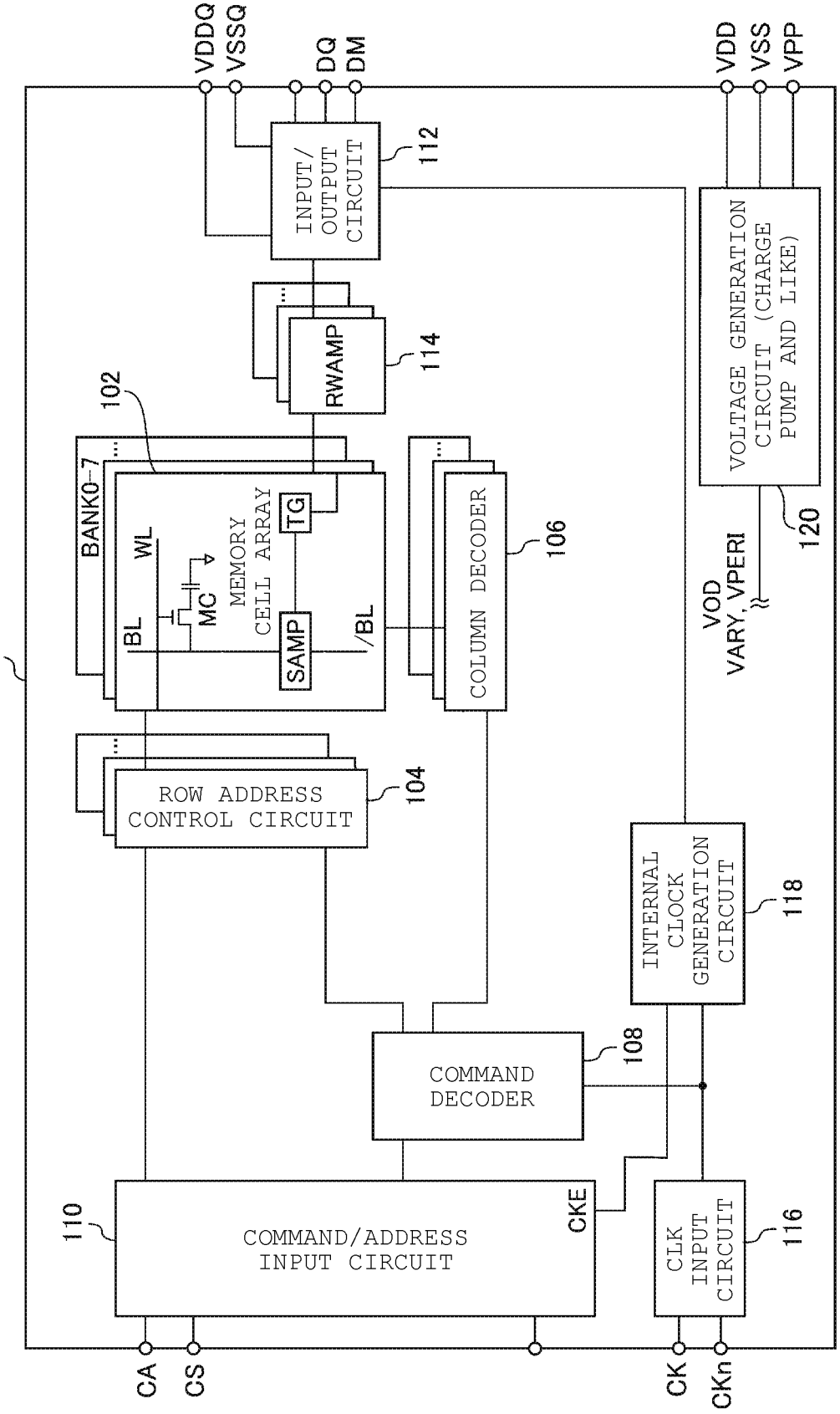
FIG. 33 is a block diagram of a DRAM device.

FIG. 33 is a block diagram of a DRAM device. A DRAM device 100 includes a memory cell array 102, a row address control circuit 104, a column decoder 106, a command decoder 108, a command/address input circuit 110, an input/output circuit 112, a read/write amplifier (RWAMP) 114, a clock (CLK) input circuit 116, an internal clock generation circuit 118, and a voltage generation circuit 120.

The voltage generation circuit 120 includes, for example, a voltage step-up module (or voltage step-up circuit), which includes a charge pump and a regulator.

The voltage generation circuit 120 is supplied with a power supply voltage VDD (or VCC), a high power supply voltage VPP having a voltage higher than the power supply voltage VDD, and a reference voltage (for example, ground voltage) VSS. The voltage generation circuit 120 steps up and adjusts the power supply voltage VDD to generate a voltage VOD, a voltage VARY, and a voltage VPERI used in the DRAM device 100.

For example, the semiconductor storage device includes a plurality of DRAM devices 100 having the above-described configuration. When the voltage generation circuit 120 in one DRAM device 100 generates, for example, a voltage VOD, the voltage generation circuit 120 in another DRAM device 100 can assist the generation of the voltage VOD.

Figure 34:
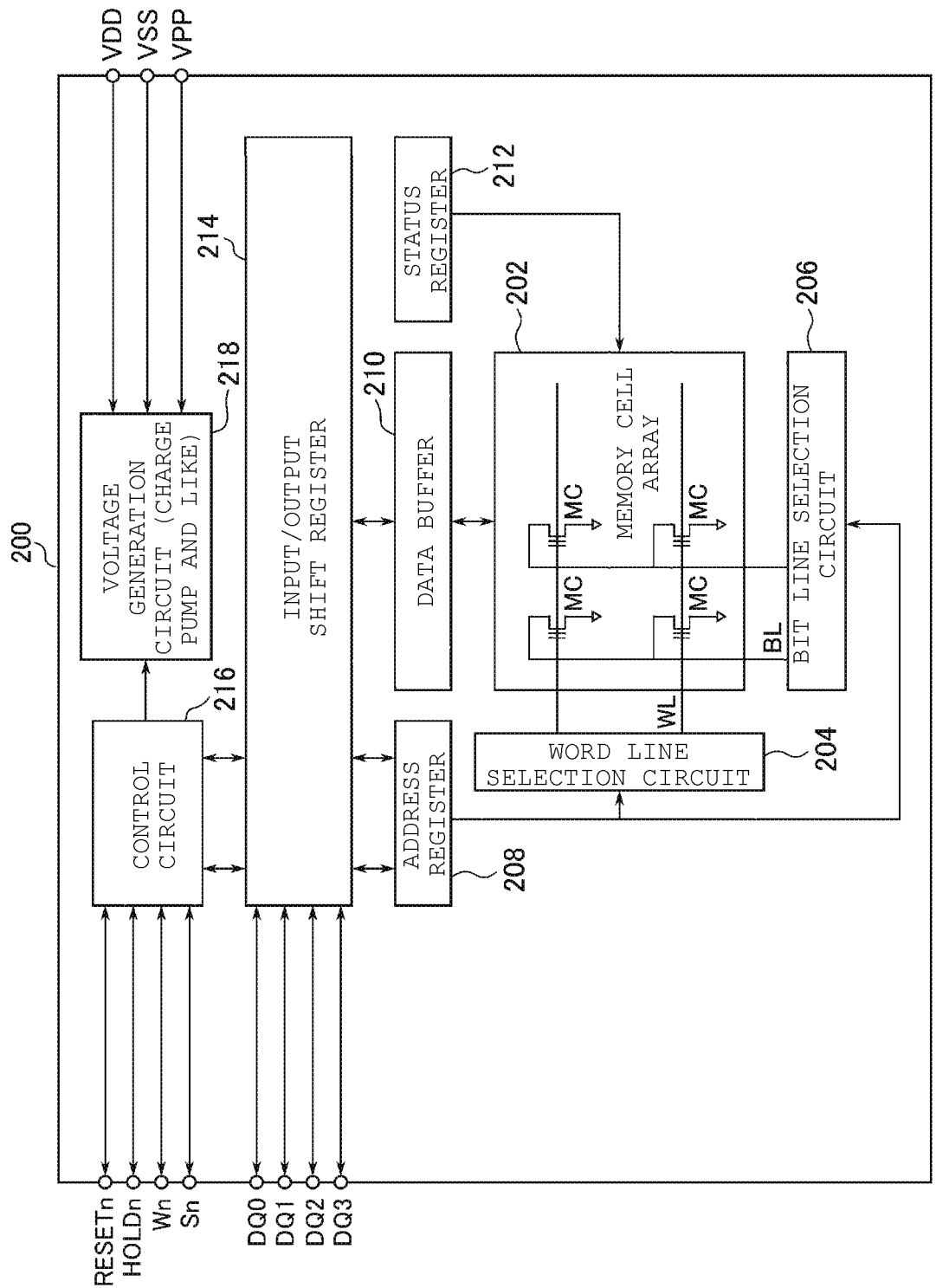
FIG. 34 is a block diagram of a NOR flash memory.

FIG. 34 is a block diagram of a NOR flash memory. The NOR flash memory 200 includes a memory cell array 202 including a memory cell MC, a word line selection circuit 204 for selecting a word line WL, a bit line selection circuit 206 for selecting a bit line BL, an address register 208, a data buffer 210, and a status register 212, an input/output shift register 214, a control circuit 216, and a voltage generation circuit 218. The voltage generation circuit 218 includes, for example, a voltage step-up module (or voltage step-up circuit), which includes a charge pump and a regulator. The voltage generation circuit 218 is supplied with a power supply voltage VDD (or VCC), a high power supply voltage VPP having a voltage higher than the power supply voltage VDD, and a reference voltage (for example, ground voltage) VSS. The voltage generation circuit 218 steps up and adjusts the power supply voltage VDD to generate the voltage used in the NOR flash memory 200.

For example, the semiconductor storage device includes a plurality of NOR flash memories 200 having the above-described configuration. When the voltage generation circuit 218 in one NOR flash memory 200 generates, for example, an operating voltage, the voltage generation circuit 218 in another NOR flash memory 200 can assist the generation of the operating voltage.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a first memory chip that includes a first memory cell, a first word line connected to the first memory cell, a first voltage step-up circuit, and a second voltage step-up circuit; and
   a second memory chip that includes a second memory cell, a second word line connected to the second memory cell, a third voltage step-up circuit, and a fourth voltage step-up circuit, wherein
   during a first read operation executed in the first memory chip, the first voltage step-up circuit, the second voltage step-up circuit, and the fourth voltage step-up circuit supply a first voltage to the first word line, and
   when a voltage of the first word line reaches a predetermined voltage, the first voltage step-up circuit continues to supply the first voltage to the first word line, and the second voltage step-up circuit and the fourth voltage step-up circuit stop supplying the first voltage to the first word line.

2. The semiconductor storage device according to claim 1, wherein
   during a second read operation executed in the second memory chip, the second voltage step-up circuit, the third voltage step-up circuit, and the fourth voltage step-up circuit supply a second voltage to the second word line, and
   when a voltage of the second word line reaches a predetermined voltage, the third voltage step-up circuit continues to supply the second voltage to the second word line, and the second voltage step-up circuit and the fourth voltage step-up circuit stop supplying the second voltage to the second word line.

3. The semiconductor storage device according to claim 2, wherein
   the second read operation is started after the second voltage step-up circuit and the fourth voltage step-up circuit stop supplying the first voltage to the first word line, and
   supplying of the first voltage by the first voltage step-up circuit and supplying of the second voltage by the third voltage step-up circuit are performed concurrently.

4. The semiconductor storage device according to claim 2, wherein
   the second read operation is started after the second voltage step-up circuit and the fourth voltage step-up circuit stop supplying the first voltage to the first word line, and after the voltage of the second word line reaches the predetermined voltage, the first voltage step-up circuit continues to supply the first voltage to the first word line.

5. The semiconductor storage device according to claim 2, wherein
   the first memory chip includes a first terminal to which a first power supply voltage is supplied,
   the second memory chip includes a second terminal to which the first power supply voltage is supplied,
   during the first read operation, the first voltage is supplied from the second memory chip to the first memory chip via the second terminal and the first terminal, and
   during the second read operation, the second voltage is supplied from the first memory chip to the second memory chip via the first terminal and the second terminal.

6. The semiconductor storage device according to claim 5, wherein
   the first memory chip includes a third terminal to which a second power supply voltage is supplied and a fourth terminal to which a third power supply voltage is supplied,
   the second memory chip includes a fifth terminal to which the second power supply voltage is supplied and a sixth terminal to which the third power supply voltage is supplied, and
   the first power supply voltage is higher than the second power supply voltage, and the second power supply voltage is higher than the third power supply voltage.

7. The semiconductor storage device according to claim 2, wherein
   while the first read operation is being executed in the first memory chip, the second memory chip is able to receive a read command for instructing the second read operation when an operation of the fourth voltage step-up circuit is stopped.

8. The semiconductor storage device according to claim 7, wherein
while the first read operation is being executed in the first memory chip, the second memory chip is not able to receive a read command for instructing the second read operation until the operation of the fourth voltage step-up circuit is stopped.

9. The semiconductor storage device according to claim 1, wherein
during the first read operation, the third voltage step-up circuit supplies the first voltage to the first word line, and when the voltage of the first word line reaches the predetermined voltage, the third voltage step-up circuit stops supplying the first voltage to the first word line.

10. The semiconductor storage device according to claim 1, wherein
the first memory chip includes a third memory cell and a third word line connected to the third memory cell, and
during the first read operation, the third memory cell is read, and the first memory cell is not read, and
a read voltage that is less than the first voltage is supplied to the third word line.

11. A memory system comprising:
a semiconductor storage device including a first memory chip and a second memory chip; and
a controller configured to issue commands to the first memory chip and the second memory chip, wherein
the first memory chip includes a first memory cell, a first word line connected to the first memory cell, a first voltage step-up circuit, and a second voltage step-up circuit,
the second memory chip includes a second memory cell, a second word line connected to the second memory cell, a third voltage step-up circuit, and a fourth voltage step-up circuit,
the controller is configured to transmit a read status command to the second memory chip to check a status of the second memory chip after transmitting a read command to the first memory chip, and transmit an assist request command to the second memory chip based on the status obtained in response to the read status command, and
in response to the read command, the first and second voltage step-up circuits supply a first voltage to the first word line, and in response to the assist request command, the fourth voltage step-up circuit assists the first and second voltage step-up circuits in supplying the first voltage to the first word line, and wherein,
when a voltage of the first word line reaches a predetermined voltage, the first voltage step-up circuit continues to supply the first voltage to the first word line, and the second voltage step-up circuit and the fourth voltage step-up circuit stop supplying the first voltage to the first word line.

12. The memory system according to claim 11, wherein the controller is configured to issue a read command to the second memory chip while the first voltage step-up circuit continues to supply the first voltage to the first word line after the second voltage step-up circuit and the fourth voltage step-up circuit stopped supplying the first voltage to the first word line.

13. The memory system according to claim 11, wherein the first memory chip includes a third memory cell which is a read target of the read command transmitted to the first memory chip, and a read voltage lower than the first voltage is applied to a third word line connected to the third memory cell while the first voltage step-up circuit continues to supply the first voltage to the first word line.

14. A semiconductor storage device comprising:
a first plane that includes a first memory cell, a first word line connected to the first memory cell, a first voltage step-up circuit, and a second voltage step-up circuit; and
a second plane that includes a second memory cell, a second word line connected to the second memory cell, a third voltage step-up circuit, and a fourth voltage step-up circuit, wherein
during a first read operation executed in the first plane, the first voltage step-up circuit, the second voltage step-up circuit, and the fourth voltage step-up circuit supply a first voltage to the first word line, and
when a voltage of the first word line reaches a predetermined voltage, the first voltage step-up circuit continues to supply the first voltage to the first word line, and the second voltage step-up circuit and the fourth voltage step-up circuit stop supplying the first voltage to the first word line.

15. The semiconductor storage device according to claim 14, wherein
during a second read operation executed in the second plane, the second voltage step-up circuit, the third voltage step-up circuit, and the fourth voltage step-up circuit supply a second voltage to the second word line, and
when a voltage of the second word line reaches a predetermined voltage, the third voltage step-up circuit continues to supply the second voltage to the second word line, and the second voltage step-up circuit and the fourth voltage step-up circuit stop supplying the second voltage to the second word line.

16. The semiconductor storage device according to claim 14, further comprising:
a first terminal to which a first power supply voltage is supplied, wherein
the first and second voltage step-up circuits are connected to the first terminal through a first switch and the third and fourth voltage step-up circuits are connected to the first terminal through a second switch.

17. The semiconductor storage device according to claim 14, wherein
while the first read operation is being executed in the first plane, the second plane is able to receive a read command for instructing the second read operation when an operation of the fourth voltage step-up circuit is stopped.

18. The semiconductor storage device according to claim 17, wherein
while the first read operation is being executed in the first plane, the second plane is not able to receive a read command for instructing the second read operation until the operation of the fourth voltage step-up circuit is stopped.

19. The semiconductor storage device according to claim 14, wherein
the first plane includes a third memory cell and a third word line connected to the third memory cell, and
during the first read operation, the third memory cell is read, and the first memory cell is not read, and a read voltage that is less than the first voltage is supplied to the third word line.

* * * * *